US005694579A

United States Patent [19]

Razdan et al.

[11] Patent Number: 5,694,579

[45] Date of Patent: Dec. 2, 1997

[54] USING PRE-ANALYSIS AND A 2-STATE OPTIMISTIC MODEL TO REDUCE COMPUTATION IN TRANSISTOR CIRCUIT SIMULATION

[75] Inventors: Rahul Razdan, Princeton; Gabriel Bischoff, Marlborough, both of Mass.

[73] Assignee: Digital Equipment Corporation, Maynard, Mass.

[21] Appl. No.: 19,574

[22] Filed: Feb. 18, 1993

[51] Int. Cl.$^{6}$ .................. G06F 17/50

[52] U.S. Cl. .................. 395/500

[58] Field of Search .................. 395/500; 364/578, 364/488, 489, 490

[56] References Cited

U.S. PATENT DOCUMENTS

| | | | |
|---|---|---|---|
| 4,899,273 | 2/1990 | Omoda et al. | 395/500 |
| 4,961,156 | 10/1990 | Takasaki | 364/578 |
| 5,062,067 | 10/1991 | Schaefer et al. | 364/578 |
| 5,068,812 | 11/1991 | Schaefer et al. | 395/500 |
| 5,105,373 | 4/1992 | Ramsey et al. | 364/578 |
| 5,105,374 | 4/1992 | Yoshida | 364/578 |

OTHER PUBLICATIONS

Bryant, Randal E., *Boolean Analysis of MOS Circuits*, IEEE Transactions on Computer Aided Design, vol. CAD-6, No. 4, Jul. 1987.

*Primary Examiner*—Richard L. Ellis

*Attorney, Agent, or Firm*—Diane C. Drozenski; Ronald C. Hudgens; Arthur W. Fisher

[57] ABSTRACT

Computational requirements are reduced for executing simulation code for a logic circuit design having at least some elements which are synchronously clocked by multiple phase clock signals, the logic design being subject to resistive conflicts and to charge sharing, the simulation code including data structures associated with circuit modules and nodes interconnecting the circuit modules. A three-state version of simulation code is generated for the circuit design, the three states corresponding to states 0, 1, or X, where X represents an undefined state. A preanalysis was performed of the three-state version and phase waveforms are stored each representing values occurring at a node of the code. For each phase of a module for which no event-based evaluation need be performed, an appropriate response to an event occurring with respect to the module of the three-state version is determined and stored. A two-state version of simulation code for the circuit design, the two states corresponding to 0, and 1 is generated. For each phase of a module for which no event-based evaluation need be performed, the stored response with respect to corresponding module of the three-state version is determined and stored.

3 Claims, 21 Drawing Sheets

IN ARRAY

PS ARRAY

NODE N, EVALUATION FUNCTION

. . .

CS ARRAY

NODE M, EVALUATION FUNCTION

. . .

PI ARRAY

DI ARRAY

INPUT P . . .

CLK ARRAY

CLOCK R . . .

```
/ * nand from LGC file nand. lgc
  * generated by COSMOS LGCC $Version$ on   */
#define  LGCCOUT
#define NUM_SUFS    (2)
#include  <stdio.h>
#include  "types.h"
#include  :fault.h"
#include  "lgccout.h"

int tsc_2282430499_ t_ = 0;
sc_2282430499 ( o, i, z)
     conns_ptr o, i, z;   / *  4 units,  0  zeroes,  2  outs,  0  nodes  */
(            register anon *a= updTempArea;
  LOC_DECL
  AND3 (NO (0) , OI (3) , OI (1) ) ;
  OR3 (NO (1) , OI (2) , OI (o) ) ;

)
minst_no fo0 [ ] = { END,
          END,
          END } ;
foStruct fos0 [ ] = {
          { NULL } };
minst_no foi [ ] = { END,
          0, END,
          END };
foStruct fos1 [ ] = {
          { FALSE, &foi [1]  },
          { NULL } };

node_t  nd [ ] =
{          {V_I (NULL,NULL) , V_I (NULL, NULL) , 0 , "OUT"} ,
          {V_I (&fos1  [0] , NULL) , V_I (&fos1 [0] , NULL) , -1, "A"},
          {V_I (&fos1  [0] , NULL) , V_I (&fos1 [0] , NULL) , -1, "B"},
          NULL
};
NODE_COUNT  (3)

node_no v1 [ ] = { NULL };
stVector st_vecs [ ] =
{          ( NULL, ""}
};
unsigned int num_st_vecs = 0;

conn cv1 [ ] = {
          &nd [0] . L, &nd[0] . H, NULL,
          &nd [1] . L, &nd[1] . H, &nd [2] . L, &nd [2] . H,
                    NULL,
          NULL,
          NULL } ;

minst mods [ ] =
{          MI_I (tsc_2282430499_t_, sc_2282430499, &cv1 [0] , &cv1 [3],
          &cv1 [8] , 0 , "sc
_2282430499/0/")  ,
          NULL };
   MOD_COUNT (1)
unsigned int rank_origins [ ] =
{         0
} ;
RANK_COUNT  (1) ;
```

*Figure 15*

USING PRE-ANALYSIS AND A 2-STATE OPTIMISTIC MODEL TO REDUCE COMPUTATION IN TRANSISTOR CIRCUIT SIMULATION

BACKGROUND OF THE INVENTION

This invention relates to simulation of circuits.

Referring to FIG. 1, in general, a circuit 8 of the synchronous kind may be characterized as including a state array 10, combinational logic 12, synchronizers (clocks) 14, and primary inputs 16.

The state array includes memory elements such as latches (dynamic and static) or flip-flops. The combinational logic maps the previous states of the memory elements and the primary inputs to a next state for the state array. The synchronizers control the latching of the memory elements; they are periodic waveforms whose periods are chosen based on delays which occur in propagation of signals in the combinational logic/state array loop.

The correctness of complex circuit designs is typically tested by logic simulation. The input to logic simulation is a netlist of transistors or gates and interconnections among them that together form the state array, combinational logic, and synchronizer generator.

Simulation of a synchronous circuit typically involves substantial wasted computational effort associated with the highly buffered distribution network (not shown in FIG. 1) which carries the clocks to the synchronizers to reception points in the state array. For complex circuits, the distribution network may be large.

In a conventional event-driven simulation, the distribution network is evaluated every cycle because clock change events occur in every cycle. The clock reception points (latches and flip-flops) also are evaluated every cycle, even if the data input has not changed. Both kinds of events are futile because re-evaluation will not add any new information to the simulation.

Up to 90% of the CPU time for simulation may be consumed by the event activity generated by the synchronizers. Futile activity is especially high in MOS circuits that use precharge/discharge circuit design techniques. Highly pipelined designs with faster clock speeds also tend to increase the futile activity ratio in simulation.

Another factor in the performance of conventional logic simulators arises in modeling non-logic effects, such as timing characteristics (inertial delay, transport delay, rise/fall delay).

A typical strategy for logic simulation is to simulate the design under as many logical cross-product cases as possible before the product is brought to market. Logical cross-products are the different conditions under which a circuit must function. For example, with a microprocessor, a logical cross-product might be the correct evaluation of an ADD operation in the presence of various memory management interrupts. Any improvement in simulation performance directly improves the chances of finding logical bugs in the design.

One general approach to improving simulation performance is based on clock suppression which is directed to reducing the number of futile events. Other proposed clock suppression techniques have been interconnect-based or state-based. In interconnect-based schemes proposed by Ulrich, the clock lines are temporarily disconnected from the sequential elements and the lines are reconnected according to events on the data inputs. (Ulrich, "A Design Verification Methodology Based on Concurrent Simulation and Clock Suppression," Design Automation Conference, pp. 709–712, Florida, June 1983, Ulrich and Hebert; "Speed and Accuracy in Digital Network Simulation Based on Structural Modeling", Design Automation Conference, pp. 587–593, Nevada, June 1982; and Ulrich et al. in "Design Verification for Very Large Digital Networks Based on Concurrent Simulation and Clock Suppression", Proc. Intl Conf on CAD, pp. 277–280, New York, November, 1983). Later, a version of this approach was implemented in the Dr. Creator simulator.

Interconnect-based approaches are simple but work only with clock signals, not with activity generated by data-dependent periodic signals. Precharge circuit design is difficult for interconnect-based approaches.

The state-based approach has been advocated by Takamine et al. ("Clock Event Suppression Algorithm of VELVET and its Application to S-820 Development", in 25th ACM/IEEE Design Automation Conference, pp. 716–719, 1988) and Weber and Somenzi ("Periodic Signal Suppression in a Concurrent Fault Simulator", in The European Conference on Design Automation, Amsterdam, Feb. 1991). The state-based approach contains a new state, P, for the simulator in addition to the usual states {0,1,X}. Weber has modified the Dr. Creator simulator such that the new state, P, contains temporal information about the clock signal, such as its period and skew. In addition, function tables are defined for all basic primitives (gates) understood by the simulator. These function tables describe the effect of the new state, P, on the output. Takamine, in VELVET, assumes that the new state is a synchronizer and maintains no timing information associated with the clock state. VELVET also describes function tables for the clock state for the basic simulation primitives.

The state-based approach advocated by Weber addressed the problem of data-dependent periodic signals, but includes timing information that leads to timing calculations that are redundant in the context of a synchronous circuit. In addition, feedback can cause harmonics, which have to be filtered by an observer at the sequential elements. For fault simulation, the intended application for Weber's tool, the observer can be quite complex because an effective evaluation is expensive (due to the fault effects). But, for conventional, good machine simulation, the observer must be very simple to balance out the inexpensive evaluation of simple gates.

By not maintaining timing information, VELVET avoids many of these timing related problems. Both state-based approaches require new function tables for the basic gates in the simulator. To handle more complex combinational functions, such as those generated by a symbolic analyzer such as ANAMOS (R. E. Bryant, "Boolean Analysis of MOS Circuits," IEEE Trans. on CAD of Integrated Circuits and Systems CAD-6, 4(1987), pp. 634–649), the combinational functions must be broken down into small gates and simulated individually.

In synchronous circuit design, timing verification can be improved by static timing verification techniques such as those described by Pan et al. in "Timing Verification on a 1.2M-Device Full-Custom CMOS Design," 28th Design Automation Conference, 1991, pp. 551–554, and by Grodstein et al. in "Race Detection for Two Phase Systems," Proc. IEEE International Conference on CAD, Nov. 1990, pp. 20–33. Static timing verifiers check timing constraints for all possible input patterns, while conventional dynamic logic simulators can only verify timing constraints on a given pattern sequence. The static check of non-logic effects can be extended to electrical effects such as capacitive coupling as described by Grundmann and Yen in "XREF/COUPLING: Capacitive Coupling Error Checker," Proc. IEEE International Conference on CAD, Nov. 1990, pp. 244–247, and dynamic node timeout as described by Brichoff and Razdan, "Static Charge Decay Analysis of MOS Circuits," in Custom Integrated Circuits Conference, 1991.

SUMMARY OF THE INVENTION

In general, the invention features a method of reducing computational requirements for executing simulation code for a logic circuit design having at least some elements which are synchronously clocked by multiple phase clock signals, the logic design being subject to resistive conflicts and to charge sharing, the simulation code including data structures associated with circuit modules and nodes interconnecting the circuit modules. A three-state version of simulation code is generated for the circuit design, the three states corresponding to states 0, 1, or X, where X represents an undefined state. A preanalysis was performed of the three-state version and phase waveforms are stored each representing values occurring at a node of the code. For each phase of a module for which no event-based evaluation need be performed, an appropriate response to an event occurring with respect to the module of the three-state version is determined and stored. A two-state version of simulation code for the circuit design, the two states corresponding to 0, and 1 is generated. For each phase of a module for which no event-based evaluation need be performed, the stored response with respect to corresponding module of the three-state version is determined and stored.

Embodiments of the invention include the following features. The step of generating a two-state version comprises converting to a logical 1 or 0, any X that appears in a fanout, and generating a fourth state with respect to a node for levels of resistive strength less than or equal to the resistive strength corresponding to capacitive strength. During execution of the two-state version, if a fourth state is encountered at the output of a module, the old state is reassigned to the output.

The exploitation of periodicity in logic simulation of synchronous circuits significantly increases the performance (by five or ten times) of switch-level synchronous circuit simulators.

Other advantages and features will become apparent from the following description and from the claims.

DESCRIPTION

We first briefly describe the drawings.

Figure 5:
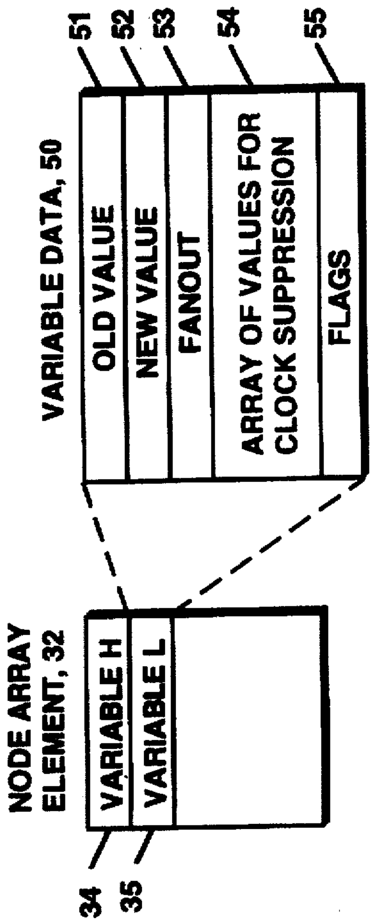
Figure 4:
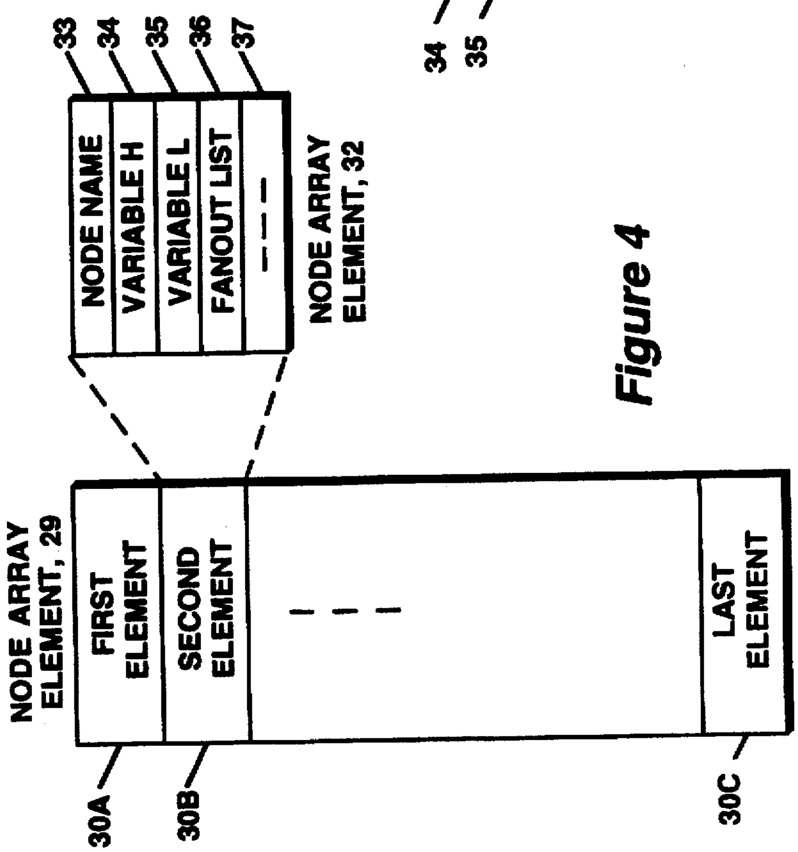
Figure 6:
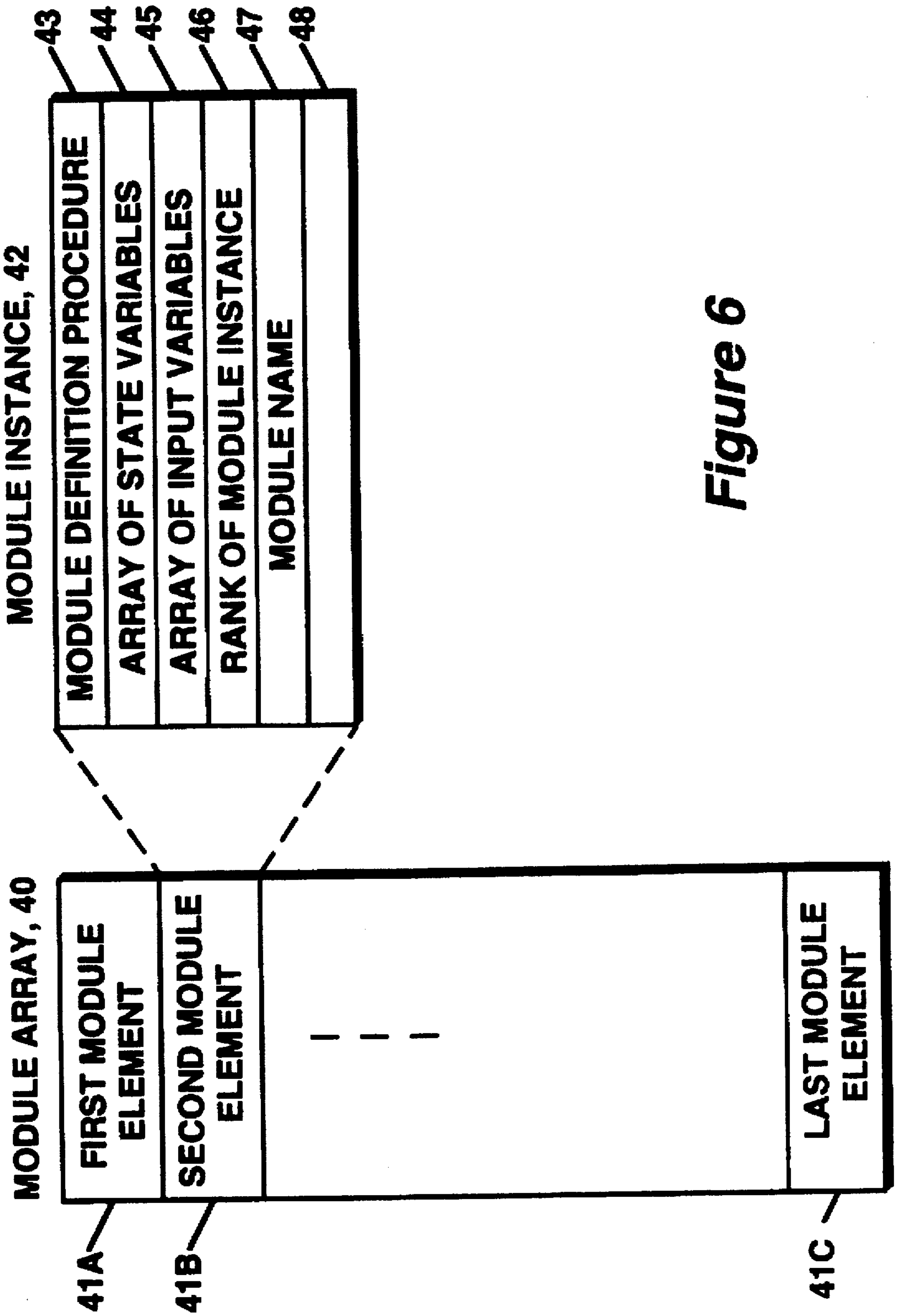

FIGS. 4, 5, and 6 are data structure diagrams for node arrays, node array elements, and module arrays, respectively.

Figures 7, 8:
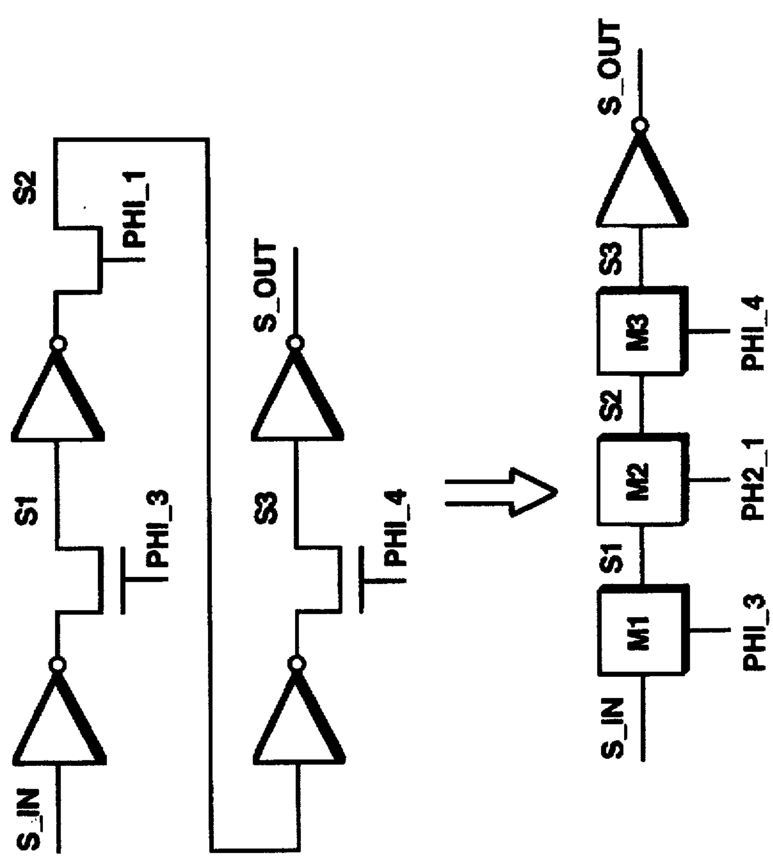

FIG. 7 is a block diagram of a shifter circuit.

FIG. 8 is a formal description of a synchronous circuit model.

Figure 9:
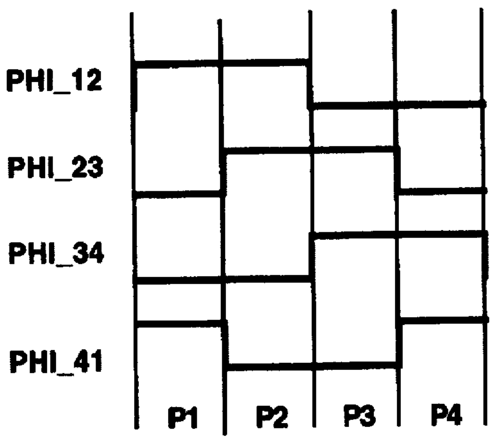

FIG. 9 is a timing diagram of periodic signals.

Figure 10:
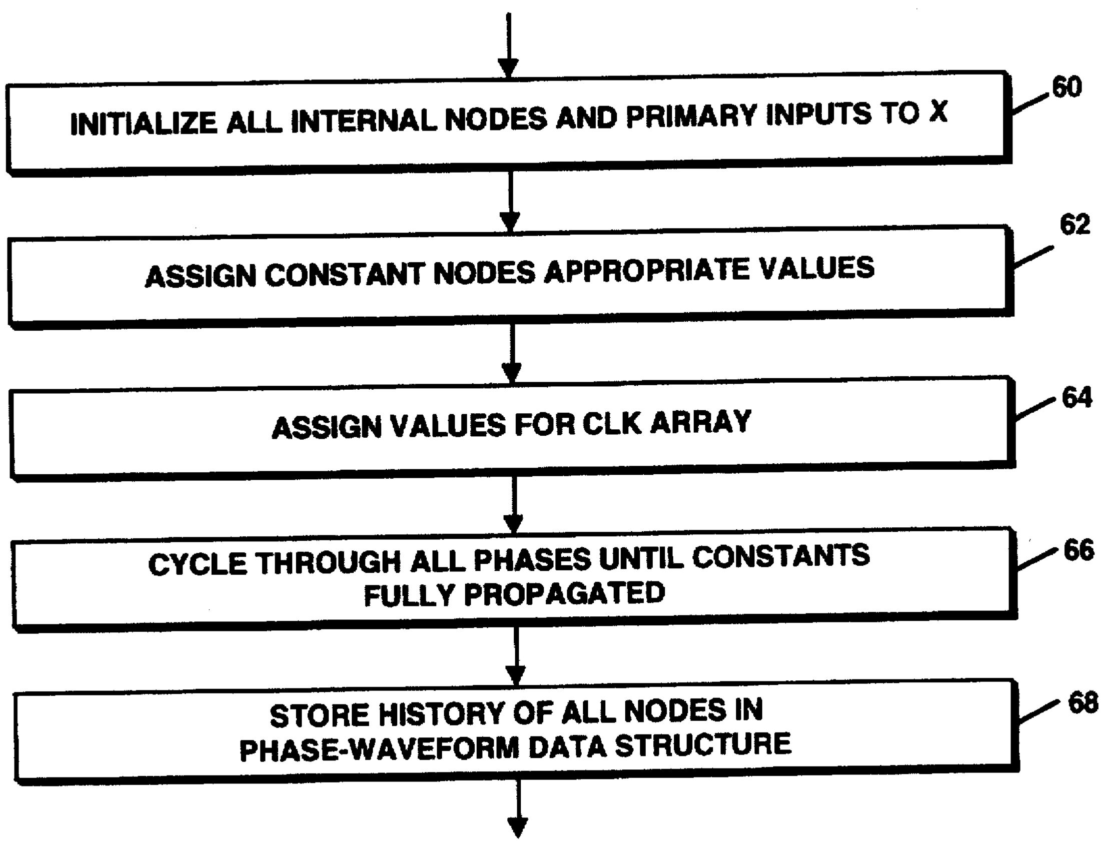

FIG. 10 is a flow diagram of static aspects of a static clock suppression (SCS) algorithm.

Figure 11:
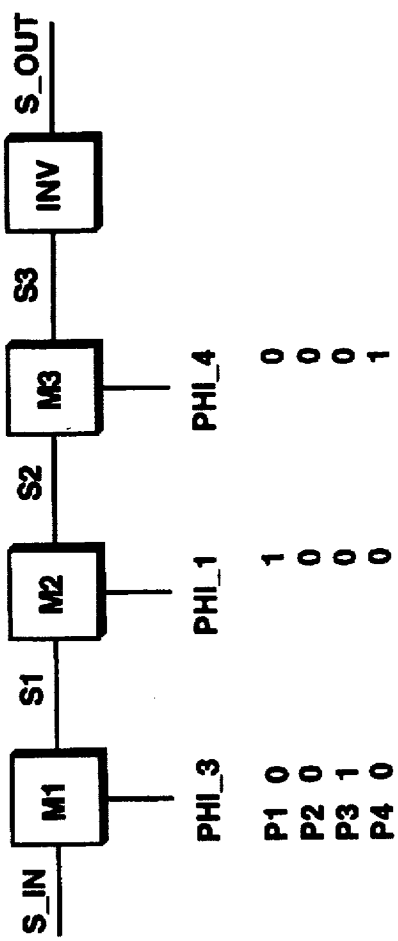

FIG. 11 is a diagram of the result of presimulation on the circuit shown in FIG. 7.

Figure 12:
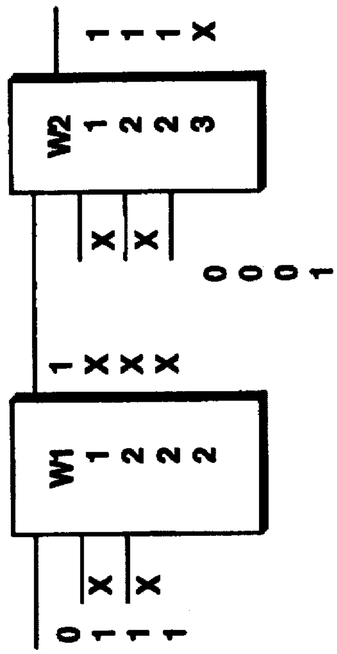

FIG. 12 is a diagram of a 4-phase design with two module evaluation functions.

Figure 13:
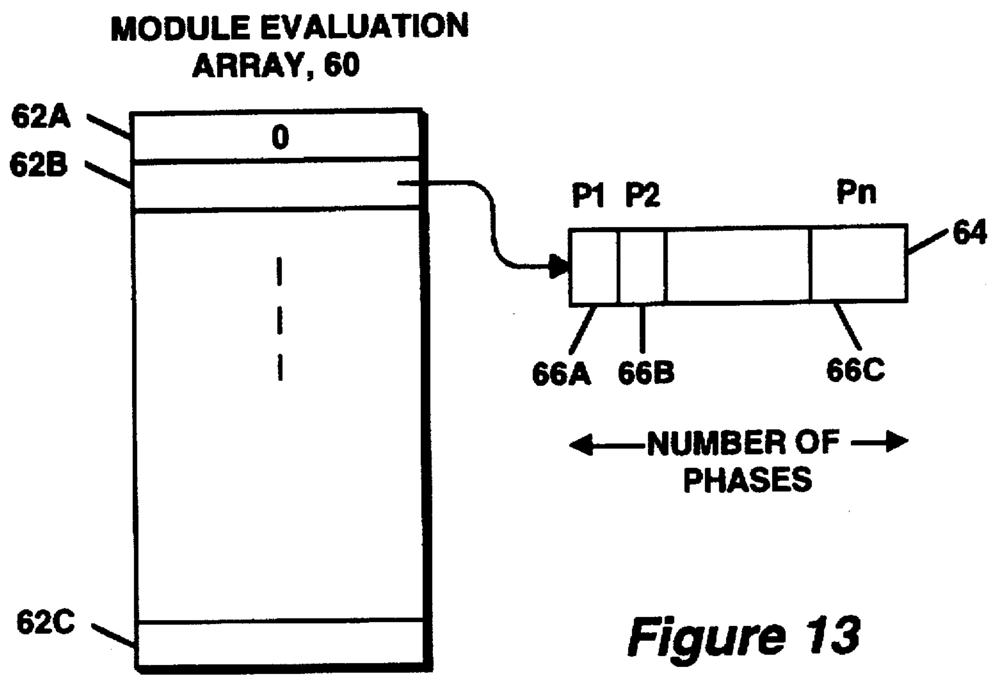
Figure 14:
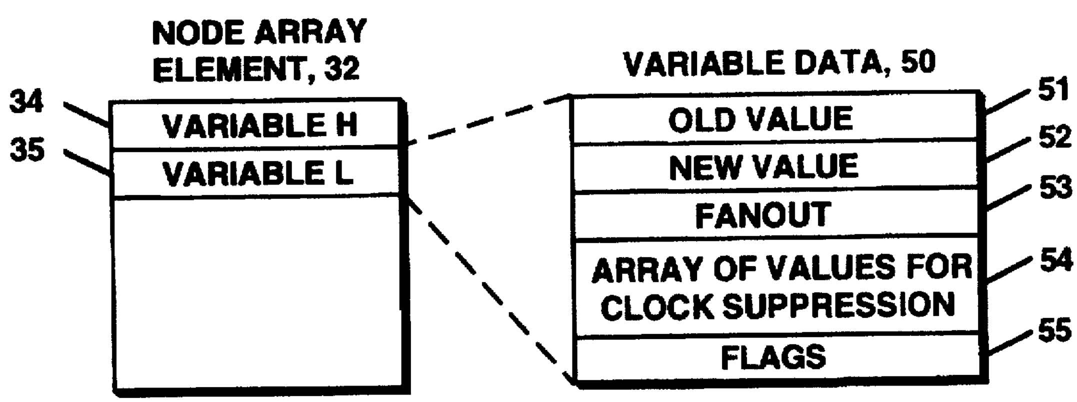

FIGS. 13 and 14 are data structure diagrams for module evaluation array and SCS node array elements, respectively.

FIG. 15 is an example of output from SCS.

Figure 16:
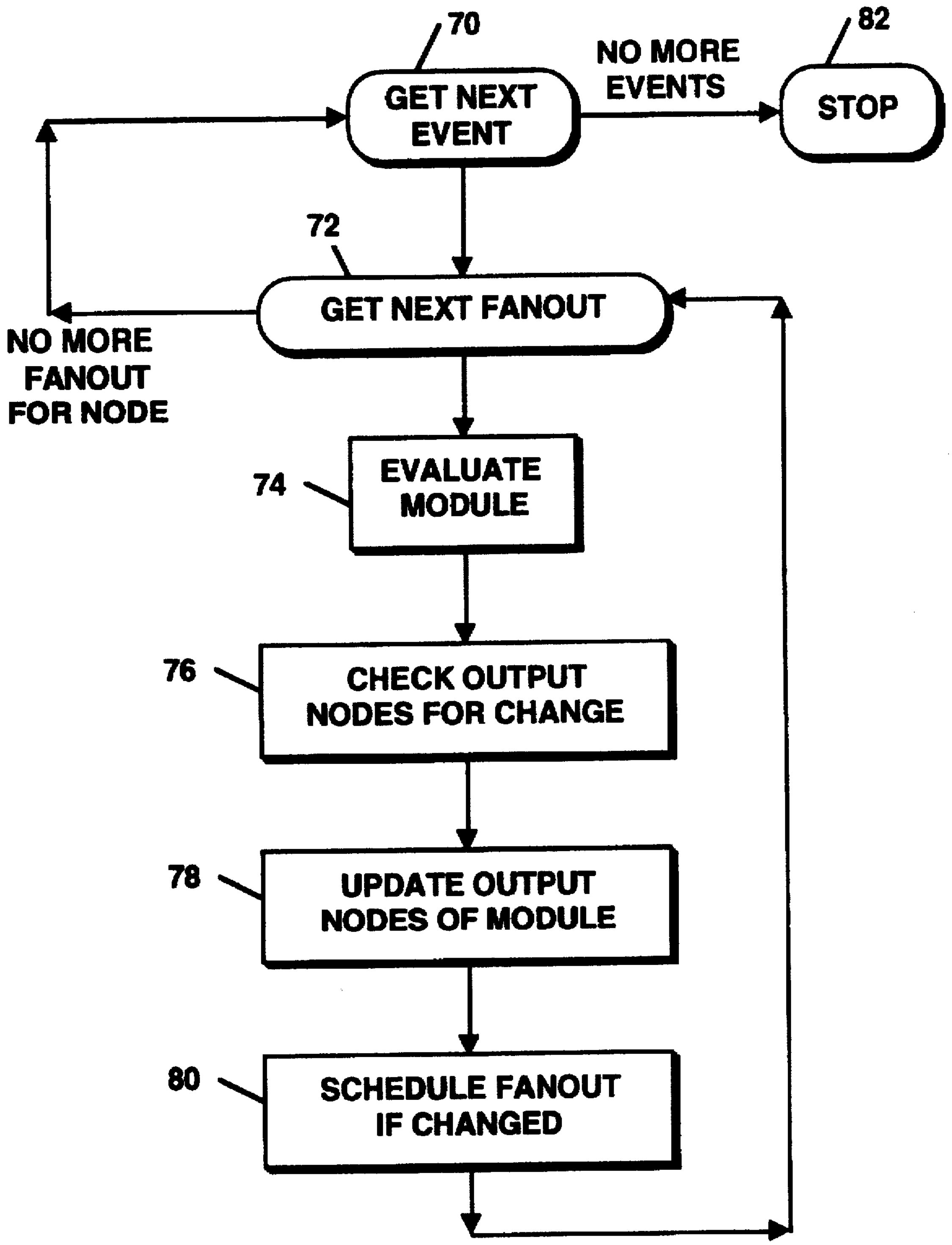

FIG. 16 is a flow diagram of SCS depicting a high-level view of a unit delay circuit analysis algorithm.

Figure 17:
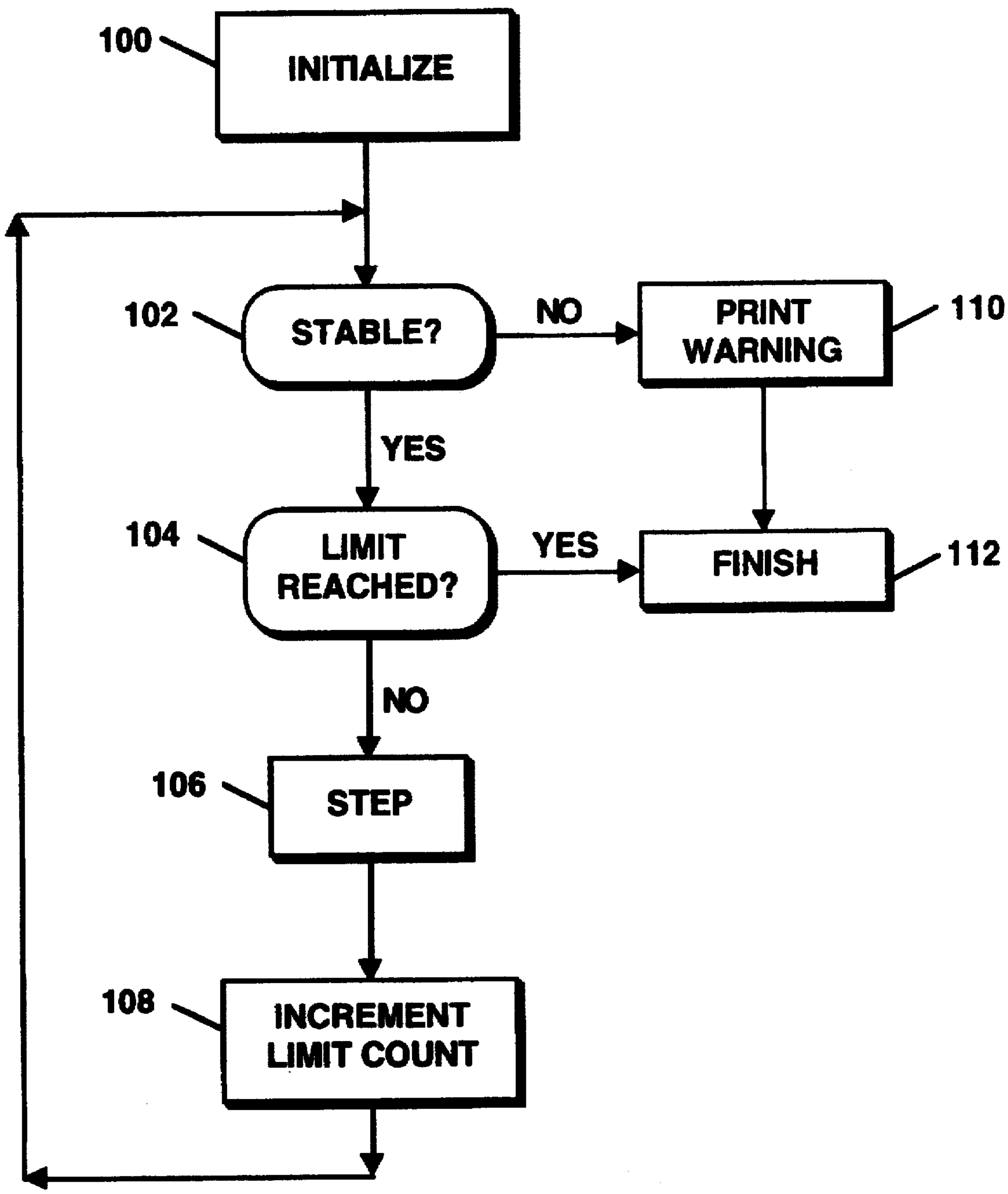

FIG. 17 is a flow diagram of SCS depicting the main loop of the simulation kernel for an event-driven simulator.

Figure 18:
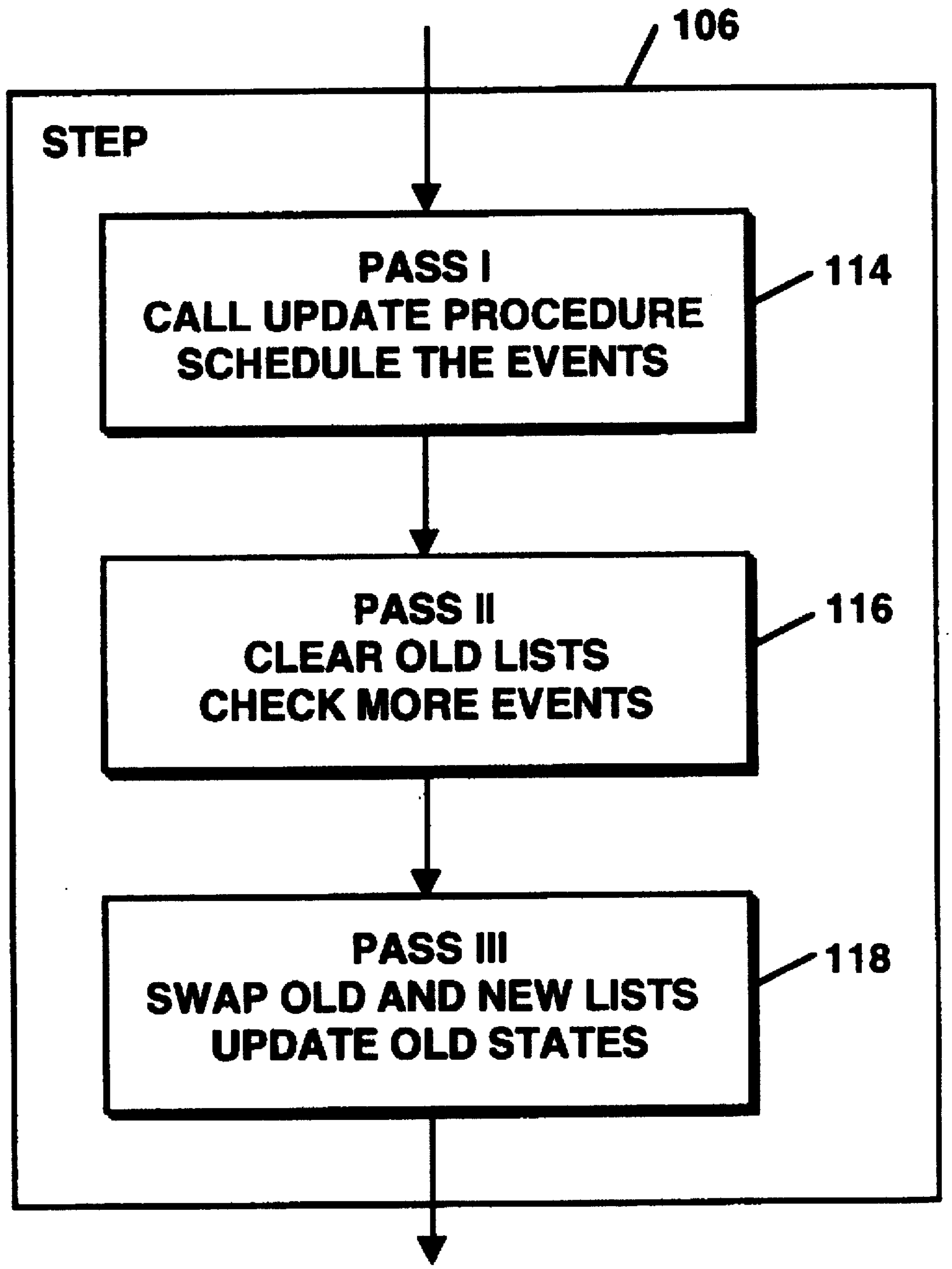

FIG. 18 is a flow diagram of SCS depicting step 106 of FIG. 17.

Figure 19:
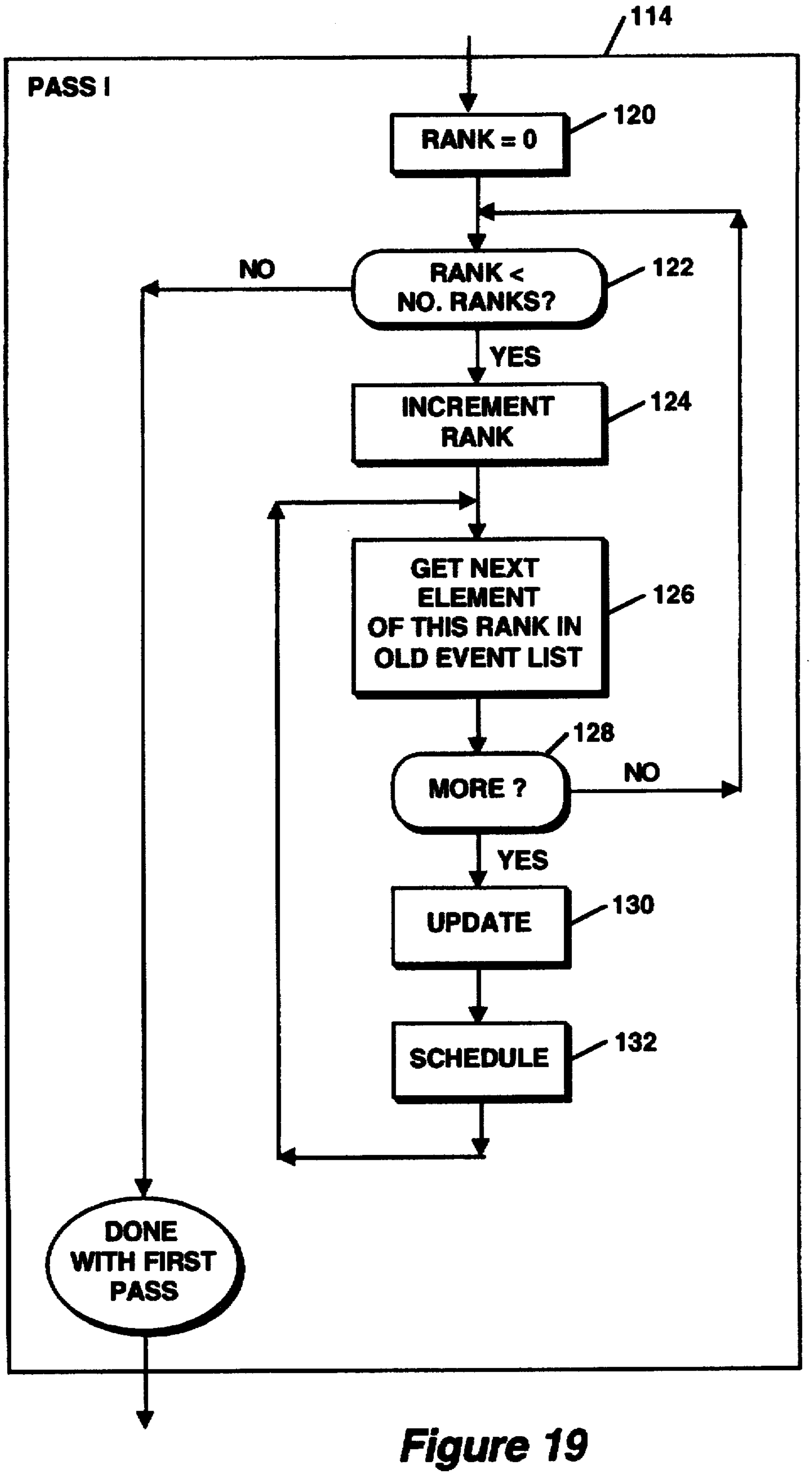

FIG. 19 is a flow diagram of SCS depicting step 114 of FIG. 18.

Figure 20:
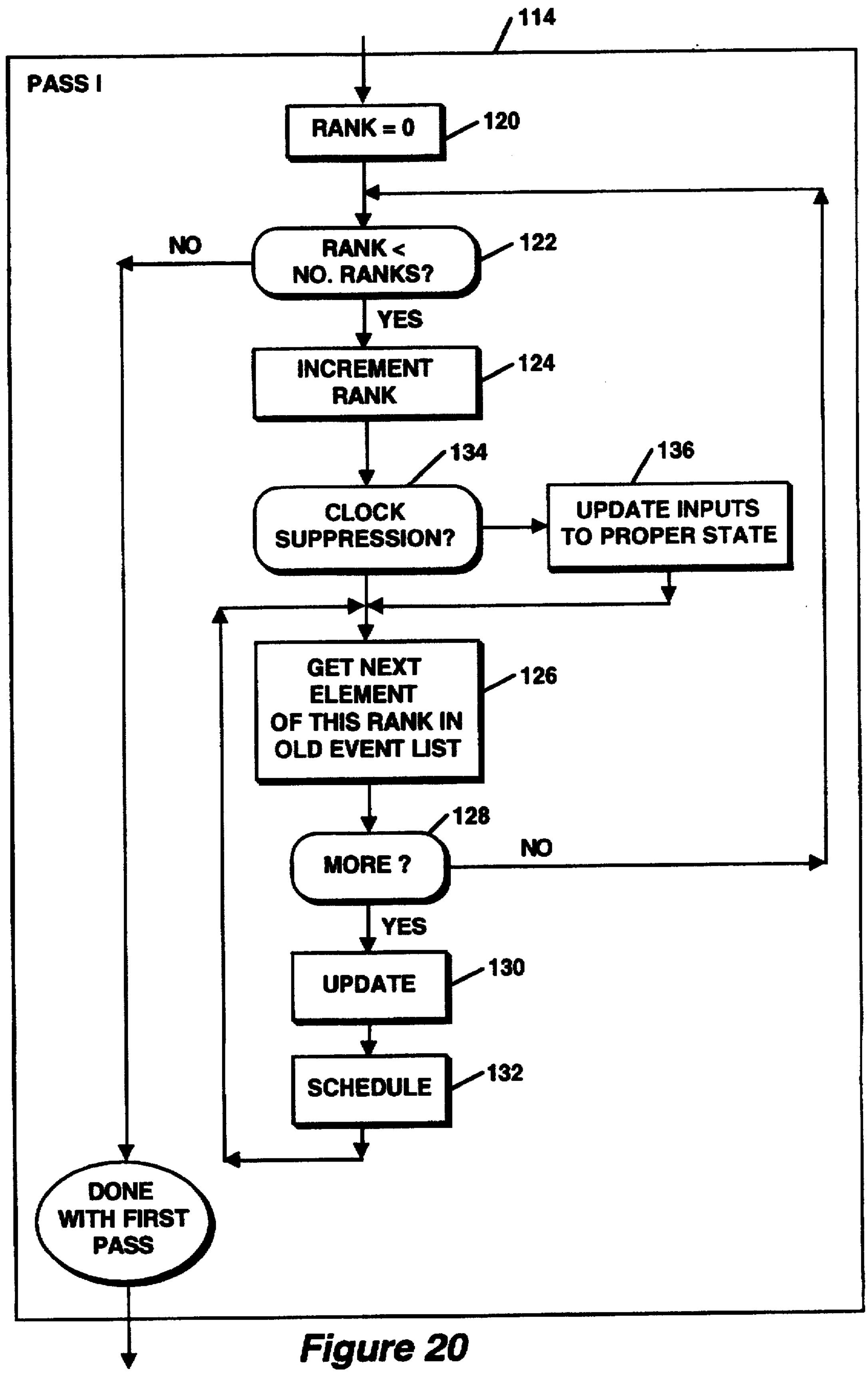

FIG. 20 is a flow diagram of SCS depicting step 114 of FIG. 18.

Figure 21:
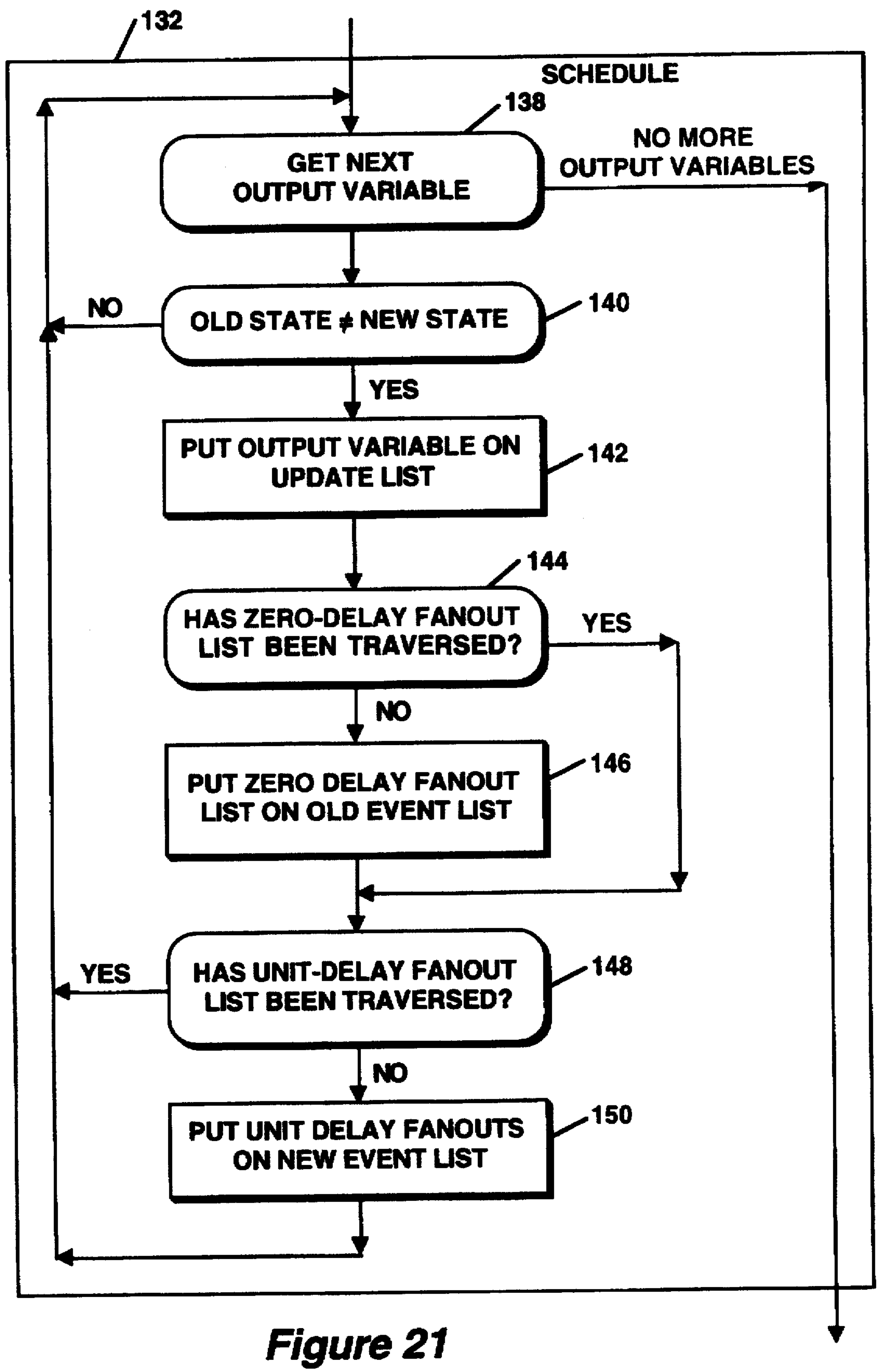

FIG. 21 is a flow diagram of SCS depicting an alternate embodiment of step 132 of FIG. 20.

Figure 22:
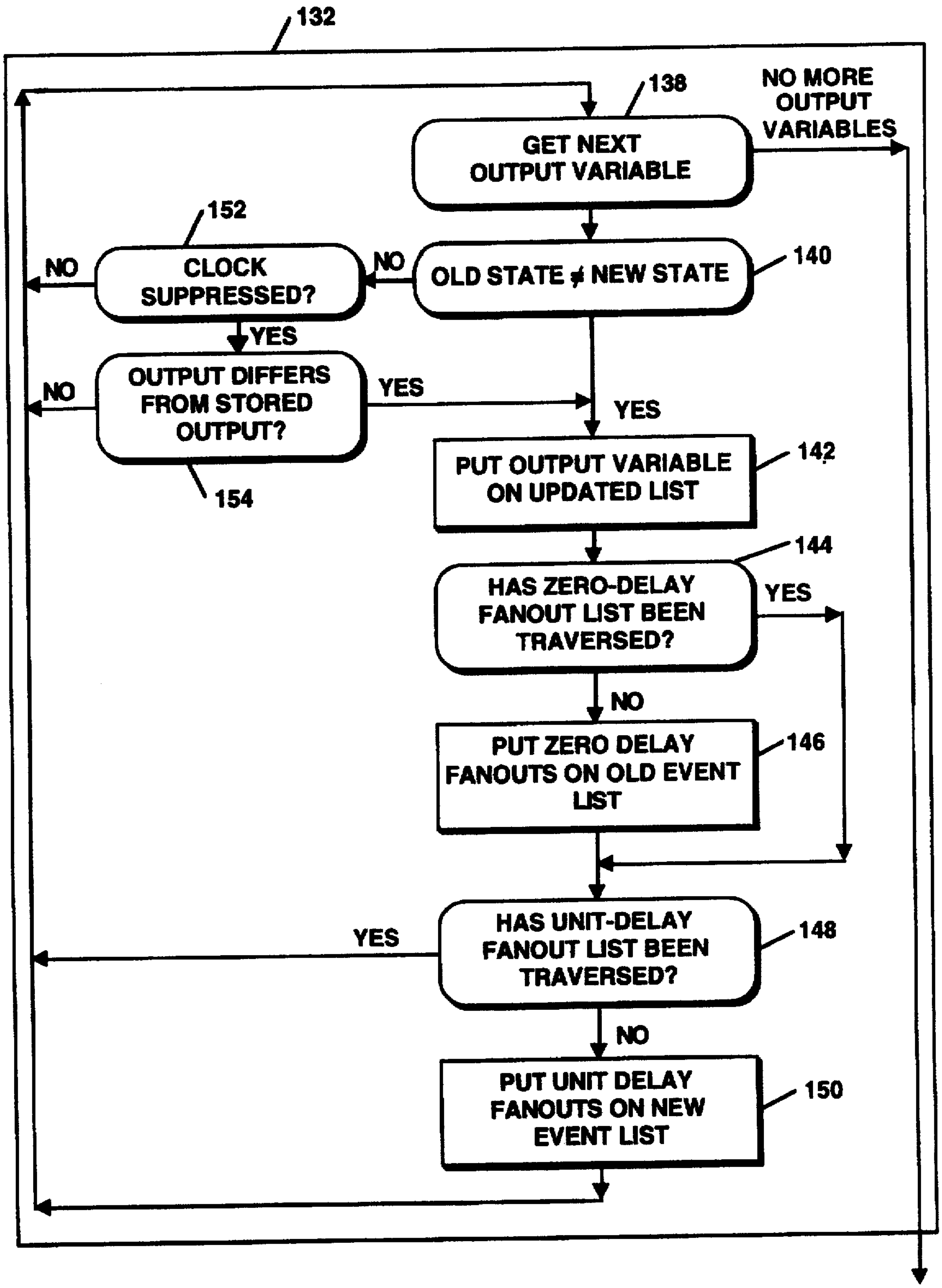

FIG. 22 is a flow diagram of SCS depicting an alternate embodiment of step 132 of FIG. 20.

Figure 23:
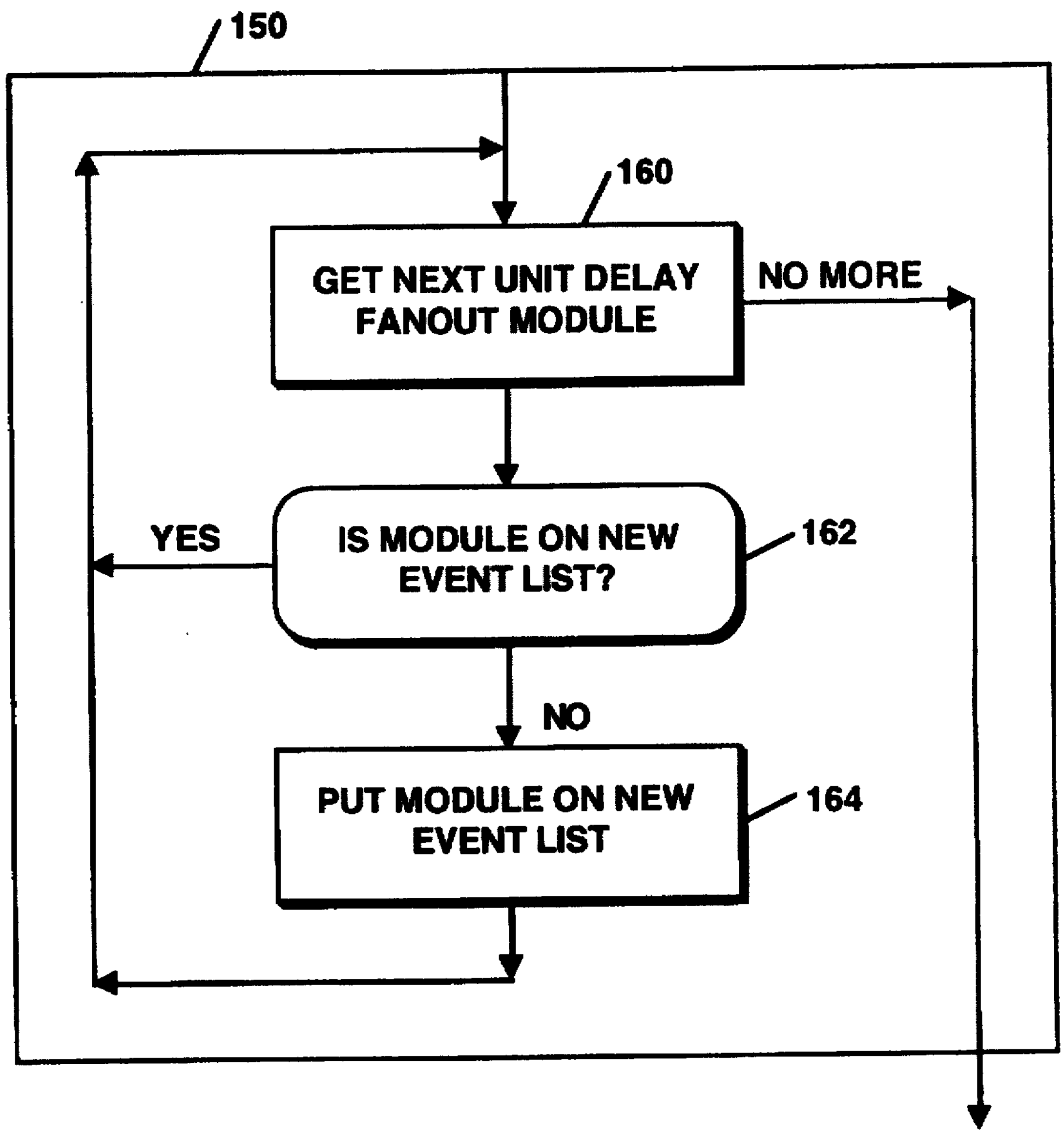

FIG. 23 is a flow diagram of SCS depicting steps of FIG. 21 in more detail.

Figure 24:
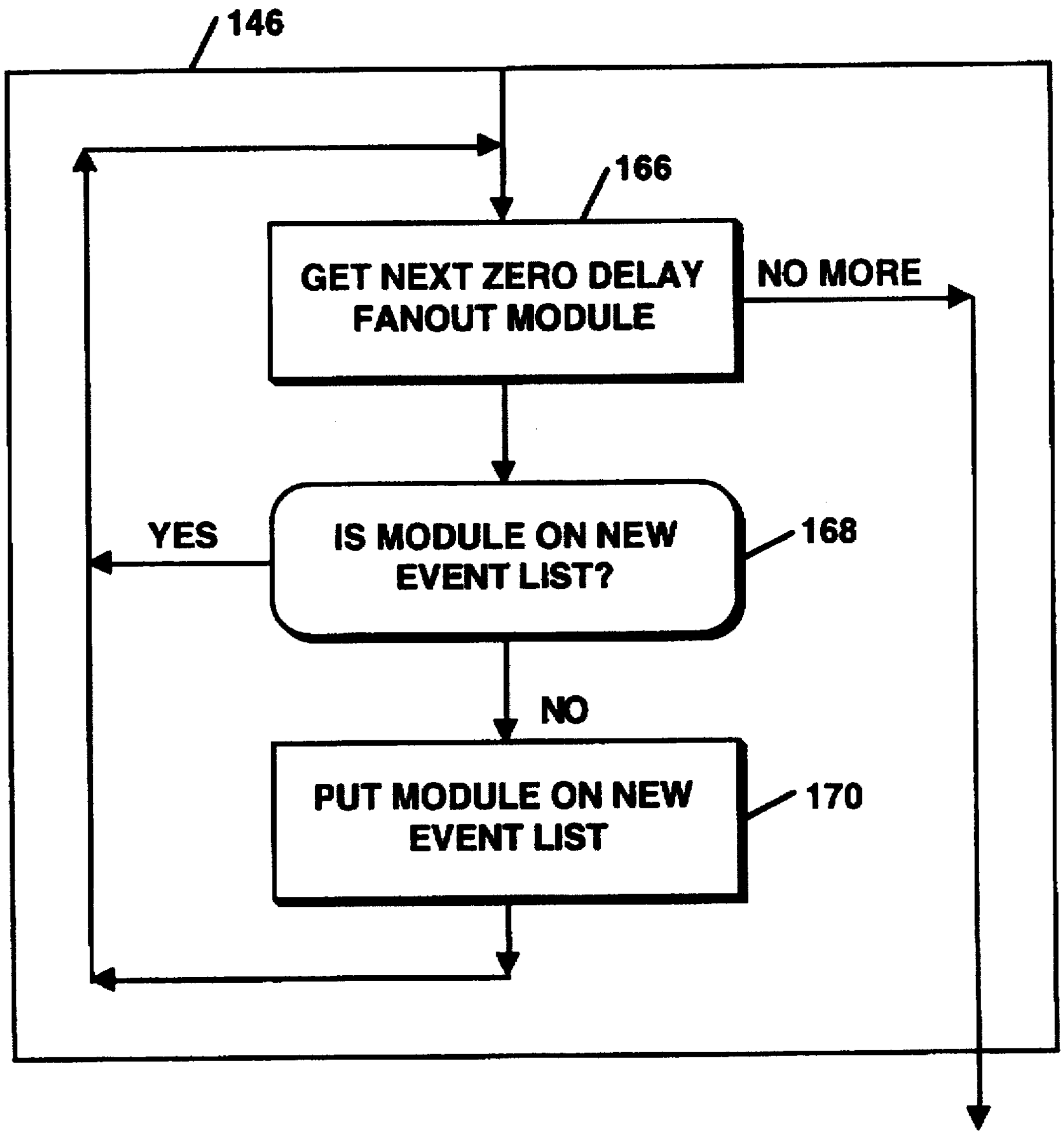

FIG. 24 is a flow diagram of SCS depicting steps of FIG. 21 in more detail.

Figure 25:
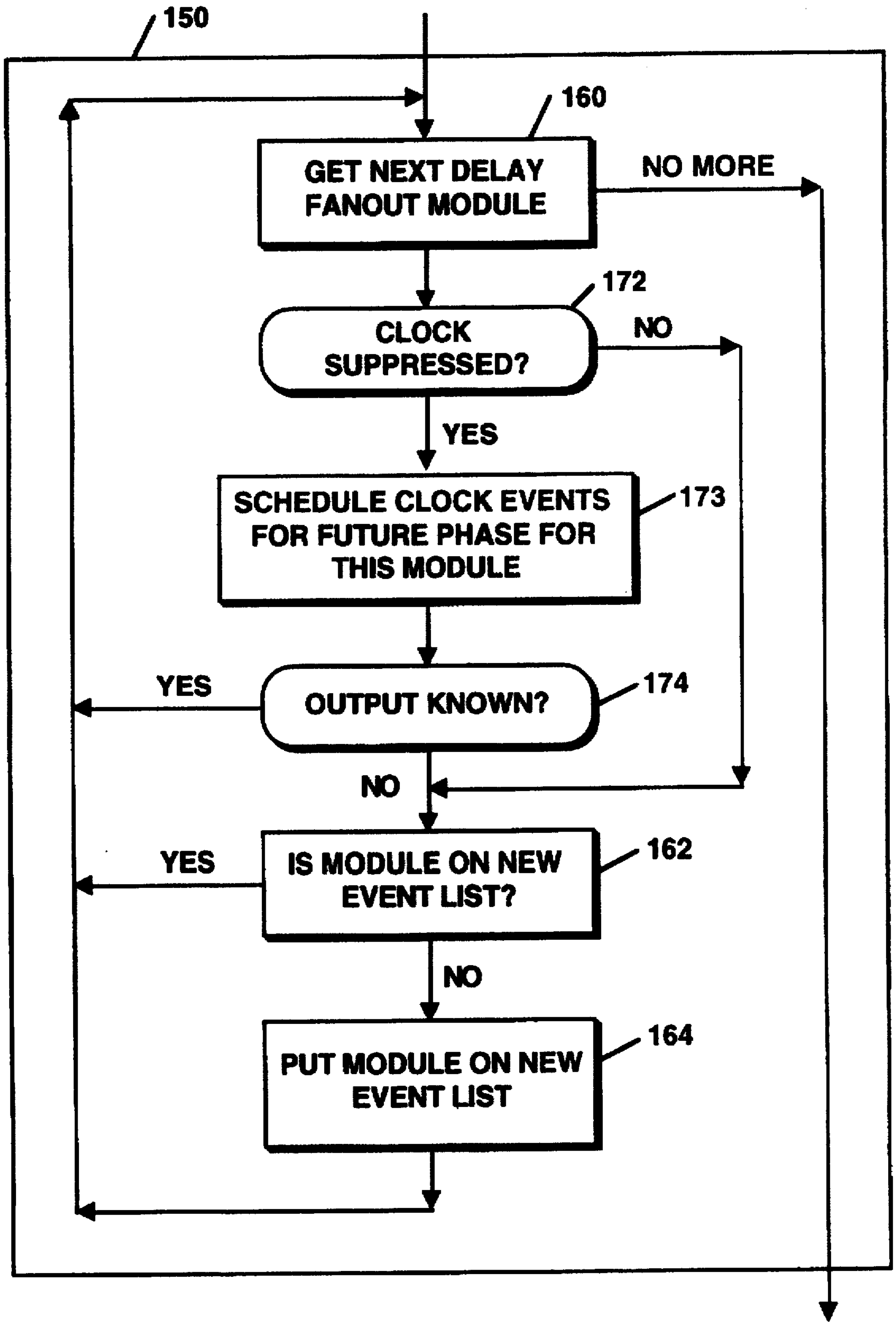

FIG. 25 is a flow diagram of SCS depicting the steps of FIG. 22 in more detail.

Figure 26:
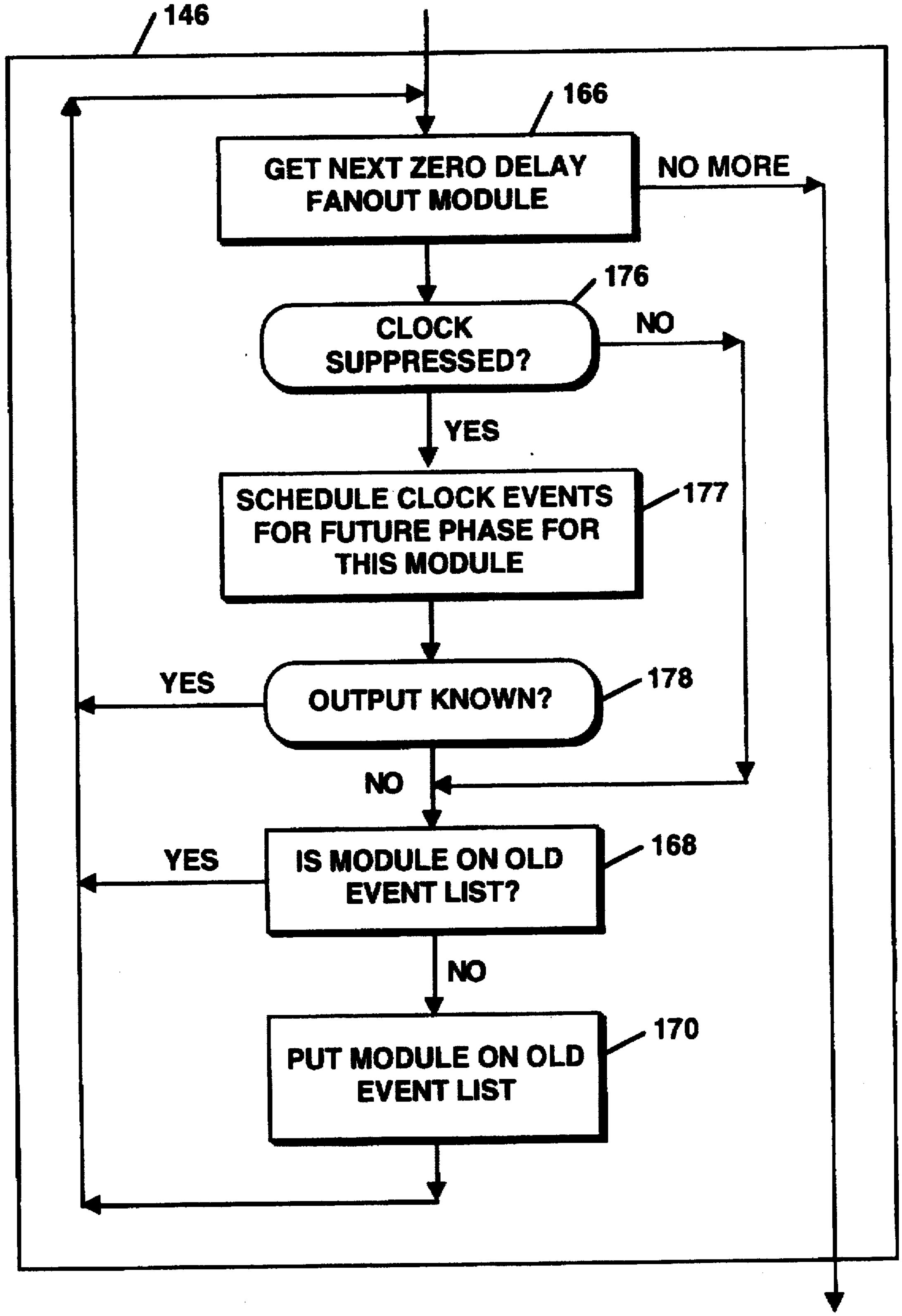

FIG. 26 is a flow diagram of SCS depicting the steps of FIG. 22 in more detail.

Figure 27:
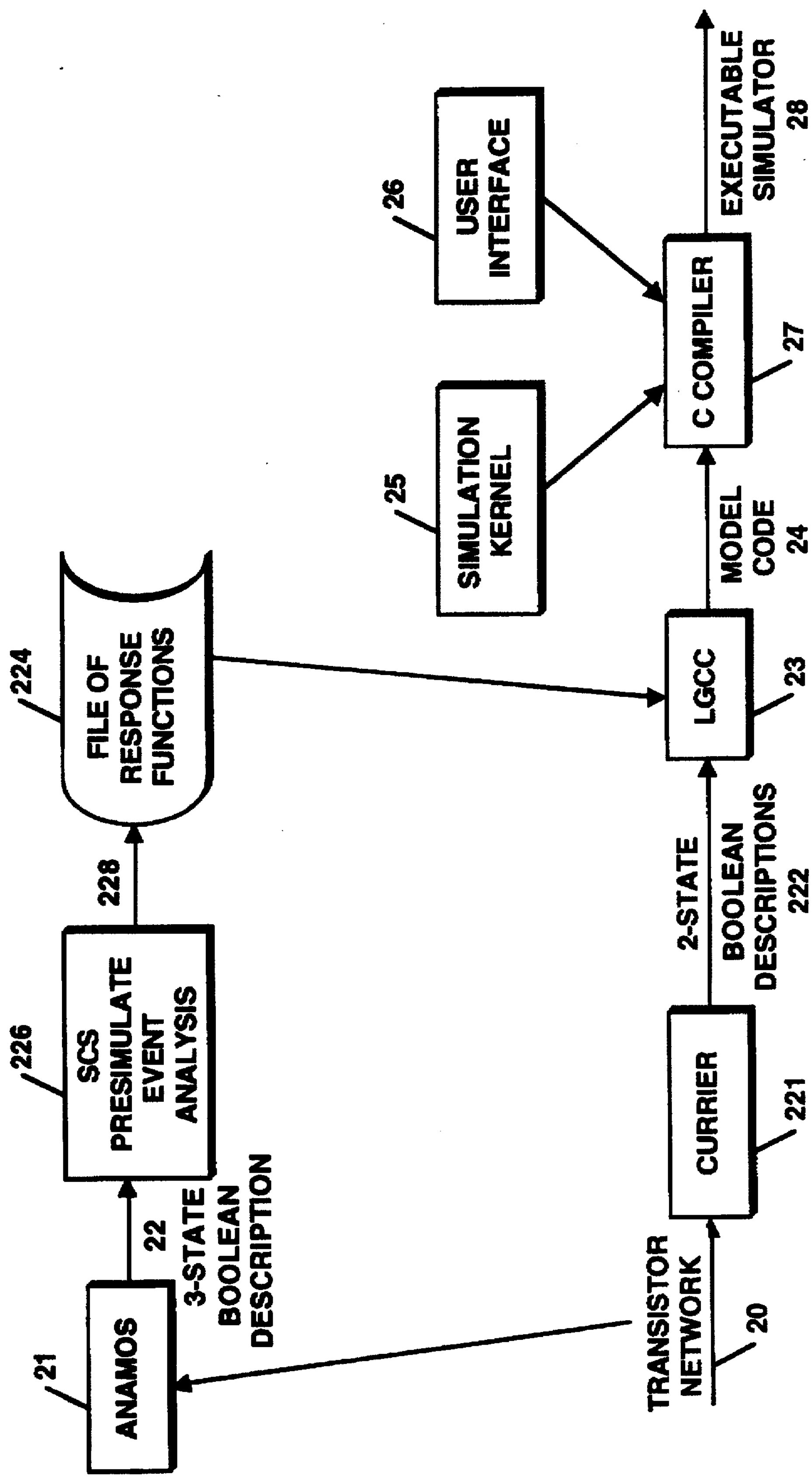

FIG. 27 depicts the use of CURRIER in optimistic model simulation.

Netlist Circuit Model

Preliminarily we discuss the unit-delay switch-level simulator, COSMOS (described by Bryant et al., "COSMOS: a Compiled Simulator for MOS circuits," 24th Designed Automation Conference, 1987, pp. 9–16). COSMOS models switch-level effects of charge sharing and resistive conflict that relate to correct logical operation.

Figure 2:
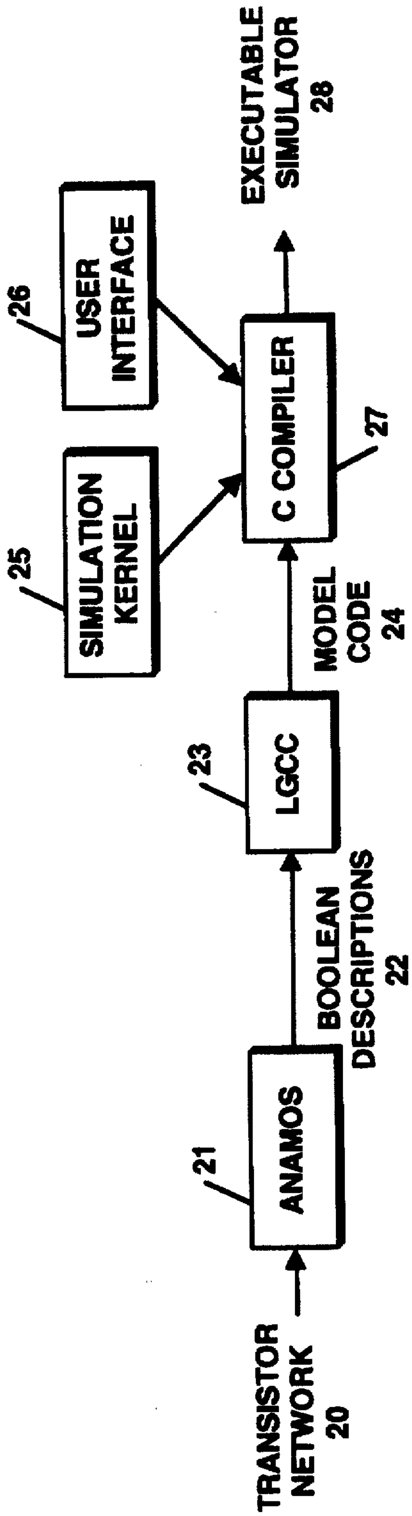
FIG. 2 is a block diagram of the COSMOS logic simulator.

In its original form, COSMOS consists of a set of C language programs configured as shown in FIG. 2. Symbolic analyzer, ANAMOS 21, receives a switch-level representation of a MOS circuit 20 (a netlist of transistors) and partitions it into a set of channel-connected subnetworks. It then derives a boolean description 22 of the behavior of each subnetwork. A second program, LGCC 23, translates boolean representation 22 into model code 24, a netlist of evaluation functions in the form of a set of C language evaluation procedures plus declarations of data structures describing the network interconnections. Finally, model code 24 produced by LGCC 23, together with simulation kernel 25 and user interface code 26, are compiled by C compiler 27 to generate executable simulator code 28. Simulator 28 implements a block-level, event-driven scheduler, with blocks corresponding to the subnetworks. Processing an event at a subnetwork involves calling the appropriate evaluation procedure for that subnetwork to compute the new state and output of the block.

Each procedure generated by LGCC 23 requires two arguments, which are pointers to access the formal parameters of the original description module 20. The only operations required in a procedure are pointer dereferencing, array indexing, assignment, and boolean operations.

A logic input to ANAMOS 21 may have any of four types of elements.

Node: An electrical node acting as either a signal source (input) to the circuit or a capacitor that can store charge dynamically.

Transistor: An MOS transistor acting as a switch that can connect its source and drain terminals depending on the state of its gate terminal.

Block: A circuit module with input-output behavior described by a C language procedure.

Vector: A collection of nodes grouped together for convenient manipulation or observation in the simulator.

ANAMOS 21, followed by code generator LGCC 23, transforms the inputs representing the circuit into a set of a modules connected by simple (i.e., non charge-storing) nodes. Each module of model code 24 corresponds to either a functional block or a transistor subcircuit. A module has behavior specified by an evaluation procedure, either supplied by the user (i.e., functional blocks) or automatically generated (i.e., transistor subcircuits). The complexities of the switch-level node and transistor model are fully characterized by the analysis.

Node Model

The state of a node in the model code 24 is represented by one of three logic values:

| | |
|---|---|
| 0 | low |
| 1 | high |
| X | invalid (between 0 and 1), or uninitialized |

The additional states used in other logic simulators (e.g., high impedance) are not required, because their behavior is captured by the network model. Similarly, there is no need to encode signal strength (e.g., charged, weak, or strong) as part of the node state, because strength effects are captured by the symbolic analysis algorithm.

Two types of nodes are allowed:

Input: Provide strong signals from sources external to the network (e.g., power, ground, clock, and data inputs). Power and ground nodes are treated as having fixed logic values.

Storage: Have states determined by the operation of the network and can (usually) retain these states in the absence of applied signals.

Each storage node is assigned a size in the set {0, . . . ,maxnode} to indicate (in a simplified way) its capacitance relative to other nodes with which it may share charge. When a set of connected storage nodes is isolated from any input nodes, they are charged to a logic state dependent only on the state(s) of the largest node(s). Thus the value on a larger node will always override the value on a smaller one. Many networks do not depend on charge sharing for their logical behavior and hence can be simulated with only one node size (maxnode=1). In general, at most two node sizes (maxnode=2) will suffice with high capacitance nodes (e.g., pre-charged busses) assigned size 2 and all others assigned size 1.

A node size of 0 indicates that the node cannot retain stored charge. Whenever such a node is isolated, its state becomes X. This size is useful when modeling static circuits. By assigning size 0 to all storage nodes, the simulation is more efficient, and unintended uses of dynamic memory can be detected.

Symbolic analyzer ANAMOS 21 attempts to identify and eliminate storage nodes that serve only as interconnections between transistor sources and drains in the circuit. It retains any node that it considers "interesting," i.e., those nodes whose state affects circuit operation. Interesting nodes include those that act as the gates of transistors, as inputs to functional blocks, or as sources of stored charge to other interesting nodes. Sometimes a node whose state is not critical to circuit operation, however, may be of interest to the simulator user. The user must take steps to prevent ANAMOS from eliminating these nodes, by identifying them as "visible". A node can be so identified with a command-line option to COSMOS.

Transistor Model

A transistor is a three terminal device with node connections of gate, source, and drain. Normally, there is no distinction between source and drain connections—the transistor is a symmetric, bidirectional device. However, transistors can be specified to operate unidirectionally to overcome limitations of the network model. That is, a transistor can be forced to pass information only from its source to its drain, or vice-versa. Unidirectional transistors are required only rarely in such circuits as sense amplifiers and pass transistor exclusive-or circuits. Excessive use of unidirectional transistors can cause the simulator to overlook serious design errors. Any circuit simulated with unidirectional transistors should be thoroughly analyzed with a different circuit simulator, e.g., the SPICE simulator.

Each transistor has a strength in the set {1, . . . , maxtran}. The strength of a transistor indicates (in a simplified way) its conductance when turned on relative to other transistors which may form part of a ratioed path. When there is at least one path of conducting transistors to a storage node from some input node(s), the node is driven to a logic state dependent only on the strongest path(s), where the strength of a path equals the minimum transistor strength in the path. Thus, a stronger signal will always override a weaker one. Most CMOS circuits do not involve ratioing, and hence can be simulated with one transistor strength (maxtran=1). Most nMOS circuits can be modeled with just two strengths (maxtran=2), with pullup transistors having strength 1 and all others having strength 2. However, circuits involving multiple degrees of ratioing may require more strengths. ANAMOS 21 utilizes as many node sizes and transistor strengths as are used in the network file with the limitation that maxnode+maxtran<16.

The simulator models three types of transistors: n-type, p-type, and depletion. A transistor acts as a switch between source and drain controlled by the state of its gate node as follows: When a transistor is in an "unknown" state it forms a conductance of unknown value between (inclusively) its conductance when "open" (i.e. 0.0) and when "closed". The simulator models these transistors in such a way that any node with state sensitive to their actual conductances is set to X. The following table summarizes transistor state as a function of gate node states.

| gate | n-type | p-type | depletion |
|---|---|---|---|
| 0 | open | closed | closed |
| 1 | closed | open | closed |
| X | unknown | unknown | closed |

Normally, transistor switching is simulated with a unit delay model. That is, one simulation time unit elapses between when the gate node of a transistor changes state, and the subcircuit containing the source and drain nodes of the transistor is evaluated. However, a transistor can be specified to have zero delay, meaning that the subcircuit will be evaluated immediately.

Zero delay transistors are required only in rare cases to correct for the effects of circuit delay sensitivities. They can also be used to speed up the simulation, by creating rank-ordered evaluation of the circuit components.

Functional Block Model

For both efficiency and flexibility purposes, a user may wish to describe some portion of a circuit in terms of its behavior rather than its transistor structure. The functional block capability provides a limited means to do this. Each functional block acts as a single circuit module.

Vectors

A vector is an ordered set of circuit nodes. Vectors are provided only for convenience in the simulator, to allow a user to manipulate or observe the values on a set of related nodes. Most of the preprocessing programs simply pass a vector declaration along to the next stage. However, ANAMOS 21 also marks all vector elements as visible and hence will not eliminate them.

Circuit Partitioning

Each module into which ANAMOS 21 partitions the initial circuit description 20 corresponds to either a functional block, or a transistor subnetwork. A subnetwork consists of a set of storage nodes connected by sources and drains of transistors, along with all transistors for which these nodes are sources or drains. Observe that an input node is not in any subnetwork, but a transistor for which it is a source (or drain) will be in the subnetwork containing the drain (or source) storage node. The behavior of a module is described by an evaluation procedure, provided by the user for a functional block or generated automatically for a subnetwork.

Each module has 3 classes of connections:

Unit-delay inputs: Inputs that affect the module 1 time unit after they change value.

Zero-delay inputs: Inputs that affect the module immediately after they change value.

Results: The outputs and state variables of the module.

For a functional block, these connections are explicitly defined in the block procedure. For a transistor subnetwork, the unit-delay inputs consist of the gate nodes of the unit-delay transistors, and the circuit input nodes connected to the drains and sources of the subnetwork transistors. The zero-delay inputs consist of the gate nodes of the zero-delay transistors. The result nodes consist of the subnetwork nodes that are not optimized away by ANAMOS 21.

Figure 3:
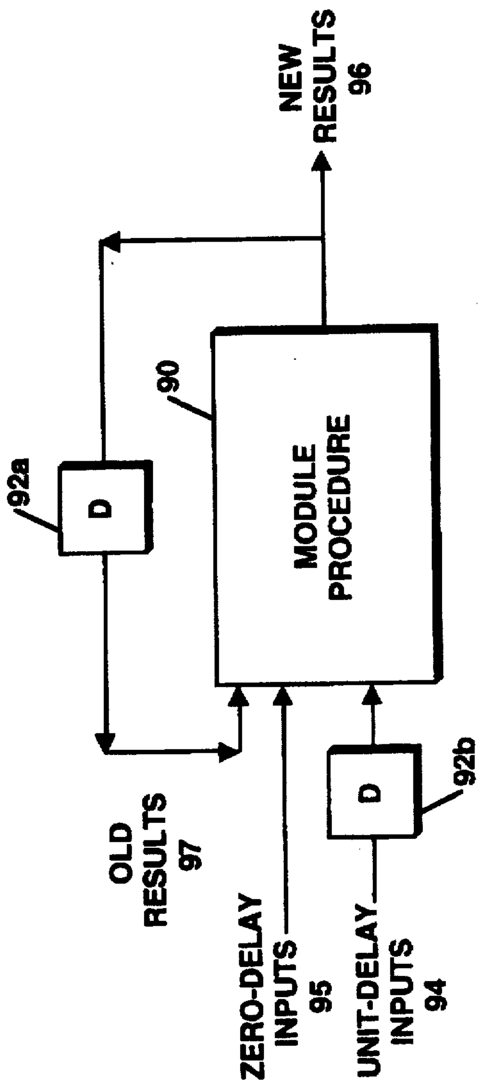
FIG. 3 is a block diagram of the finite state behavior of a circuit module.

As illustrated in FIG. 3, each module of model code 24 behaves as a finite state machine, computing new result values 96 for the results as a function of the old result values 97 on the results and unit-delay inputs 94, and the new values on the zero-delay inputs 95. The boxes labeled with "D" **92*a*–92*b* in FIG. 3** represent a delay of one simulation time unit.

The partitioned circuit obeys the following rules:

1. A node can be a result connection of at most one module.

2. There can be no zero-delay cycles, i.e., every cycle in the set of interconnected modules must be broken by at least one unit delay.

These rules restrict the class of circuits that can be modeled. The first rule implies that no node can be the result of two functional blocks. Furthermore, any node which is the result of a functional block is treated as an input node for any connected transistor circuitry. The second rule limits the use of zero-delay transistors and zero-delay functional block connections. In a diagram of a set of interconnected modules according to the scheme of FIG. 3, every cycle must contain a box labeled D.

Timing Model

The simulation is designed for clocked systems, where a clocking scheme consists of a set of state sequences to be applied cyclically to a set of input nodes. The program assumes that the circuit clocks operate slowly enough for the entire circuit to stabilize between successive changes of clock and input data values. For synchronous circuits, the flow of time can be viewed at 4 levels of granularity:

| | |
|---|---|
| cycle | A complete sequencing of the clocks |
| phase | A period in which all clock and input values remain constant. |
| step | The basic simulation time unit. Within a phase, unit steps are simulated until the network reaches a stable state, or the step limit is exceeded. |
| rank | To model zero delay transitions. Each circuit module is assigned a rank greater than the rank of any module supplying a zero-delay input. A unit step involves a series of ranks, computing new values for nodes as a function of the old node values as well as the new values on nodes of lower rank. |

The clocking pattern is declared to the simulator with the clock command, in terms of the sequences of values to be applied to the clock nodes.

Unclocked circuits can also be simulated, although in a limited way, by interacting with the user at the phase level. For a combinational circuit, each phase represents the propagation of a set of values from the inputs to the outputs. For an asynchronous circuit, each phase represents a reaction by the circuit to a change in the control lines implementing the communication protocol (generally some form of handshaking.)

The simulator assumes that when the circuit does not reach a stable state within a fixed number of unit steps (determined by the step limit), an unbounded oscillation has occurred. It will then take one of two actions, depending on the setting of the command-line "oscillate" switch:

Stop the simulation phase and print an error message (oscillate=0)

Continue simulating, but set any changing nodes to X until the circuit stabilizes (oscillate=1, the default).

The initialized data structures produced by LGCC 23 represent the overall network structure. These data structures define the circuit nodes, their membership in subnetworks, and their controlling effects on other subnetworks. Their key features are the node array and the module instance array, which refer to each other. In addition to the node array and module instance array, LGCC generates array declarations which allocate (at compile time) storage for the simulation kernel's event lists.

Node Array and Module Instance Array

Referring to FIG. 4, each entry **30*a*–30*c* in node array 29 declares a node array element 32 with fields indicating its name 33 and two simulation variables 34–35 (for dual-rail encoding of node state). A simulation variable (referring to FIG. 5) is represented by its old and new values 51–52, and its fanout list 53. The old and new values are boolean values used to implement a strict unit-delay timing model. The fanout list 36 (FIG. 4) is a sequence of references to the module instances which are affected when the value of the variable changes. Various other flags 55** for internal use are also stored.

Referring to FIG. 6, each entry **41*a*–41*c* in module instance array 40 declares a subnetwork instance 42. The fields for an instance indicate the procedure describing subnetwork behavior 43, lists of state and input variables 44–45, and flags 46–48 used by simulation kernel's 25 (FIG. 2**) event scheduler.

Simulation Kernel

The simulated system appears to the simulation kernel 25 as a set of boolean state variables connected by procedural modules. Its design does not depend on the correspondence between pairs of variables and circuit nodes nor between module instances and subnetworks.

Simulation kernel 25 simulates of a phase as the basic simulator operation. During a phase, the program holds all data and clock inputs fixed and simulates unit steps until either it reaches a stable state or exceeds a user-specified step limit. Each unit step consumes one event list and produces another, where the initial event list indicates any new values on input nodes. The program makes one pass through the event list, calling module procedures to compute new values of the module output variables. It then makes a second pass to update the state variables and schedule all modules affected by the changing variables. Two passes are required to implement a strict-unit-delay model. The kernel requires only two event lists at any time, neither of which can be larger than the number of modules in the network.

Evaluation Functions

Each evaluation function produced by ANAMOS models the behavior of a channel-connected region under conditions of charge sharing and resistive conflict. Since an evaluation function is associated with each channel-connected region, each node is associated with only one evaluation function.

Monotonic Property

The functions produced by ANAMOS are three-valued, monotonic logic functions. The third value, X, indicates an unknown or indeterminate value. If we define a partial ordering over the set {0,1,X} where X<0 and X<1, this ordering represents the certainty of a node value where X indicates an undefined state, while 0 and 1 represent fully defined states.

The monotonic property can be described as follows: Given a function, fn: {0, 1, X}→{0, 1, X} and elements a, b ∈ {0, 1, X}, a function is monotonic if it satisfies the condition:

$$a \leq b \rightarrow fn(a) \leq fn(b).$$

This property can be easily extended to vectors. Given two vectors A and B of size n, $$A, B \in \{0, 1, X\}^n$$

A≦B if ∀i $a_i \leq b_i$, 0≥i<n, where a, b are elements of the A, B vectors respectively.

An important consequence of the monotonic property is that if an evaluation function is given some inputs equal to X, and the output is at a non-X value, the output cannot be changed due to any change in the inputs which were at X. For example, given a 3-input NAND gate with one input fixed to 0, the output will be fixed to 1 independent of the values of the other two inputs to the NAND gate.

Temporal Properties

The temporal properties of the COSMOS unit delay simulator can be modeled in the following manner.

Let $$IN \in \{0, 1, X\}^n$$

be the internal node vector for the network. For example, the IN array in the circuit in FIG. 7 would consist of S1, S2, S3, and S_out. Each node in the IN array has at most one associated evaluation function. Let $$NS \in \{\text{ANAMOS Functions}\}^n$$

be an array of ANAMOS generated evaluation functions for the nodes in the IN array. For example, the evaluation functions for the circuit in FIG. 7 would consist of the evaluation functions, M1, M2, M3, and INV, which correspond to nodes S1, S2, S3, and S_out, respectively. Finally, let $$PI \in \{0, 1, X\}^m$$

be the control vector that represents the external/primary inputs to the network. For example, the control node array for the circuit in FIG. 7 would consist of S_in, PHI_3, PHI_1, and PHI_4. The unit-delay nature of the network can be represented as follows:

$$\forall i\ IN^i_{t+1} = NS^i(IN_t, PI_t) \qquad (1)$$

where 1≤i<n and i, t ∈ N where t is the unit-step time.

Zero-delay simulation can be accommodated in this model by collapsing the internal nodes of a zero-delay region, and combining the evaluation functions into a larger evaluation function.

Synchronous Circuit Model

Figure 1:
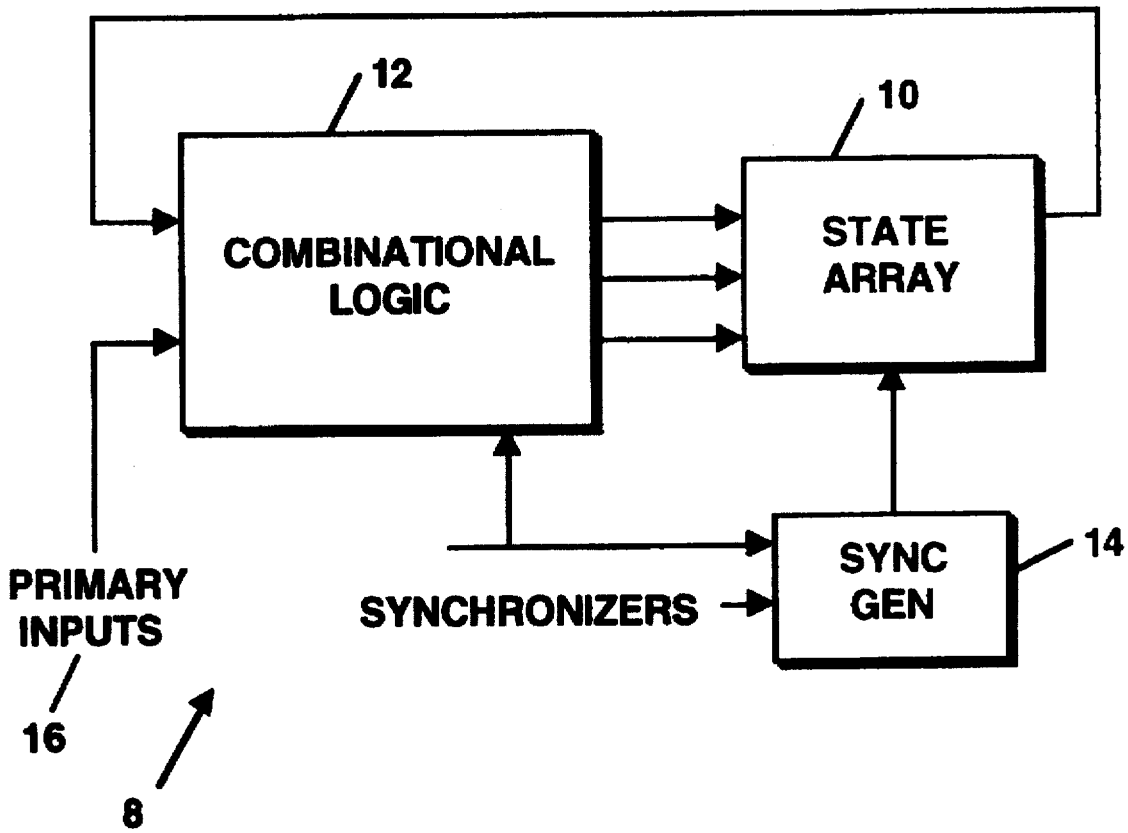
FIG. 1 is a diagram of a synchronous circuit.

A Synchronous Circuit (SC) model may be abstracted from the above general unit-delay simulation model. FIG. 1 is an informal view of this model. Referring to FIG. 8, a more formal description of a synchronous circuit model starts by partitioning the IN array and the PI arrays.

The IN array is partitioned into two arrays: the PS and CS array. The PS array consists of nodes which form the permanent state of the network. This array, which is not unique, generally consists of all the outputs of sequential elements in the network. The CS, combinational state, array consists of all the nodes whose state can be derived from the state of the PS array and the PI array.

The PI array is partitioned into the DI and CLK arrays. The CLK array consists of all the periodic signals that are the synchronizers for the synchronous circuit. The DI array consists of the remaining signals in the PI array; these signals are the data inputs to the synchronous circuit. In addition, we define the term quiescent network. A quiescent network is a network in which an additional evaluation of equation (1) will not cause any changes in the IN array. A quiescent network represents the state of the network after some change in the PI array, and after sufficient (unit delay) time to settle. In an event-driven simulator, the simulation until quiescence would translate to a simulation until the event list is empty.

Finally, we define some rules of operation for the SC model:

1. The CLK array consists of "well defined" periodic signals.

2. The PS array can only be changed based on a change of state in the CLK array. In addition, the DI array can only change when the CLK array changes.

3. The CLK array can only change state when the network is in a quiescent state.

4. After a change in the CLK array, the network must reach a quiescent state. Oscillations are not allowed.

5. The network evaluation to reach the quiescent state must be race free, so that the network must reach the same quiescent state independent of the order of evaluation.

The temporal behavior of the SC model can be modeled by a finite state machine. In this state machine, PS nodes form the state elements, the simulation until quiescence produces the next state function, and the movement to the next state occurs on a change in the CLK array. For each simulation until quiescence, some nodes in the PS array are latched, and the new values propagate through the combinational logic to the inputs of PS node functions.

Properties of SC Model

The synchronous circuit model has properties that will be useful for clock suppression algorithms.

Periodic Signals Property

The CLK array consists of nodes that obey the following property. Given a function f: R→{0,1,X} that takes a real number, R, as the input and produces a three-state value as the output, $$f(t)=f(t+T) \tag{2}$$

where T is the period. The term "well defined" refers to the fact that the value of f is known for all values of t≦0.

The periodic signals property states that given well defined periodic signals for the elements of the CLK vector, the CLK vector as a whole must be periodic as well. More formally, given $$vf: R\rightarrow\{0,1,X\}^{cn},$$

a function that generates the values for a CLK vector of size cn, $$vf(t)=vf(t+CT) \tag{3}$$

where CT is the period for the CLK vector.

The movement of the CLK vector is as follows: $CLK_{t0}$, $CLK_{t1}$ . . . $CLK_{tCT}$, where $t_0$, $t_1$, $t_2$ . . . $t_{CT}$ refer to the time values at which the CLK vector changes state. We define a term, phase, to refer to each of the stable states for the CLK vector. In addition, we define an array called the phase-waveform that is the size of the number of phases in one cycle defined by vf.

For example, FIG. 9 shows four periodic signals PHI_12, PHI_23, PHI_34, and PHI_41. These four signals create four phases: P1, P2, P3, and P4. The CLK array contents for PHI_12 would be PHI_12[1]=1, PHI_12[2]=1, PHI_12 [3]=0, and PHI_12[4]=0.

Phase-Waveform Property

The phase-waveform property states that the phase-waveform array can contain all the information needed to store any periodic waveform on any given node in the synchronous circuit.

The SC model states that only a change in the CLK array, and thus a change in phase, can cause a change in the PS array. By definition, the PS array determines the context for the network for a particular phase. Therefore, for that phase, storage of the quiescent state for any node is sufficient to characterize the behavior of that node. Since, for the evaluation to reach the quiescent state, it must be race-free, any intermediate values for the node are not relevant.

This property holds for all phases, so a data structure phase-waveform the size of the number of phases, phase-waveform, is sufficient to model any periodic waveform on any node in the SC network. This property also implies that the evaluation per phase can be rank-ordered, since only the quiescent value is relevant, and the network must reach quiescence.

Monotonicity Property

The monotonicity property states that since the underlying functions are monotonic and monotonicity holds over functional composition, monotonicity holds over a netlist of monotonic functions that form a combinational evaluation.

Each phase represents a combinational evaluation, so monotonicity holds over a phase and a phase-waveform. That is, if some internal nodes are at fixed values in a given phase due to only the CLK vector, these internal nodes will always be at that state for that particular phase for every cycle, and changes on the other inputs will not change the state of these internal nodes.

Hibernating Module Property

The hibernating module property states that given:

1. a combinational evaluation function with phase-waveforms at the inputs and the outputs, and
2. an event at the inputs that deviates from the value in the phase-waveform, the output phase-waveforms can be completely modeled after one cycle of evaluation.

At least one cycle is needed because the input change can affect the output at the present phase. However, an output change at any phase can change the output at other phases because of the events related to the clocks. Therefore, at least one cycle of evaluation is necessary. One cycle is sufficient because the function is combinational and after one cycle the phase-waveform is fully characterized given the present input states.

Clock Suppression

The objective of clock suppression is to model the actions of the clocks without simulating them at each cycle, thus reducing futile evaluations. Given the SC model described above, there are several alternatives for accomplishing this objective. As mentioned, the state-based approaches are inadequate because of the need for function tables for general combinational functions, and the interconnect-based approaches do not effectively address data-dependent periodicity, especially in relation to precharge circuits. Below we discuss three approaches to clock suppression-partitioned, dynamic, and static. We describe the static approach in detail.

Partitioned Clock Suppression

Partitioned clock suppression is based on the phase-waveform property described above. In this algorithm, the network is simulated independently for each phase. The strategy is to:

1. Duplicate the network for each phase.
2. Simplify each of the phase networks based on the CLK array values.
3. Simulate any phase using the appropriate phase network.
4. Copy node values between phases, or change all evaluation functions to use the same array of node values.

The main advantage of the partitioned clock suppression algorithm is the ability to simplify the network based on the context of the CLK array, and on the simplicity of the simulation algorithm. The suppression of the clocks is implicit in the simplified phase networks. Simulation between phases is performed by switching between the phase networks.

The main disadvantages are the complexity of the network compilation, and the potential increase in memory usage. In the worst case, the simulation data structures may have to handle a network that has size P*ND where P is the number of phases, and ND is the size of one copy of the network data structures (fanout, evaluation functions)

This increase in memory usage also may reduce CPU performance if the increased memory usage results in excessive cache misses.

Dynamic Clock Suppression

Dynamic clock suppression is based on the phase-waveform and hibernating module properties. In this algorithm, an observer is associated with each evaluation module. This observer stores the history for the nodes associated with the evaluation module. If the second cycle does not change the history generated by the first cycle, the evaluation function can be placed in a hibernating state. In the hibernating state, the evaluation function ignores event changes to the inputs that agree with the history already recorded, and presents the fanout modules with a phase-waveform that contains the calculated output values.

The major advantage of the dynamic clock suppression algorithm is that it catches all periodic activity, but evaluation of non-periodic evaluation functions is more expensive because of the overhead of the observer. Also, the memory needed is at least P*N, where P is the number of phases and N is the number of nodes in the network. The amount of memory needed is less than that needed in the partitioned clock suppression algorithm, but can still be significant.

Static Clock Suppression

Static Clock Suppression (SCS) is a compromise between the dynamic clock suppression algorithm and normal event-driven simulation. SCS conceptually mimics the dynamic clock suppression algorithm without the use of an observer. Instead of an observer, a static analysis is performed before simulation begins. In this analysis, evaluation functions whose activity is likely to be suppressed are marked as SCS modules. SCS modules are further analyzed to calculate pre-compiled responses to events at their inputs. The hibernating module property is heavily leveraged to calculate the response function, and the monotonicity property is used to minimize the size of the response function. During simulation, all other modules are evaluated using conventional event-driven simulation.

SCS removes the observer at the cost of losing the suppression of some data dependent periodic activity. As a result of the conventional event-driven simulation of non-SCS modules, the algorithm tolerates asynchronous activity for those modules. Thus, unlike the partitioned and dynamic clock suppression algorithms, a mixed synchronous and asynchronous circuit can be simulated correctly if the asynchronous portions of the circuit are non-SCS modules. For example, this feature can be quite useful when simulating CPU interactions with asynchronous main memory.

SCS Implementation

Presimulation

Presimulation is invoked at the start of simulation where only the clocks and constants are known. In the presimulation step, an experiment, described below, is performed that determines nodes chosen to be modeled by phase-waveforms. All other nodes will be simulated using conventional event-driven simulation.

Referring to FIG. 10, in the experiment, the presimulation algorithm initializes all internal nodes and primary inputs to X 60, and assigns constant nodes to their appropriate values 62. The next step 64 is to assign values for the CLK array, and cycle through the phases until the constants are fully propagated 66. The test for full propagation consists of checking that the IN state of a particular phase is identical to the IN state of the phase in the previous cycle. In the next step 68 after constant propagation, the history of all nodes is stored in a phase-waveform data structure 64 (See FIG. 13).

Next, all nodes in the network are partitioned into three categories, A, B, and C.

Category A includes nodes whose phase-waveforms contain only boolean values, i.e., nodes whose value is always known. These nodes are most likely to be in the clock buffering tree.

Category B includes nodes with no boolean states in the phase-waveform. For the static clock suppression algorithm, these nodes will be ignored, and their phase-waveform data structure memory is released. The normal event-driven algorithm will maintain their values, but it should be noted that by ignoring these nodes, some possible suppression of data-dependent periodic behavior will be missed.

Category C consists of nodes with some phases at boolean values, and some phases at an X value. For the boolean phases, SCS takes advantage of monotonicity to provide the output without evaluation. But, for the phases with X at the output, evaluation must determine the final value.

For example, FIG. 11 shows the result of the presimulation step on the simple shifter circuit presented in FIG. 7. After presimulation, the clock nodes PHI_3, PHI_1, and PHI_4 are category A nodes, and S_in, S1, S2, S3, S_out are category B nodes. In this example, there are no category C nodes, but if one of the outputs were precharged, that output would be in category C.

In addition, all multiple output evaluation functions are required to have all the output nodes in a phase-waveform if any one of the output nodes is a phase-waveform. This rule is instituted because it is likely that if one output of an evaluation function is periodic, the others will become periodic, based on data inputs. Also, the event analysis step is simplified by this rule.

Event Analysis

Given the node classifications above, an event analysis in advance of running the simulation is performed that determines the appropriate response to an event at the input. An event will be defined as a change in state for a category B node, and a deviation from the phase-waveform for a category C node. An event associated with a category A node is invalid because monotonicity requires the boolean values to stay constant. All evaluation modules that have category A or C nodes as inputs are classified as SCS modules.

Evaluation functions whose outputs are category A nodes require no action. These modules should never be evaluated in augmented simulation. Evaluation functions whose inputs are all category B nodes are non-SCS modules, so require no action because these modules will be evaluated using the normal event-driven simulator. All other SCS modules must be analyzed to calculate the appropriate response to an input event.

Using the hibernating module property, the most conservative response would schedule an evaluation for every phase for one cycle after the event has occurred. But, phase is a global network property, and an evaluation per phase may cause module evaluations that may not have occurred in the conventional event-driven simulator. In order to avoid extraneous evaluations, a module state analysis is performed.

In the module state analysis, all the module inputs, including the old state of the outputs if needed, are considered in a vector form, and a module signature is generated. The module signature assigns a unique value to every unique vector for the module inputs and outputs. Any change of the module signature between phases is recorded, and evaluation is scheduled only in the phases where the module state vector has changed. In addition, if the output state is boolean for any of the scheduled phases, that scheduled event is dropped.

For example, FIG. 12 shows a 4-phase design with two module-evaluation functions. The first module, W1, is driven by a category A node and produces a category B node on the output. The module signature for W1 is shown inside the module box. Given an event on the other inputs, the only interesting times to evaluate the module W1 are in phase 1 and phase 2. But, due to the monotonicity property (defined above), any evaluation in phase 1 will yield one at the output, so given any event to the input of W1, a response function of an evaluation in the next phase 2 is sufficient to correctly fill the W1 output phase-waveform. If the event arrived in phase 3 or 4, an immediate evaluation is also necessary.

The analysis of the second module, W2, proceeds in a similar fashion, but serves to illustrate a subtle point. Analyzing W2 independently is not sufficient to generate the correct module signature. The initial analysis of module W2 says that phase 2 and phase 3 have the same identification. But, since the module is fed by a category C node that has X values for both phase 2 and 3, an X→X event can occur. That is, the two X's may have different values for the two phases. To address this problem, the module state-analysis algorithm performs a dependency check which determines if the two X's can hold different values. The dependency check is performed by backtracking through the driving modules of the category C nodes. If the category C node is driven by a module where the module signatures for the phases in question are equal, the two X's must be the same, and the module signature is correct. If the driving module can generate different values for the X's, the module signature is updated, and extra evaluations are needed. For example, the W1 module was driven by a category A node, so the module signature for W2 was correct. In any case, the output is fixed at both phase 2 and 3, so the module signature at those two phases is not relevant.

The SCS algorithm expects the circuit to have synchronous behavior, but performs all of its operations on the network netlist. Since the backtracking algorithm works on the netlist, feedback can be a problem. The backtracking algorithm detects feedback, and changes category C nodes to category B nodes until the feedback is broken from a dependency-check point of view.

The first two parts of the SCS algorithm, presimulation and event analysis, are static, taking place prior to actual simulation. For the third part of the algorithm, the simulation kernel is modified to use the information derived in the presimulation and event analysis steps described above.

Model Code Augmentation

The SCS algorithm augments the model code produced by the original COSMOS implementation. In particular it creates another data structure, the module evaluation array. Referring to FIG. 13, module evaluation array 60 has an evaluation entry 62a–62c for each module to be simulated. (There is an entry corresponding to every module instance 42 in module array 40 of FIG. 6.) Each evaluation entry 62 is either 0 or a pointer to a phase signature array 64. An evaluation entry equal to zero corresponds to a category B node and implies that the simulator kernel must use its normal event-driven algorithm to evaluate the node. For non-zero evaluation entries the kernel is dealing with a category C node and can use the pointed to phase signature array 64 to determine which phase of the clock cycle require actual evaluation and which are constant. Phase signature array 64 has one entry 66a–66c for each phase.

Referring to FIG. 14, variable elements 34–35 in node array elements 32 are modified to include array 54 of values for clock suppression.

As an example, FIG. 15 is the output from the first two phases of the SCS algorithm for a simple AND gate with inputs A and B and output OUT.

Augmented Simulation

Once the response functions have been calculated the network is ready to be simulated. Augmented simulation, as the name implies, augments the conventional event-driven simulator to properly process the SCS modules. Referring to FIG. 16, a high-level view of the conventional COSMOS unit delay algorithm is:

1. Get next event (state change on a node) 70.
2. For all fanout 72
   (a) evaluate module 74
   (b) check output nodes for change 76
   (c) update output nodes of module 78
   (d) schedule fanout if output changed 80.
3. Go to 1 or, alternately:

1. Dequeue event list.
2. If empty, exit.
3. Evaluate module.
4. Check output(s) for change.
5. Update output(s) with new state.
6. Schedule fanout module if changed.
7. Go to 1.

In order to implement Static Clock Suppression, the simulator is augmented with respect to the previous loop in the following four places in kernel simulation procedure CLK_STP (see the attached source code appendix A, incorporated by reference):

1. Evaluate Module: The SCS simulation algorithm has to update the module inputs from the phase-waveform data structure before evaluation. (By assigning the appropriate mod_info data to the clk_mod variable.)

2. Check Outputs: The SCS algorithm has to check the phase-waveform data structures for change from expected behavior (a change with respect to the "phase waveform" is also a valid change). This is done by comparing the old and new values of the variables.

3. Update Outputs: The SCS algorithm has to update the phase-waveform data structures.

4. Schedule Fanout: The SCS algorithm has to schedule across phases as well as within a phase.

As is demonstrated below, all four changes can be invoked conditionally, based on a SCS module flag, so that the only penalty for non-SCS simulation is a test of the SCS module flag.

FIG. 17 describes the main simulation loop of simulation kernel 25 for executable simulator 28 (FIG. 2). Before the loop begins all data structures and control variables are initialized 100. The circuit is assumed to be stable at the start of simulation. The loop first checks that the circuit is still stable 102, and, if not prints a warning 110 and terminates 112 the simulation. (In some versions of COSMOS the kernel may continue to simulate the circuit, setting all values to X). If the test for stability 102 passes, then a check is made to determine whether a user-specified limit (of passes through the simulator loop) has been reached 104. If the limit has been reached then the simulation is terminated 112, otherwise a single step, corresponding to one clock cycle, STEP 106, through the circuit is performed. After STEP 106 is performed a counter is incremented 108 and the test for circuit stability 102 is performed again.

Referring to FIG. 18, STEP 106, consists of a three pass process. In summary, Pass I 114 calls the update procedure and schedules the events, Pass II 116 clears old event lists and checks for more events, and Pass III 118 swaps the old and new lists and updates old states.

A more detailed description of the processing in each pass is as follows:

Pass I 114:

For each module M in old event list (ordered by rank)
call update procedure for module M;
schedule the events:
for each output variable O of module M
such that old state !=new state
put output variable O in update list
put zero delay fanout in old event list
put unit delay fanout in new event list.

Pass II 116:

clear old flags and make old event list empty.

check if more events.

Pass III 118:

old lists←new lists for each state variable V in update list old state←new state clear fanout flag for V update list←empty The changes required to simulation kernel 25 (FIG. 2) in order to implement the Static Clock Suppression algorithm are limited to Pass I 114 of STEP 106.

FIG. 19 depicts the processing required in Pass I 114 of STEP 106. In order to loop over all ranks, a counter variable "rank" is initialized to zero 120. Step 122 determines whether or not all ranks have been considered. If not, then the rank count is incremented 124 and the old event list for this rank is processed 126–132. Step 126 gets the next element of this rank in the old event list. If there are no more elements, step 128, then next rank is processed 122–124. If another element is found then Update 130 and Schedule 132 are performed, after which control flow returns to step 126.

FIG. 20 depicts the processing required in Pass I 114 of STEP 106 when Static Clock Suppression is implemented. Note that, at this level, the only change is after Increment Rank 124, where test "Clock Suppression?" 134, is made to determine if clock suppression is in effect. If not then the control flow proceeds as described above, otherwise the inputs are updated to their proper states 136 after which processing proceeds as described above at step 126. The test "Clock Suppression?" 134 is implemented as a simple check of a boolean value in procedure "clk_step" (which implements the Static Clock Suppression version of "STEP"). Updating the inputs to their proper state 136 is performed by procedure "clk_sup_inp_setup". Partial C code for steps 134 and 136 is simply:

```
if (clk_mod !=0) clk_sup_inp_setup( . . . )
```

Other changes to Pass I 114 for Static Clock Suppression take place in Schedule 132. FIG. 21 depicts the Schedule 132 step in the non-SCS version of COSMOS.

Referring to FIG. 21, first the next output variable is obtained 138. If there are no more output variables then flow continues at step 126 (FIGS. 19, 20). For each output variable a test 140 is made to determine if its old state is equal to its new state. If so then the next output variable is obtained 138, otherwise the output variable is put on the update list 142. If the zero-delay fanout list for this output variable has not been traversed 144, then the zero-delay fanouts are put on the old event list 146. Similarly, if the unit-delay fanout list for this output variable has not been traversed 148, then put the unit delay fanouts on the new event list 150.

Referring to FIG. 22, depicting the SCS version of Schedule 132, after the old and new states are compared 140, if the old state is equal to the new state, then, if clock suppression is in effect 152, then check whether the output differs from the stored output 154. If not then get the next output variable 138, otherwise the output variable is put on the update list 142.

The SCS version of Schedule 132 requires two more changes. These are made in the steps which put the zero and unit delay fanouts on the respective event lists 146, 150. FIGS. 23 and 24 depict, in greater detail, the processes of putting the fanouts on the event lists in the non-SCS version. Referring to FIG. 23, step 150 gets the next unit delay fanout module. If there are no more such modules then processing continues with step 138 which gets the next output variable, otherwise, if the module is on the new event list 162, then the next module is obtained 160. If the module is not on the event list then it is put on the list 164 and the next module is obtained 160. Step 146, referring to FIG. 24, processes zero delay modules in a similar fashion. It gets the next zero-delay fanout module 166, checks whether it is on the old event list 168, and, if not, puts it on that event list 170. If it is on the old event list 168, then the process loops back to get the next zero-delay fanout module 166. If there are no more zero-delay fanout modules then processing continues by checking the unit-delay fanout list 148 in schedule 132.

FIGS. 25 and 26 depict the SCS version of the steps which put the delay fanouts on the event lists 146, 150.

Referring to FIG. 25, the step to put the unit-delay fanouts on the new event list 150 is modified such that after the next unit-delay fanout module is obtained 160 a check is made to determine whether this node is clock suppressed 172. If not then processing continues with step 162 as described above for the non-SCS version, otherwise, schedule the clock events for future phases for this module 173, and then if the output is already known 174 then the module is not added to the new event list and the next module, if there is one, is obtained 160.

Similarly, referring to FIG. 26, adding the zero-delay fanouts to the old event list 146 is modified such that for each zero-delay fanout module, if "clock suppressed?" 176 then schedule the clock events for future phases for this module 177, and then, if the output is known 178, then that module is not added to the old event list 170, otherwise processing continues as in the non-SCS version (FIG. 24).

Since the conventional network simulator is used in the SCS algorithm, multiple evaluation within a phase is possible. Multiple evaluation of sequential modules within a phase must be handled carefully in augmented simulation. If a module such as M1 in FIG. 7 is evaluated multiple times, the first evaluation must use the old state from the previous phase as input, and all later evaluations must use the old state from the present phase. In our algorithm, we use some unit delay step information gathered in the presimulation step to predict in which unit-delay step the module is evaluated due to the clocks. After this unit-delay step, the present phase value is used as the old state for evaluation.

In summary, referring to FIG. 27, SCS consists of the steps of:

preanalysis 180 of the simulation code and storing 182 phase waveforms representing the values occurring at a node in successive phases;

categorizing modules 184, based on the results of preanalysis 180, into a category for which an event-based evaluation is to be performed in each phase of the simulation, and a category for which no event-based evaluation need be performed in at least one but not all phases, then determining appropriate responses 186, for each phase of a second category module, to an event occurring with respect to the module, and then including 188 a data structure with the simulation code with entries for each module of the code for controlling the phases in which simulation code for evaluation of the module is not executed.

Example

A complete simulation of the simple shifter example presented in FIG. 7 will illustrate the operation and power of the static clock suppression algorithm. FIG. 11 shows the phase-waveforms for the network after presimulation. The table that follows shows the phase by phase operation of the circuit, given a change in the S_in primary input signal. The right side of the table contains the information on module evaluation (Ev) and scheduling (S34). For example, S34 means that the module is scheduled to be evaluated in the next phases 3 and 4. In this example, ten evaluations are sufficient to completely simulate the response to the change in the S_in primary input signal. For normal event-driven simulation, the number of evaluations would be 6C+4, where C is the number of cycles of simulation.

| C.P | Sin | S1 | S2 | S3 | Sout | M1 | M2 | M3 | INV |
|---|---|---|---|---|---|---|---|---|---|
| 1.1 | X→0 | X | X | X | X | Ev<br>S34 | | | |
| 1.2 | 0 | X | X | X | X | | | | |
| 1.3 | 0 | X→1 | X | X | X | Ev | Ev<br>S12 | | |
| 1.4 | 0 | 1 | X | X | X | Ev | | | |
| 2.1 | 0 | 1 | X→0 | X | X | | Ev | Ev<br>S41 | |
| 2.2 | 0 | 1 | 0 | X | X | | Ev | | |
| 2.3 | 0 | 1 | 0 | X | X | | | | |
| 2.4 | 0 | 1 | 0 | X→1 | X→0 | | | Ev | Ev |
| 3.1 | 0 | 1 | 0 | 0 | 0 | | | Ev | |
| 3.2 | 0 | 1 | 0 | 0 | 0 | | | | |
| 3.3 | 0 | 1 | 0 | 0 | 0 | | | | |
| 3.4 | 0 | 1 | 0 | 0 | 0 | | | | |

SCS Results

The SCS algorithm, described herein, has been implemented in the COSMOS simulator. Since the SCS algorithm is event-directed at the phase-waveform level, care must be taken in the presentation of the results. For example, one could claim almost any speedup for the shifter test presented above, but the speedup would not be applicable in a realistic simulation environment.

Optimistic Model Simulation

The results obtained using SCS algorithm can be improved by reducing the complexity of the evaluation functions generated by ANAMOS. A large part of the complexity of these evaluation functions is generated in an attempt to model X-state and switch-level effects, such as charge sharing, correctly.

From a digital circuit design point of view, the X-state is important for two reasons:

1. Initialization: The X-state can be used to verify that the network can be placed in a stable state after powerup.

2. Invalid States: The X-state can indicate invalid states. This generally occurs due to unintended charge sharing or resistive conflict.

The initialization simulation generally has a short duration (1000–5000 cycles), but invalid states can occur any time during logic simulation. The duration for logic simulations can be quite large, so it would be useful to accelerate the simulation process to catch logical errors.

In order to accelerate logic simulation, a version of ANAMOS, called CURRIER, has been created which generates 2-state models that correctly model the 3-state behavior for resistive conflict, but do not model charge sharing.

CURRIER generates this model by using only 2-valued algebra for the indefinite and potential functions, and by stopping at the last resistive strength analysis portion of the ANAMOS algorithm. With this model, an X is generated when resistive conflict occurs, but the fanout modules convert the X to one. A fourth state, "star", the (0, 0) state, is generated when charge sharing occurs when a node retains its old state. (Recall that the ternary system used only the three states (0, 1), (1, 0), and (1, 1) for 0, 1, and X respectively.) The "star" state is modified in simulation kernel 25 to always assign the old state immediately after the module evaluation phase of the simulator. If charge sharing is used in the correct operation of a circuit, this model would give incorrect results. Fortunately, charge sharing is generally considered to be an undesired side effect, and its occurrence is considered to be an invalid condition.

Recall that the process of determining the evaluation functions consists of looking at an output node, and, for the highest level resistive strength, determining all paths to power and ground for this node. This provides a boolean evaluation function for that particular resistive strength. The same operation is then performed for the next (lower) resistive strength, in order to derive a boolean evaluation function that deals with all the boolean combinations that were left over, i.e., were not dealt with in the last resistive strength considered. This process continues for all resistive strengths. In the 2-state, non-capacitive model, the process stops before it gets to the capacitive strength, therefore there may be some combinations of inputs that are not accounted for. In these cases the value "star" is used to inform the simulation kernel that the system did not determine the values these nodes might have.

Whenever simulation kernel 25 (FIG. 2) encounters a "star" node, it makes the (optimistic) assumption that there is no charge sharing and it retains the old state that was on the node from the previous time, i.e., if a "star" is produced, then the simulator overwrites the "star" with the old state and the continues processing.

At first glance, it might seem that the SCS algorithm would fail on these 2-state models because of the heavy use of monotonicity related to the X state. But, observe that in the 3-state simulation, after initialization, the network is being simulated under 2-state conditions, which means that the 3-state SCS analysis must be sufficient for the 2-state simulation. Using this observation, the 2-state simulation strategy is (referring to FIG. 28):

1. Generate a 3-state model 22 using ANAMOS 21.

2. Generate the response functions 228 for the 3-state model using the SCS presimulation and event analysis algorithms 226.

3. Save the response functions 228 in a file 224.

4. Generate a 2-state model 222 using CURRIER 221.

5. Load the response functions 228 from the file 224 during presimulation 23.

Note that the response functions generated by the SCS algorithm are valid whether or not they are used with a 2 or 3-state model.

Recall that the response function determines at which phases the logic to which it corresponds is to be evaluated. In the 2-state model the actual evaluation function is reduced in complexity, but the response function remains the same.

The overall effect of this 2-state simulation is to provide faster simulation at the expense of catching invalid charge sharing conditions. Initialization can be performed with the 3-state model because the duration of the simulation is relatively short. Resistive conflict can still be caught after module evaluation because a local X is generated by the CURRIER models.

The performance of the optimistic model is substantially improved especially for a circuit that has a number of modules that contain large evaluation functions due to charge sharing considerations.

Appendix A includes material which is subject to copyright protection. Applicant believes that the copyright owners have no objection to facsimile reproduction by anyone of the appendix, as it appears in the Patent and Trademark Office patent file and records, but otherwise reserves all copyright rights whatsoever.

Other embodiments are within the following claims.

Applicants: Rahul Razdan et al.
For : SIMULATION OF CIRCUITS

APPENDIX A , 63 Pages

"Express Mail" mailing label number RB889296468

Date of Deposit 2-18-93

I hereby certify that this paper or fee is being deposited with the United States Postal Service "Express Mail Post Office to Addressee" service under 37 CFR 1.10 on the date indicated above and is addressed to the Commissioner of Patents and Trademarks, Washington, D.C. 20231

LGCOUT

```
/*****************      *****************************************************
 *                                                                          *
 *                                                                          *
 *     Copyright (C) 1986,1987,1988 Carnegie Mellon University              *
 *                                                                          *
 *                                                                          *
 ****************************************************************************/

/* $Header: lgccout.h,v 0.3 88/06/05 22:04:51 cosmos Exp $ */
/* Defines data structures for the code generated by LGCC. */
/* Short names are used to help keep LGCC's output small.  */
/* Modified to make suitable for C/Paris, bryant 2/88      */

#define END     (-1)

typedef unsigned long mInst_flags; /* whatever Kyeongsoon needs...      */

typedef int mInst_no;            /* index into array of module instances */

typedef struct foStruct {        /* fanout structure for >=1 variables */
        bool traversed;          /* flag: true iff list has been traversed */
        mInst_no *mods_affected;/* list of module instances affected */
    } foStruct, *fanout_ptr;

typedef struct var {    /* simulation variable  */
        machine_word old;        /* old value    */
        machine_word new;        /* new value    */
        fanout_ptr fno1;         /* unit-delay fanout    */
        fanout_ptr fno0;         /* zero-delay fanout */
        machine_word *clk_sup;   /* array of values for clk suppression */
        finfptr finfp;           /* information for fault simulation */
    } var_t;

typedef var_t *conn;             /* connection: a pointer to a variable  */
typedef conn *conns_ptr;         /* pointer to (array of) connections    */

typedef struct mInst {  /* module instance:                              */
        int *numTemps;           /* number of temporary variables needed */
        int (*mod)();            /* module definition procedure          */
        conns_ptr results;       /* array of state variables             */
        conns_ptr inputs;        /* array of input variables             */
        conns_ptr zinputs;       /* array of 0-delay input variables     */
        machine_word rank;       /* rank of module instance              */
        string name;             /* name, for debugging                  */
    } mInst;

typedef struct  node {  /* node (simulation kernel cares not about vars) */
        var_t   H;               /* definitely-high variable             */
        var_t   L;               /* definitely-low variable              */
        mInst_no fanin;          /* index of controlling instance, or -1 */
        string  name;            /* name of node                         */
    } node_t;

typedef node_t *node_no;         /* pointer into array of nodes          */
typedef node_no *nodevec;        /* pointer to array of indices into...  */

typedef struct stVector {     /* vector of nodes:                        */
        nodevec vecNodes;        /* nodes in the vector                  */
        string vecName;          /* name of the vector                   */
    } stVector;

typedef machine_word anon;       /* type of anonymous variables          */

#ifdef  LGCCOUT
 /* global variables holding constant values */
extern machine_word Const_0, Const_1;
```

APPENDIX A

```
 /* global pointer to update procedure temporary variable area */
extern machine_word *updTempArea;
 /* Dummy integer for foreign lgc leaves */
extern int t_t_;

 /* macros for accessing network variables */
#define NO(x)               (*(o+x))->new
#define OO(x)               (*(o+x))->old
#define NI(x)               (*(i+x))->new
#define OI(x)               (*(i+x))->old
#define NZ(x)               (*(z+x))->new
#define NN(x,o,hl)          (*(i+o+2*x+hl))->new
#define ON(x,o,hl)          (*(i+o+2*x+hl))->old

 /* macros for and-function and or-function */
#ifdef SYMSIM
#define AND3(d, x, y) d = and(x, y)
#define OR3(d, x, y)  d = or(x, y)
#define AND2(d, s) d = and(d, s)
#define OR2(d, s)  d = or(d, s)
#define MOV(d, s)    d = s
#define TMP(i)    (i==1?a1:i==2?a2:i==3?a3:i==4?a4:i==5?a5:updTempArea[i])
#define LOC_DECL register anon a1, a2, a3, a4, a5;
static anon a1,a2,a3,a4,a5;
extern machine_word and(), or();

#else /* SYMSIM */

#ifdef CM
#define AND3(d,x,y) A3(d,x,y)
#define OR3(d,x,y)  O3(d,x,y)
#define AND2(d,s) A2(d,s)
#define OR2(d,s)  O2(d,s)
#define MOV(d,s)    CM_move(d,s,1)
#define TMP(i)      temp_base + i
#define LOC_DECL    /* */
#define a1 *(a+1)
#define a2 *(a+2)
#define a3 *(a+3)
#define a4 *(a+4)
#define a5 *(a+5)

VOID A3(), A2(), O3(), O2();
/* starting location of temporary storage area */
extern int temp_base;

#else /* CM */
#define AND3(d, x, y) d = (x & y)
#define OR3(d, x, y)  d = (x | y)
#define AND2(d, s) d &= s
#define OR2(d, s)  d |= s
#define MOV(d, s)    d = s
#define prim_not(x) ~x
#define TMP(i)  (i==1?a1:i==2?a2:i==3?a3:i==4?a4:i==5?a5:updTempArea[i])
#define LOC_DECL register anon a1, a2, a3, a4, a5;
static anon a1,a2,a3,a4,a5;
#endif /* CM */
#endif /* SYMSIM */

 /* macros for initializing data structures */
#define MI_I(t,mod,rslt,inpt,zinpt,rank,nam) {&t,mod,rslt,inpt,zinpt,rank,nam}
#define NODE_COUNT(n)     machine_word num_nodes= n;        \
                          var_t *updl[n*2];
#define V_I(fanout1,fanout2) {1,1,fanout1,fanout2,NULL,NULL}
#define MOD_COUNT(n)      machine_word num_mods= n;         \
                          bool evlb1[n],evlb2[n];           \
```

```
                            mInst_no evl1[n],evl2[n];        \
                            cktptr cktevl1[n],cktevl2[n];
#define RANK_COUNT(n)       machine_word num_ranks= n;       \
                            machine_word evli1[n],evli2[n];

#else   /* LGCCOUT */

typedef struct vector_s
        {                      /* vector of nodes, including optimized nodes */
          buffer buf;          /* buffer containing pointers to nodes */
          bool   *inv;         /* if inv[i] = TRUE, invert node[i]    */
          bool   dynamic;      /* TRUE if dynamic vector, defined at run time */
        } VECTOR_S;

 /* global network declaractions for simulation kernel */
extern mInst mods[];              /* network module instances     */
extern machine_word num_mods;     /* number of module instances   */
#ifndef ALPHA
 extern foStruct needInit;        /* modules to be initialized */
#endif
extern node_t nd[];               /* network nodes                */
#define Nodes   nd
extern machine_word num_nodes;    /* number of nodes              */
extern stVector st_vecs[];        /* network static vectors       */
extern machine_word num_st_vecs;/* number of static vectors       */
extern bool evlb1[], evlb2[];     /* flags for event lists        */
extern mInst_no evl1[], evl2[]; /* event lists                    */
extern machine_word rank_origins[], evli1[], evli2[];
extern machine_word num_ranks;
extern var_t *updl[];             /* update list */
extern cktptr cktevl1[], cktevl2[];
extern bool   *vect_inv;          /* stores inversion flags for vectors */

#endif  /* LGCCOUT */

/* Regular expression definitions. This doesn't really belong here   *
 * but all the modules that need this also include this .h file.     */

#ifdef hpux
extern string regcmp();
static char *em;                              /* Regular expression results */
#define RE_EXEC(s)  (regex(em,(s))!=0)
#define RE_COMP(s)  ((em= regcmp(s,(char*)0))==0)
#define RE_DONE()  (rr_free(em))
#else
extern string re_comp();                  /* Regular expression handler */
#define RE_EXEC(s)  (re_exec(s))
#define RE_COMP(s)  (re_comp(s))
#define RE_DONE()  /**/
endif

 * Recognize "%re". Arg must be type string or *char. */
 define RE_RECOGNIZE(s)  ((s[0] == '%') &&                        \
                          (s[1] == 'r' || s[1] == 'R') &&          \
                          (s[2] == 'e' || s[2] == 'E'))
```

SYSUP

```
/*****************************************************************
*                                                                *
*     Copyright (C) 1987, Carnegie-Mellon University             *
*                                                                *
*            Written by Kyeongseon Cho, 1987                     *
*                                                                *
*            Modified by David Gross, 31-Oct-1991                *
*               Moved regular expression defs to lgccout.h       *
*               and made fre renoginition case insensitive       *
*****************************************************************/

/* User interface for the commands 'clock', 'watch' and 'unwatch' */
/*     private functions : VOID insertWatchPtr()                  */
/*                         VOID watchAux1()                       */
/*                         VOID watchAux2()                       */
/*                         VOID unwatchAux1()                     */
/*                         VOID unwatchAux2()                     */
/*     public  functions : bool doclock()                         */
/*                         bool dowatch()                         */
/*                         bool dounwatch()                       */

#include <stdio.h>
#ifdef hpux
#include <string.h>
#else
#include <strings.h>
#endif
#include "types.h"
#include "buf.h"
#include "rec.h"
#include "pattern.h"
#include "strmgr.h"
#include "fault.h"
#undef LGCCOUT
#ifdef CM
#include "cm-abbrev.h"
#endif /* CM */
#include "lgccout.h"
#include "format.h"
#include "kernel.h"
#include "manager.h"
#include "output.h"
#include "symtable.h"

extern machine word *updTempArea;
extern char str_buf[];                          /* Defined in output.c.  */
extern string clock_str;                        /* Defined in main.c.    */
extern buffer watch_buf;                        /* Defined in manager.c. */
extern int total_phasenum;                      /* Defined in kernel.c.  */
extern int phase_count;                         /* Define  in kernel.c   */
extern bool clk_sup_stabilize;                  /* Define  in kernel.c   */
extern machine word Const_1, Const_0;           /* Defined in main.c.    */
extern int width_vec[];                         /* Defined in symmar.c.  */
extern node_t *index_vec[];                     /* Defined in symmar.c.  */
extern int binary_read;                         /* defined in cosmai.c   */

/* clock suppression variables */
#define FEED_DEPTH  10
#define FEEDBACK_ARRAY_SIZE 10000
extern bool clk_sup_flag;
extern bool stop_collection;
extern int  *mod_active_list,*mod_info;
extern unsigned int *clk_schedule;          /* Define  in kernel.c   */
static int  number_clock_node = 0;          /* number of nodes set by clock */
static int  feedback_mod[FEEDBACK_ARRAY_SIZE],feedback_mod_cnt = 0;
static int  feedback_depth=0;

#ifdef FAULT
extern buffer faultelem_buf;                    /* Defined in manager.c. */
#endif /* FAULT */
#ifdef CM
extern CM_cubeaddr_t defaultProcessor;             /* Defined in main.c */
extern CM_cubeaddr_t currentProcessor;             /* Defined in main.c */
extern CM_cubeaddr_t everyProcessor;               /* Defined in main.c */
#endif /* CM */
#define K   3
#define MAX_PHASE 20

/*************************************************************************/

/* dynamic solver */

#include "dynamic.h"

extern DYNAMIC_S    *dyn;          /* pointer to dynamic solver top structure */
extern TOPOLOGY_S   *top;          /* Defined in cosmain.c    */

/*************************************************************************/

bool doclock(s)
string s;
{
   bool set_flag        = FALSE;
   bool freeze_flag     = FALSE;
   bool watch_flag      = FALSE;
   bool ver_flag        = FALSE;
   bool observe_flag = FALSE;
   string argname;
   register int nargs;
   register bool inv_flag = FALSE;

   /* Remove any previously defined clocking scheme. */
   delete_clock(&set_flag, &freeze_flag, &watch_flag,
                &ver_flag, &observe_flag);
   if (set_flag)       output("WARNING: Previous sets or clocks cleared.\n");
   if (freeze_flag)    output("WARNING: Previous freezes cleared.\n");
   if (watch_flag)     output("WARNING: Previous watches cleared.\n");
   if (ver_flag)       output("WARNING: Previous verifies cleared.\n");
   if (observe_flag)   output("WARNING: Previous observes cleared.\n");

   /* Save the string defining clock for dump command. */
   skipspace(&s);
   if (*s == NULLSTR) clock_str = NULL;
   else clock_str = strsave(s);

   /* Get the first argument. */
   argname = strpush(gettoken(&s, ""));

   /* Initialize counter which is the number of arguments. */
   nargs = 0;

   while (*argname != NULLSTR) {
      register bool isNotConstant = FALSE;
      register node_t *nodePtr;
      register pat_ptr patPtr;
      pat_rec pat;

      /* Get the clock name and check syntax. */
      string clockname = strpush(gettoken(&argname, ":"));
      if (!check_char(&argname, ':')) {
         sprintf(str_out, "Invalid syntax: %s\nClocks cleared\n", clockname);
         error(str_out);
         delete_clock(&set_flag, &freeze_flag, &watch_flag,
```

```
                 &ver_flag, &observe_flag);
        return(FALSE);
    }

    /* Clock name must be a node or vector with length 1. */
    if ((nodePtr = find_node(clockname)) == NULL)
    {
        register bufptr   bufferPtr;
        register VECTOR_S *vectorPtr;
        if (vectorPtr = find_vec(clockname))
        {
            bufferPtr = &(vectorPtr->buf);
            if (width_vec(bufferPtr) != 1)
            {
                sprintf(str_buf, "Invalid vector: %s\nClocks cleared\n",
                        clockname);
                error(str_buf);
                delete_clock(&set_flag, &freeze_flag, &watch_flag,
                             &ver_flag, &observe_flag);
                return(FALSE);
            }
            nodePtr = index_vec(bufferPtr, 0);
            inv_flag = *(vectorPtr->inv);
              printf ("Warning: node %s not found, optimized away or aliased.\n",
               clockname);
              if (inv_flag)
               printf ("         not %s is used instead. \n", nodePtr->name);
              else
               printf ("         %s is used instead. \n", nodePtr->name);
              printf ("        Be careful as fanouts may be different.\n");
        }
        else
        {
            sprintf(str_buf, "Not found: %s\nClocks cleared\n", clockname);
            error(str_buf);
            delete_clock(&set_flag, &freeze_flag, &watch_flag,
                         &ver_flag, &observe_flag);
            return(FALSE);
        }
    }

    /* The clock value may be a predefined constant. */
    if ((patPtr = find_const(argname)) == NULL) {
        if (!parse_new_pat(&pat, argname, BINARY)) {
            sprintf(str_buf, "Invalid value: %s\nClocks cleared\n", argname);
            error(str_buf);
            delete_clock(&set_flag, &freeze_flag, &watch_flag,
                         &ver_flag, &observe_flag);
            return(FALSE);
        }
        patPtr = &pat;
        isNotConstant = TRUE;
    }

    /* The sequences must be the same (nonzero) length. */
    if (++nargs == 1) { total_phasenum = N_WIDTH_PAT(patPtr); }
    else {
        if (total_phasenum != N_WIDTH_PAT(patPtr)) {
            sprintf(str_buf, "Unequal length clock: %s\nClocks cleared\n",
                    argname);
            error(str_buf);
            delete_clock(&set_flag, &freeze_flag, &watch_flag,
                         &ver_flag, &observe_flag);
            return(FALSE);
        }
    }

    /* Create a new set_clk_rec                         */
    /* and insert it into set_clk_buf for each sequence. */
    {
        register conn vhp = &(nodePtr->H);
        register conn vlp = &(nodePtr->L);
        register int patpos = total_phasenum - 1;
        register int i;

        for (i = 1; i <= total_phasenum; i++, patpos--) {
            register set_clk_rec_ptr ptr = new_set_clk_rec_ptr();
            machine_word high, low;

            ptr->nodePtr = nodePtr;
            ptr->[illegible] = nodePtr->[illegible];
            ptr->vhp     = vhp;
            ptr->vlp     = vlp;
            ptr->keep    = TRUE;
            if (inv_flag)
                pat2hilo(patPtr, patpos, &low, &high);
            else
                pat2hilo(patPtr, patpos, &high, &low);
#ifdef FAULT
            high &= Const_1; low &= Const_1;
#endif /* FAULT */
            ptr->high = high;
            ptr->low  = low;
#ifdef CM
            /* Applies to all processors */
            ptr->processor = everyProcessor;
#endif /* CM */
            insert_set_clk(ptr, 1);
        }
    }

    /* If argument not constant, free pattern. */
    if (isNotConstant) free_pat(patPtr);

    /* Get the next argument. */
    argname = strpush(gettoken(&s, " "));
  }

  return(TRUE);
}

/*****************************************************************************/

static int num_matched;
static int format, n_phase;
static bool all_phase;
static string name;
#ifdef FAULT
static int circuit, module;
static string circuitname;
#endif /* FAULT */

/* Insert watch_rec into watch_buf. */
static void insertWatchPtr(type, nodePtr, vectorPtr)
register int type;
register node_t *nodePtr;
register VECTOR_S *vectorPtr;
{
   if (all_phase) {
      register int i;
      for (i = 1; i <= total_phasenum; i++) {
```

```
            register watch_rec_ptr ptr = new_watch_rec_ptr();
            ptr->type       = type;
            ptr->format     = format;
            ptr->nodePtr    = nodePtr;
            ptr->vectorPtr  = vectorPtr;
            ptr->name       = strsave(name);
#ifdef FAULT
            ptr->circuit    = circuit;
            ptr->module     = module;
#endif /* FAULT */
#ifdef CM
            ptr->processor = currentProcessor;
#endif /* CM */
            insert_watch(ptr, i);
        }
    }
    else { /* not all phase */
        register watch_rec_ptr ptr = new_watch_rec_ptr();
        ptr->type       = type;
        ptr->format     = format;
        ptr->nodePtr    = nodePtr;
        ptr->vectorPtr  = vectorPtr;
        ptr->name       = strsave(name);
#ifdef FAULT
        ptr->circuit    = circuit;
        ptr->module     = module;
#endif /* FAULT */
#ifdef CM
        ptr->processor = currentProcessor;
#endif /* CM */
        insert_watch(ptr, n_phase);
    }
}

/****************************************************************************/

/* Insert watch_rec into watch_buf for nodes matching regular expression. */
static VOID watchAux1(key, dat)
pointer key;
pointer dat;
{
    string nodeName = (string) key;
    node_t *nodePtr = (node_t*) dat;

    if (RE_EXEC(nodeName)) {
        num_matched++;
        name = nodeName;
        strmark();
#ifdef FAULT
        if (circuit != 0) {
            register string tempname;
            if (module != ALL && isNotFanin(nodePtr, module)) return;
            tempname = strtemp(name);
            tempname = strappend("!");
            tempname = strappend(circuitname);
            if (module != ALL) tempname = strappend((mods + module)->name);
            name = tempname;
        }
#endif /* FAULT */
        insertWatchPtr(NODE, nodePtr, NULL);
        strpop();
    }
}

/****************************************************************************/

/* Insert watch_rec into watch buf for vectors matching regular expression. */
static VOID watchAux2(key, dat)
pointer key;
pointer dat;
{
    string vectName  = (string) key;
    VECTOR_S *vectorPtr = (VECTOR_S *) dat;
    bufptr bufferPtr = &(vectorPtr->buf);

    if (RE_EXEC(vectName)) {
        num_matched++;
        name = vectName;
        strmark();
#ifdef FAULT
        if (circuit != 0) {
            register string tempname;
            register node_t **npp;
            FOR_BUF(bufferPtr, node_t*, npp)
                if (module != ALL && isNotFanin(*npp, module)) return;
            tempname = strtemp(name);
            tempname = strappend("!");
            tempname = strappend(circuitname);
            if (module != ALL) tempname = strappend((mods + module)->name);
            name = tempname;
        }
#endif /* FAULT */
        insertWatchPtr(VECTOR, NULL, vectorPtr);
        strpop();
    }
}

/****************************************************************************/

bool dowatch(s)
string s;
{
    string argname;
    bool doregex;

    /* Get the first argument. */
    argname = strpush(gettoken(s, ""));

    /* Initialize format, phase number, and flag for regular expression. */
    format      = BINARY;
    n_phase     = 1;
    all_phase = FALSE;
    doregex     = FALSE;

    while (*argname != NULLSTR) {
        register bool new_all_phase;
        register int new_n_phase, new_format;

        if      ((new_format     = getFormat(argname))  format = new_format;
        else if ((new_all_phase = ISALLPHASE(argname)) all_phase = new_all_phase;
        else if ((new_n_phase    = getPhaseNumber(argname)) {
            if (isExceeding(new_n_phase)) return(FALSE);
            n_phase = new_n_phase;
            all_phase = FALSE;
        }
        else if (RE_RECOGNIZE(argname)) doregex = TRUE;
        else {
            register node_t     *nodePtr;
            register VECTOR_S *vectorPtr;
            register bufptr     bufferPtr;
#ifdef FAULT
            int temp_circuit = 0;
```

```
            int temp_module = ALL;
            if (!getCircuitModule(&argname, &temp_circuit, &temp_module))
               return(FALSE);
            circuit = temp_circuit;
            module  = temp_module;
            if (circuit != 0) {
               register ckteleptr *tpp =
                  ((ckteleptr*) FAST_LOC_BUF(&ckteleml_buf, (circuit - 1)));
               circuitname = (*tpp)->name;
            }
#endif /* FAULT */

#ifdef CM
            if (!getDromname(&argname, FALSE))
               return(FALSE);
#endif /* CM */
         name = argname;
         if (doregex) { /* match regular expression */
            if (RE_COMP(argname) != 0) {
               sprintf(str_buf, "Bad regular expression: %s\n", argname);
               error(str_buf);
               return(FALSE);
            }
            else {
               num_matched = 0;
               scan_rom(watchAux1);
               if (num_matched == 0) scan_vec(watchAux2);
               RE_DONE();
               if (num_matched == 0) {
                  sprintf(str_buf, "No nodes or vectors match %s\n", argname);
                  error(str_buf);
                  return(FALSE);
               }
            }
         }

         else if (nodePtr = find_node(argname)) { /* watch node */
            strmark();
#ifdef FAULT
            if (circuit != 0) {
               register string tempname;
               if (module != ALL && isNotFaninr(nodePtr, module))
                  return(FALSE);
               tempname = strtemp(name);
               tempname = strappend(":");
               tempname = strappend(circuitname);
               if (module != ALL) tempname = strappend((node + module)->name);
               name = tempname;
            }
#endif /* FAULT */
            insertWatchPtr(NODE, nodePtr, NULL);
            strpop();
         }

         else if (vectorPtr = find_vec(argname)) /* watch vector */
         {
            bufferPtr = &(vectorPtr->bits);
            strmark();
#ifdef FAULT
            if (circuit != 0) {
               register string tempname;
               register node_t **npp;
               FOR_BUF(bufferPtr, node_t *, npp)
                  if (module != ALL && isNotFanin(*npp, module))
                     return(FALSE);
               tempname = strtemp(name);
               tempname = strappend(":");
               tempname = strappend(circuitname);
               if (module != ALL) tempname = strappend((node + module)->name);
               name = tempname;
            }
#endif /* FAULT */
            insertWatchPtr(VECTOR, NULL, vectorPtr);
            strpop();
         }

         else { /* not found node or vector */
            sprintf(str_buf, "Not found: %s\n", argname);
            error(str_buf);
            return(FALSE);
         }
      }

      /* Get the next argument. */
      argname = strpush(gettoken(&s, ""));
   }
   return(TRUE);
}

/*****************************************************************************/

/* Delete watch rec from watch buf for nodes matching regular expression. */
static VOID unwatchAux1(key, dat)
pointer key;
pointer dat;
{
   string nodeName = (string) key;
   node_t *nodePtr = (node_t*) dat;

   if (RE_EXEC(nodeName)) {
      num_matched++;
      name = nodeName;
      strmark();
#ifdef FAULT
      if (circuit != 0) {
         register string tempname;
         if (module != ALL && isNotFanin(nodePtr, module)) return;
         tempname = strtemp(name);
         tempname = strappend(":");
         tempname = strappend(circuitname);
         if (module != ALL) tempname = strappend((node + module)->name);
         name = tempname;
      }
#endif /* FAULT */
      if (all_phase) {
         register int i;
         for (i = 1; i <= total_phases; i++) delete_watch(name, i);
      }
      else delete_watch(name, n_phase);
      strpop();
   }
}

/*****************************************************************************/

/* Delete watch rec from watch buf for vectors matching regular expression. */
static VOID unwatchAux2(key, dat)
pointer key;
pointer dat;
{
   string   vecName    = (string) key;
   VECTOR_S *vectorPtr = (VECTOR_S *) dat;
```

```
    bufptr   bufferPtr = &(vectorPtr->buf);

    if (RE_EXEC(vectName)) {
        num_matched++;
        name = vectName;
        strmark();
#ifdef FAULT
        if (circuit != 0) {
            register string tempname;
            register node_t *(*npp);
            FOR_BUF(bufferPtr, node_t *, npp)
                if (module != ALL && isNotMain(*npp, module)) return;
            tempname = strtemp(name);
            tempname = strappend("|");
            tempname = strappend(circuitname);
            if (module != ALL) tempname = strappend((node + module)->name);
            name = tempname;
        }
#endif /* FAULT */
        if (all_phase) {
            register int i;
            for (i = 1; i <= total_phasenum; i++) delete_watch(name, i);
        }
        else delete_watch(name, n_phase);
        strpop();
    }
}

/*****************************************************************************/

bool dounwatch(s)
string s;
{
    string argname;
    bool doregex;

    /* Get the first argument. */
    argname = strpush(gettoken(&s, ""));

    /* Initialize phase number and flag for regular expression. */
    n_phase   = 1;
    all_phase = FALSE;
    doregex   = FALSE;

    while (*argname != NULLSTR) {
        register bool new_all_phase;
        register int new_n_phase;

#ifdef CM
        if (!getProcessor(&argname, TRUE))
            return(FALSE);
#endif /* CM */
        if (new_all_phase = ISALLPHASE(argname)) all_phase = new_all_phase;
        else if (new_n_phase = getPhaseNumber(argname)) {
            if (isExceeding(new_n_phase)) return(FALSE);
            n_phase = new_n_phase;
            all_phase = FALSE;
        }
        else if (RE_RECOGNIZE(argname)) doregex = TRUE;
        else if (ISSTAR(argname)) {
            if (all_phase) {
                register int i;
                for (i = 1; i <= total_phasenum; i++) delete_watch("*", i);
            }
            else delete_watch("*", n_phase);
        }

        else if (doregex) {
#ifdef FAULT
            int temp_circuit = 0;
            int temp_module = ALL;
            if (!getCircuitModule(&argname, &temp_circuit, &temp_module))
                return(FALSE);
            circuit = temp_circuit;
            module  = temp_module;
            if (circuit != 0) {
                register fcktelemptr *fpp =
                    (fcktelemptr*) FAST_LOC_OUT(&fcktelem_buf, (circuit - 1));
                circuitname = (*fpp)->name;
            }
            name = argname;
#endif /* FAULT */
            if (RE_COMP(argname) != 0) {
                sprintf(str_out, "Bad regular expression: %s\n", argname);
                error(str_out);
                return(FALSE);
            }
            else {
                num_matched = 0;
                scan_node(unwatchAux1);
                if (num_matched == 0) scan_vec(unwatchAux2);
                RE_DONE();
                if (num_matched == 0) {
                    sprintf(str_out, "No nodes or vectors match %s\n", argname);
                    error(str_out);
                    return(FALSE);
                }
            }
        }
        else { /* no regular expression */
            if (all_phase) {
                register int i;
                for (i = 1; i <= total_phasenum; i++) delete_watch(argname, i);
            }
            else delete_watch(argname, n_phase);
        }

        /* Get the next argument. */
        argname = strpush(gettoken(&s, ""));
    }
    return(TRUE);
}

/*****************************************************************************/
```

```
        top->output changed = TRUE;

    if (binary_read) (* modPtr->mod)(nd,updTempArea);
    else (* modPtr->mod)(modPtr->results, modPtr->inputs,modPtr->ainputs);
    if ((dyn->instance top) &&
         ((top=dyn->instance top[modNum]) != (TOPOLOGY_5 *)DYN_IGNORE))
        top->output changed = FALSE;

/*  check for change, if changed, restore all values and  return(0)  */
    mod_clksup_ptr = modPtr->results;
    for(; (mod_clksup= *mod_clksup ptr); mod_clksup ptr++)
    {
            if (mod_clksup->old != mod clksup->new)
                    {
                            /* restore states */
                            if (phase_count==0) clksup update inps(modPtr,total phasenum);
                            else  clksup update inps(modPtr,phase count);
                            clksup_update_out(modPtr,X);
                            return(0);
                    }
        }
/*  force outputs to be ZERO */
    clksup update_out(modPtr,0);

/*  evaluate module */

    if ((dyn->instance top) &&
         ((top=dyn->instance top[modNum]) != (TOPOLOGY_5 *)DYN_IGNORE))
        top->output changed = TRUE;

    if (binary_read)  (* modPtr->mod)(nd,updTempArea);
    else (* modPtr->mod)(modPtr->results, modPtr->inputs,modPtr->ainputs);
    if ((dyn->instance top) &&
         ((top=dyn->instance top[modNum]) != (TOPOLOGY_5 *) DYN_IGNORE))
        top->output_changed = FALSE;

/*  check for change, if changed, restore all values and return(0) */
    mod_clksup_ptr = modPtr->results;
    for(; (mod_clksup= *mod_clksup ptr); mod_clksup ptr++)
    {
            if (mod_clksup->old != mod clksup->new)
                    {
                            /* restore states */
                            if (phase count==0) clksup update inps(modPtr,total_phasenum);
                            else  clksup update inps(modPtr,phase count);
                            clksup_update out(modPtr,X);
                            return(0);
                    }
    }


/*  restore all node values, and return(1) */
    if (phase count==0) clksup_update inps(modPtr,total phasenum);
    else clksup_update inps(modPtr,phase count);
    clksup update_out(modPtr,X);
    return(1);
#endif
}
```

```
/*****************************************************************************/
/*                  UPDATE    ROUTINES                                       */
/*****************************************************************************/

/* these routines clksup update inps, clksup update_out update the
        input/outputs of the module to the appropriate states */

clksup_update_out(modPtr,val)
minst     *modPtr;
int       val;
{
unsigned int  assign H,assign L;
    conns ptr mod clksup ptr;
    conns  mod clksup;
    node t       *nodePtr;
    int            i;

     assign H = Const 0;
     assign_L = Const 0;

     if (val ==1)  assign L = Const 1;
     if (val ==0)  assign L = Const 1;
     if (val == X) {
                     assign L = Const 1;
                     assign H = Const 1;
                    }
     i = 0;
     mod clksup ptr = modPtr->results;
     for(; (mod clksup= *mod clksup ptr); mod clksup ptr++)
     {                               /* assume low is first and High second */
          if (i ==0) {
                    mod_clksup->old = assign L;
                    mod_clksup->new = assign_L;
                    i++;
                    continue;
                    }
          if (i==1) {
                    mod clksup->old = assign H;
                    mod clksup->new = assign H;
                    i++;
                    continue;
                    }
          printf("Error: in clksup_update_out\n");
          }
}

clksup update inps(modPtr,phase n)
minst     *modPtr;
int       phase n;
 {
           conns ptr mod clksup ptr;
           conns  mod clksup;

           if ((phase n < 1) || (phase n > total phasenum)) {
                      printf("Phase count limit %d\n",phase_n);
                      exit(1);
                      }
           mod_clksup ptr = modPtr->inputs;
           for(; (mod clksup= *mod clksup ptr); mod clksup ptr++)
           {
               if (mod clksup->clk sup == 0) continue;
               mod clksup->old = *(mod clksup->clk sup + phase n);
               mod clksup->new = mod clksup->old;
           }
```

```
mod clksup ptr = modPtr->clinputs;
for(; (mod clksup= *mod_clksup ptr); mod_clksup_ptr++)
  {
    if (mod clksup->clk_sup==0) continue;
    mod_clksup->old = *(mod_clksup->clk_sup + phase n);
    mod_clksup->new = mod clksup->old;
  }
}
```

```
/**************************************************************************/
/****************          SET NODE STATES          **************************/
/**************************************************************************/

/* This module sets all the nodes status such that a dormant update is not
   needed. This is done by an extra indirection where all phases which are
   the same "state" pair, to the same memory location. The new node
   structure is as follows:

    Node_ptr ->N->clk_Sup->  -------
                             NodePtr
                             -------            -----|
               (total phase) PTR1    -------->|VAL1 |
                             -------      --->|-----
                             | PTR2   |---
                             |-------|          |----
                             | PTR1   -------->|VAL2|
                             |-------|          |----|
                               ....
                             |-------|

 */
set node states(mod signature)
int      *mod_signature;
{

 int    i,num state,x,w,j,val,size,*clk sup_ptr,*start ptr,val_h,val l;

 /* get all inputs */
 for(i=0; i< num_nodes; i++)
  {
    register node_t *nodePtr = Nodes + i;

    if (nodePtr->N.clk sup ==0) continue;
    if (nodePtr->N.clk sup ==0) continue;
    for(j=1 ; j<= total phases; j++)
      {
    /* clean up flags used during match & stops */

        val h = *(nodePtr->N.clk_sup + j);
        val_h = 0xC000000; & val h;
        if (val h ==1) *(nodePtr->N.clk sup+j) = Const 1;
        else *(nodePtr->N.clk sup+j) = Const_0;
        val l = *(nodePtr->N.clk sup + j);
        val l = 0xC000000; & val l;
        if (val l==1) *(nodePtr->N.clk sup+j) = Const 1;
        else *(nodePtr->N.clk sup+j) = Const_0;
        }

    /* if not input then use module loop to get nodes */

    if (nodePtr->fanin==[illegible]) continue;

    /* for inputs, one must recreate state since no modules feed
       these nodes */
    num state = get node state(nodePtr, mod signature);
    for(x=0; x<2; x++) {    /* number of outputs */
      if (x==1) clk sup ptr = (int *)nodePtr->[illegible] & sub;
      else clk sup ptr = (int *) nodePtr->N.clk_sup;

      size = alloc(num state * sizeof(int));
      start ptr = (int *) galloc(size,1);
```

clk sup

```
        for(w=1; w< num_states; w++) {     /* number of states */
            for(j=1; j<=total_phasenum; j++)
              {
                if (w!=mod_signature [j-1 ]) continue;
                val = *(clk_sup_ptr + j);
                *(clk_sup_ptr + j) = (machine_word) start_ptr;
                *start_ptr = val;
                } /* j */
            start_ptr++;
          } /* w */
     }/* k */
  }

 /* get all input nodes with module loop */

 for(i=0;  i< num_node ; i++)
  {
    register minst *modPtr = mods + i;
    start_ptr = (int *) mod_info[i];
    if (start_ptr==0) continue;
    start_ptr = start_ptr + 3*(total_phasenum + 1) + 1;
    num_state = *start_ptr;
    start_ptr++;
    if (num_state!=0) {
         update_node_state(modPtr,start_ptr,run_state);
         }
    }

}
```

```
/**************************************************************************/
/****************         UPDATE NODE STATES         *********************/
/**************************************************************************/

/* This routine takes the module signature and sets all outputs with
   appropriate pointers */

update_node_state(modPtr,mod_signature,num_state)
minst     *modPtr;
int       *mod_signature,num_state;
{

     int   i,*start_ptr,*mod_state_ptr;
     conns ptr *mod_clksup_ptr;
     conn  *mod_clksup;
     int    state=0,size;
     unsigned [illegible]
     node [illegible]    *nodePtr;

     mod_clksup_ptr = modPtr->results;
     for(; (mod_clksup = *mod_clksup_ptr); mod_clksup_ptr++)
       {
          if (mod_clksup->clk_sup! 0) {
               size = sizeof[illegible](total_phasenum * 4 sizeof(int));
               start_ptr = (int *) [illegible]
               for(state [illegible] state< num_state; state++)
                 {
                    for(i=[illegible] i<= total_phasenum; i++)
                        {
                         if (mod_signature[i-1] [illegible]) continue;
                         val = *(mod_clksup->clk_sup + i);
                         *(mod_clksup->clk_sup + i) = (machine_word) start_ptr;
                         *start_ptr = val;
                         }
                    start_ptr++;
                 } /* for state */
               } /* if */
          }     /* for outputs */
}
```

```
/**************************************************************************/
/****************          CREATE MOD ACTIVE          **********************/
/**************************************************************************/

/* This procedure creates a customized scheduler for this circuit by
   looking through the mod info[] datastructures, and generating a number
   of schedules per phase. The datastructure generated is:

   mod active_list -->  |-------- (total_phasenum)
                        | PH1    |--->
                        |--------|       -------|(max_clk step+2)
                        | PH2    |       #Steps |
                        |--------|       |------
                        | PH3    |       | S0   |------>  |------ (calculated)
                        |--------|       |------|           #MODS|
                        | ....   |       | S1   |         ------
                        |--------|       |------|         | M1   |
                        | ....   |       | S2   |         |------|
                        ---------        ------           | M2   |
                                         | ...  |         |------|
                                         |------|         | ...  |
                                                          |------
*/

create_mod_active()
{
extern int *mod_active_list;
int      size,i,*step_ptr,*phase_ptr,j,size_int;

  size = sizeblk(total_phasenum * sizeof(int));
  mod_active_list = (int *)getblk(size,1);

  size = sizeblk((max_clk_step+2) * sizeof (int)); /* one for size
                                                       two for step 0 */

  /* allocate per phase */
  for(i=1; i<=total_phasenum; i++)
    {
        mod_active_list[i-1] = getblk(size,1);
        phase_ptr = (int *) mod_active_list[i-1];
        for(j=0; j< max_clk_step + 2 ; j++) phase_ptr[j] = 0;
    }

  /* for every phase get the number of steps needed */
  get_mod_sizes(mod_active_list);

  for(i=1; i<=total_phasenum; i++)
    {
        phase_ptr = (int *) mod_active_list[i-1];
        for(j=1; j<= (*phase_ptr+1); j++)
          {
              size_int = num_mods/3;
              if (size_int==0) size_int = 1;
              size= sizeblk(size_int * sizeof(int));
              phase_ptr[j] = getblk(size,1);
              step_ptr = (int *) phase_ptr[j];
              if (step_ptr==0) {
                      printf("Get mem out of memory\n");
                      return(0);
                }
              *step_ptr = 0;
            }
        }
}
```

```
/*****************************************************************************/
/****************          GET MOD SIZES           ******************************/
/*****************************************************************************/

/* This procedure goes through the module list, and looks through the
   mod_info datastructure to find the number of steps per phase, and t...
   number of modules per step */

get_mod_sizes(mod_active_list)
int      *mod_active_list;

{
int      i,j,num_states,sch_phase,sch_step;
int      *mod_ptr,*phase_ptr;

   for(i=0 ; i< num_mods; i++)
     {
        mod_ptr = (int *) mod_info[i];
        if (mod_ptr==0) continue;
        num_states = *mod_ptr;
        for(j=1; j<=num_states; j++)
          {
              mod_ptr = mod_ptr + 2;
              sch_phase = *mod_ptr;
              mod_ptr++;
              sch_step  = *mod_ptr;
              phase_ptr = (int *)mod_active_list[sch_phase-1];
              if (*phase_ptr < (sch_step+1) )  *phase_ptr = sch_step+1;
              phase_ptr[sch_step+1]++;
          }
```

```
/*****************************************************************************/
/****************          GET MOD SIZES           ******************************/
/*****************************************************************************/

/*  This procedure generates the module signature information the input
    nodes */

get_node_state(nodePtr,mod_signature)
node_t *nodePtr;
int      *mod_signature;

{
  int    i;

  for(i=0; i<total_phases; i++)  mod_signature[i] 0;

  for(i=1; i<=total_phases; i++)
   {
        if (*(nodePtr->L.cis_sup+i)  [illegible] {
                mod_signature[i-1]  [illegible]
                continue;
              }
        if (*(nodePtr->L.cis_sup+i)  [illegible]
                mod_signature[i-1]  [illegible]
                continue;

        mod_signature[i-1]  3;
       }
  mod_signature[total_phases]  = mod_signature[0];
  return(1);
}
```

```
/*************************************************************************/
/****************          DUMP DATA STRUCTURES          *****************/
/*************************************************************************/

/*  This module dumps the major datastructures of clock suppression */

dump_data_structures()
{
int     i,*mod_ptr,num_states,j,*int_ptr,*step_ptr,mod_stats[4];

    printf("\n\nMOD INFO DATASTRUCTURES\n");
     for(i=0; i< total_phasenum; i++) mod_stats[i] = 0;
    for(i=0 ; i< num_mods; i++)
      {
        register minst *modPtr = mods + i;
        mod_ptr = (int *) mod_info[i];
        if (mod_ptr==0) continue;
        num_states = *mod_ptr;
        printf("Module %s --> %d\n",modPtr->name,num_states);
        mod_stats[num_states-1]++;
        mod_ptr++;
        for(j=0;j< num_states; j++)
            {
                printf("     flag : %x",*mod_ptr);
                mod_ptr++;
                printf("     Time : %d,",*mod_ptr);
                mod_ptr++;
                printf("%d\n",*mod_ptr);
                mod_ptr++;
                }
/*
        for(j=0;j<total_phasenum); j++)
            {
                printf("%d  %d\n",j,mod_ptr[j]);
                }
*/

        }

    printf("Mod Stats: %d \n",num_mods);
    for(i=0; i< total_phasenum; i++)
        {
            printf("    %d==>%d\n",i,mod_stats[i]);
        }

    printf("\n\nNODE DATASTRUCTURE\n");
    for(i=0; i < num_nodes; i++)
        {
            register node_t *nodePtr = Nodes + i;

            if (nodePtr->R.clk_sup==0) continue;
            printf("%d %s  --> \n",i,nodePtr->name);
            for(j=1; j<=total_phasenum; j++)
              {
                    int_ptr = (int *) *(nodePtr->R.clk_sup + j);
                    if (int_ptr==0) {
                                printf("%s  --> ZERO\n",nodePtr->name);
                                break;
                                }
                    else printf("%:%d %d ",int_ptr,*int_ptr);
                    int_ptr = (int *) *(nodePtr->R.clk_sup + j);
                    if (int_ptr==0) {
                        printf("%s     --> ZERO\n",nodePtr->name);
                        break;
                        }
                    else printf("%:%d %d \n",int_ptr,*int_ptr);
                }
        }
   printf("\n\n MOD_ACTIVE_LIST DATASTRUCTURES\n");
for(i=0 ; i< total_phasenum; i++)
     {
            mod_ptr = (int *) mod_active_list[i];
            printf("Phase %d --> %d\n",i, *mod_ptr);
            for(j=1; j<= *mod_ptr; j++)
              {
                step_ptr = (int *) *(mod_ptr + j);
                printf("      %d\n",*step_ptr);
                *step_ptr = 0;
              }
     }
}
```

```
/*****************************************************************************/

/* print node name, node index and dual rail encoding of clock set values:
   value_low, value_high. The ith low order bit of value_ contains the
   value set at the ith phase. */

VOID print_clk (fp)

FILE      *fp;          /* IN: file into which clock information is written. */

{
   register int              nodepos, i;
   register machine_word     mask = 1;

   fprintf (fp, " %d \n", total_phasenum);

   for (nodepos=0; nodepos < num_nodes; nodepos++)
   {
      register node_t           *nodePtr = Nodes + nodepos;
      register machine_word     value_low = 0, value_high = 0;

      if ((nodePtr->H.clk_sup != 0) || (nodePtr->L.clk_sup != 0))
      {
         for (i = total_phasenum; i > 0; i--)
         {
            if (nodePtr->L.clk_sup != 0)
               value_low = value_low | (mask & (*(nodePtr->L.clk_sup + i)));
            else
               value_low = value_low | mask;
            value_low = value_low << 1;
            if (nodePtr->H.clk_sup != 0)
               value_high = value_high | (mask & (*(nodePtr->H.clk_sup + i)));
            else
               value_high = value_high | mask;
            value_high = value_high << 1;
         } /* for */

         value_low = value_low >> 1;
         value_high = value_high >> 1;
         number_clock_node++;
         fprintf (fp," %d %s %d %d\n", number_clock_node, nodePtr->name,
                  value_low, value_high);
      } /* if */
   } /* for */

} /* print_clk */
```

```
/*****************************************************************************/

/* print node name, node index and dual rail encoding of clock set values:
   value_low, value_high. The ith low order bit of value_ contains the
   value set at the ith phase. */

print_sclk (name)
char      *name;

{
   register int              nodepos, i;
   register machine_word     mask = 1;
   FILE      *fp;

   fp = fopen(name,"w");

   fprintf (fp, " %d \n", total_phasenum);

   for (nodepos=0; nodepos < num_nodes; nodepos++)
   {
      register node_t           *nodePtr = Nodes + nodepos;
      machine_word      val;

      if ((nodePtr->H.clk_sup != 0) || (nodePtr->L.clk_sup != 0))
      {
         fprintf (fp,"%s ", nodePtr->name);
         for (i=1 ; i < 2*total_phasenum ; i++)
         {
           if (i>total_phasenum) val = *(nodePtr->L.clk_sup + i);
           else val = *(int *)(*(nodePtr->L.clk_sup + i));
           fprintf (fp," %d ", val);
         } /* for */
         for (i=1 ; i < 2*total_phasenum ; i++)
         {
           if (i>total_phasenum) val = *(nodePtr->H.clk_sup + i);
           else val = *(int *)(*(nodePtr->H.clk_sup + i));
           fprintf (fp," %d ", val);
         } /* for */
        fprintf(fp,"\n");

      } /* if */
   } /* for */

} /* print_clk */
```

```
/*************************************************************************/
/*******************  CLEAN MODULE STEP  *********************************/
/*************************************************************************/

/*  Clean module step fixes the problem of multiple evaluation of a single
        module by:
                1. moving the step count of the output to the last time
                   evaluation would take place.
                2. doing one for all modules/such that largest contraints are
                   met.

*/
int         mod_start,pass_flag;

clean_module_step(pass)
int      pass;
{
 int i,update_flag;

pass_flag = pass;
for(i=0; i< num_mods ; i++)
 {
     register minst *modPtr = mods + i;

     update_flag = update_module_step(modPtr,i);
     if (update_flag==FALSE) continue;
     else {
                 mod_start = i;
                 feedback_depth=0;
                 update_module_fo(modPtr,i,1);
         }
 }

}

/* update module fo looks at module modPtr, and schedules the fanout for
   the step consistency check */
update_module_fo(modPtr,modNum,first_time)
minst    *modPtr;
int      modNum,first_time;
{
     minst              *tmpmodptr;
     conns_ptr mod_clksup_ptr;
     conn  mod_clksup;
     node_t             *nodePtr;

     feedback_depth++;
     if ((modNum==mod_start)&&(first_time==0)|| (feedback_depth>FFLD_DEPTH)) {
             mod_clksup_ptr = modPtr->results;
             for(; (mod_clksup= *mod_clksup_ptr); mod_clksup_ptr++)
                 {
                     if (mod_clksup->clk_sup==0) continue;
                     nodePtr = (node_t *)(mod_clksup->clk_sup);
                     nodePtr->H.clk_sup = 0;
                     nodePtr->L.clk_sup = 0;

                 }
             feedback_mod[feedback_mod_cnt] = modNum;
             feedback_mod_cnt++;
             if (feedback_mod_cnt> FEEDBACK_ARRAY_SIZE) {
                   printf("Error: Feedback Array overflow\n");
                   exit(0);
                 }
         }
     mod_clksup_ptr = modPtr->results;

     for(; (mod_clksup= *mod_clksup_ptr); mod_clksup_ptr++)
         {
            fanout_ptr rFanOutPtr = mod_clksup->fan0;
            minst_no *ma;
            fanout_ptr fanOutPtr = mod_clksup->fan1;
            int minstpos;

            if (rFanOutPtr!=0) {
                    ma = rFanOutPtr->mods_affected;
                    while ((minstpos = *ma++) != END) {
                            tmpmodptr = mods + minstpos;
                            if (update_module_step(tmpmodptr,minstpos))
                                    update_module_fo(tmpmodptr,minstpos,0);

                    }
            }

            if (fFanOutPtr!=0) {
                    ma = fFanOutPtr->mods_affected;
                    while ((minstpos = *ma++) != END) {
                            tmpmodptr = mods + minstpos;
                            if (update_module_step(tmpmodptr,minstpos))
                                    update_module_fo(tmpmodptr,minstpos,0);

                    }
         }

}
/*************************************************************************/

/* update module step will look at the maximum step count for the inputs, and
   if the output step count is less than the max, the output step count will
   be modified. this change will be reflected in the return value of the
   routine. */

update_module_step(modPtr,modNum)
minst    *modPtr;
int      modNum;
{
     int max_step0 = -2,phase_n, i;   /* -2 is the value for no step info */
     int max_step1 = -2;
     int max_step;
     conns_ptr mod_clksup_ptr;
     conn  mod_clksup;
     int      step_n;
     int      update_flag = FALSE;

     for (i=1 ; i <= total_phasenum ; i++)
       {
             if (output_[illegible](modPtr,i,modNum)) continue;
             phase_[illegible]
             max_step0 = -2;
             max_step1 = -2;
             mod_clksup_ptr = modPtr->inputs;
             for(; (mod_clksup= *mod_clksup_ptr); mod_clksup_ptr++)
                {
                   if (mod_clksup->clk_sup==0) continue;
                   step_n = *(mod_clksup->clk_sup + total_phasenum + phase_n);
                   if (step_n > max_step0) max_step0 = step_n;
                }

             mod_clksup_ptr = modPtr->outputs;
             for(; (mod_clksup= *mod_clksup_ptr); mod_clksup_ptr++)
```

```
            }
            if (mod_clksup->clk_sup==0) continue;
            step_n = *(mod_clksup->clk_sup + total_phasenum + phase_n);
            if( step_n > max_step2) max_step2 = step_n;
            }

        if ((max_step1 < 0)&&(max_step2 < 0))   continue;
        if ((max_step1 > 15)|| (max_step2 > 15)) {
            printf("MAX STEP %s max step 2:%d\n",modPtr->name,
                                                        max_step1,max_step2);
            return(0);
            }
        max_step++;
        if (max_step1 < max_step2) max_step = max_step2;
        else max_step = max_step1;
        mod_clksup_ptr = modPtr->results;
        for(; (mod_clksup= *mod_clksup_ptr); mod_clksup_ptr++)
          {
            if (mod_clksup->clk_sup==0) continue;
            step_n = *(mod_clksup->clk_sup + total_phasenum + phase_n);
            if (step_n<0) continue; /* for constants */

            if (step_n < max_step)
              {
                    double_flag = TRUE;
                    *(mod_clksup->clk_sup + total_phasenum + phase_n)
                                                = max_step;
                 }
            }
        if (pass_flag==1) update_mod_step(modPtr,modNum,i,max_step);
    return(update_flag);

/**************************************************************************/

update_mod_step(modPtr,modNum,ph,step)
mInst    *modPtr;
int      modNum,ph,step;
{
int      *state_ptr,num_states,i;
int      phase_flag,phase_num,step_num,phase_now;

 state_ptr = (int *) mod_info[modNum];
 if (state_ptr==0) return(0);
 phase_now = 1<< (ph - 1);
 num_states = *state_ptr;
 for(i=1; i<=num_states ; i++)
   {
    state_ptr++;    /* now points to the first entry */
    phase_flag = *state_ptr;
    state_ptr++;    /* now points to the second entry */
    phase_num = *state_ptr;
    state_ptr++;    /* now points to the third entry */
    step_num  = *state_ptr;

    if (ph==phase_num)  {
/*                  if (*state_ptr!=step) printf("Mod %s \n",modPtr->name); */
                    *state_ptr = step;
                    }
   }
}
```

```
load_clk_data(f_name)
char     *f_name;
{
FILE   *clk_file;
int       num_phases,ret_val,i,m,k,nodepos;
int       size;
machine_word  val;
char    node_name[100];
node_t   *nodePtr;

 clk_file = fopen(f_name,"r");

 fscanf(clk_file,"%d",&num_phases);
 if (num_phases!=total_phasenum)
   {
        printf("Error Num Phases read:%d loaded:%d \n",total_phasenum,
                 num_phases);
        exit(1);
  }

 while (1)
   {
      ret_val = fscanf(clk_file," %s",node_name);
      if (ret_val ==EOF) break;
      nodePtr = find_node(node_name);
      if (nodePtr ==0) continue;
      size = sizeof(sizeof(machine_word)* (2*total_phasenum+1));
      nodePtr->N.clk_sup = (machine_word *)[illegible](size,1);
      if (nodePtr->N.clk_sup==0) printf("Run out of memory\n");
      nodePtr->N.clk_sup = (machine_word *)[illegible](size,1);
      if (nodePtr->N.clk_sup==0) printf("Run out of memory\n");
      /* initialize phases to X and steps to -1 */
      for(i=1; i <= (2*total_phasenum) ; i++) {
         fscanf(clk_file," %d",&val);
         *(nodePtr->N.clk_sup+i) = val;
         }
      for(i=1; i <  (2*total_phasenum) ; i++) {
         fscanf(clk_file," %d",&val);
         *(nodePtr->N.clk_sup+i) = val;
         }
   }
}
```

```
update_clk_states()
{
int i,nodepos,val;

 for(i=1; i<=total_phasenum ; i++)
   {
      phase(i);
      for(nodepos=0; nodepos<num_nodes; nodepos++) {
          register node_t * nodePtr = Nodes + nodepos;

          if (nodePtr->N.clk_sup!=0)
            {
              val = *(nodePtr->N.clk_sup +i);
              if ((val==0)|| (val==0xFFFFFFFF))
                  nodePtr->N.clk_sup = 0;
              else
              [illegible] *(nodePtr->N.clk_sup + i),    nodePtr->N.name;
            }
          if (nodePtr->N.clk_sup!=0)
            {
              val = *(nodePtr->N.clk_sup +i);
```

```
                if ((val==0)|| (val!=0xFFFFFFFF))
                    nodePtr->l.clk_sub = 0;
                else
                    *(int *)*(nodePtr->l.clk_sub + 1) = nodePtr->l.new;
            }
        }
    }

remove_l_cts()
{
int i,nodepos;

    for(nodepos=0; nodepos<num_nodes; nodepos++) {
            register node_t *nodePtr = Nodes + nodepos;
            nodePtr->l.linfp = 0;    /* remove L for two-state */
        }

for(i=0; i< num_mods ; i++)
 {
     register minst *modPtr = mods + i;
     conns ptr f_ptr,s_ptr,t_sptr;
     conn  f_item,s_item;

     f_ptr = modPtr->inputs;
     s_ptr = f_ptr;
     while (*f_ptr!=0)
      {
         if ((*f_ptr)->linfp==0) {
                 f_ptr++;
                 continue;
                 }
         *s_ptr = *f_ptr;
         s_ptr++;
         f_ptr++;
         }
     *s_ptr = *f_ptr;

     f_ptr = modPtr->inputs;
     s_ptr = f_ptr;
     while (*f_ptr!=0)
      {
         if ((*f_ptr)->linfp==0) {
                 f_ptr++;
                 continue;
                 }
         *s_ptr = *f_ptr;
         s_ptr++;
         f_ptr++;
         }
     *s_ptr = *f_ptr;
     f_ptr = modPtr->results;
     s_ptr = f_ptr;
     while (*f_ptr!=0)
      {
         if ((*f_ptr)->linfp==0) {
                 f_ptr++;
                 continue;
                 }
         *s_ptr = *f_ptr;
         s_ptr++;
         f_ptr++;
         }
     *s_ptr = *f_ptr;
  }
}

/*************************************************************************/
```

NAND

```
/* nand from LGC file nand.lgc
 * generated by COSMOS LGCC $Version$ on  */
#define LGCCOUT
#define NUM_SUFS (2)
#include <stdio.h>
#include "types.h"
#include "fault.h"
#include "lgccout.h"

int tsc_2282430499_t_ = 0;
sc_2282430499( o, i, z)
    conns_ptr o, i, z;  /* 4 units, 0 zeroes, 2 outs, 0 nodes */
{       register anon *a= updTempArea;
 LOC_DECL
 AND3(NO(0),OI(3),OI(1));
 OR3(NO(1),OI(2),OI(0));

}
mInst_no fo0[] = { END,
        END,
        END };
foStruct fos0[]= {
        { NULL } };
mInst_no fo1[] = { END,
        0, END,
        END };
foStruct fos1[]= {
        { FALSE, &fo1[1] },
        { NULL } };

node_t  nd[] =
{       {V_I(NULL,NULL),V_I(NULL,NULL),0,"OUT"},
        {V_I(&fos1[0],NULL),V_I(&fos1[0],NULL),-1,"A"},
        {V_I(&fos1[0],NULL),V_I(&fos1[0],NULL),-1,"B"},
        NULL
};
NODE_COUNT(3)

node_no vl[]= { NULL };
stVector st_vecs[] =
{       { NULL, ""}
};
unsigned int num_st_vecs = 0;


conn cvl[]= {
        &nd[0].L, &nd[0].H, NULL,
        &nd[1].L, &nd[1].H, &nd[2].L, &nd[2].H,
                NULL,
        NULL,
        NULL };

mInst mods[] =
        MI_I(tsc_2282430499_t_, sc_2282430499, &cvl[0], &cvl[3], &cvl[8], 0, "sc
_2282430499/0/"),
         NULL };
 MOD_COUNT(1)
unsigned int rank_origins[]=
{       0
};
RANK_COUNT(1);
```

ERNEL

```
/*************************************************************************
 *                                                                       *
 *     Copyright (C) 1987, Carnegie-Mellon University                    *
 *                                                                       *
 *             Written by Kyeongsoon Cho, 1987                           *
 *                                                                       *
 *************************************************************************/

/* Schedule the events.                                   */
/*     public functions : VOID init_kernel()              */
/*                        VOID [illegible]()              */
/*                        VOID set_n_phase()              */
/*                        bool phase()                    */
/*                        VOID set_add()                  */
/*                        VOID event_fanout()             */
/*                        VOID step()                     */
/*                        VOID Xstep()                    */

#include <stdio.h>
#include "types.h"
#include "but.h"
#include "rec.h"
#include "fault.h"
#undef LSCCOUT
#ifdef CM
#include "cm-abbrev.h"
#endif /* CM */
#include "lsccout.h"
#include "manager.h"
#include "output.h"
#include "kernel.h"
#ifdef SYMSIM
#include "cmd.h"
#include "symbolic.h"
#include "dbg.h"
#include "keytable.h"
#endif /* SYMSIM */

#ifdef CM
/* defined in main.c       */
extern CM_memaddr_t old_base, new_base, temp_base;
extern unsigned long num_vars;
extern CM_cubeaddr_t everyProcessor;
extern CM_cubeaddr_t noProcessor;
#endif /* CM */

extern machine_word *updTempArea;
extern int              binary_read;
bool *old_flag, *new_flag;
int *old_start, *new_start;
machine_word *old_index, *new_index;
[illegible] *[illegible]ListPtr;
bool checkFreeze;
bool isStable, isOldEvent;

int step_count, phase_count, cycle_count;
int total_phasenum;
int num_changed_var, num_eval_node;

/*************************************************************************/

/*  clock suppression variables */

bool        clk_sup_flag, step_collection;
bool        clk_sup_stabilize = FALSE;
int         *mod_active_last, *mod_idle;

unsigned int *clk_schedule;         /* array of size num of modules: low   */
                                    /* order bit i set if acted at phase i */
int          *num_eval_one_phase;

/*************************************************************************/

extern int on_dyon;

#ifdef FAULT
ckiptr *old_ckstart, *new_ckstart;
#endif /* FAULT */

/*************************************************************************/

/* dynamic solver */

#include "dynamic.h"

extern DYNAMIC_S    *dyn;         /* points to dynamic solver top structure */
extern TOPOLOGY_S   **top;        /* [illegible] */
extern int          timed_instance;/* [illegible] */
extern int          delta_time(); /* [illegible] */
extern int          [illegible]saved_mod)();/* [illegible] saved module definition procedure */

float               average_time = 0;     /* Average time of evaluation */
int                 total_time = 0;       /* Total time spent in module */
int                 number_evaluations = 0; /* Number of module evaluations */

/*************************************************************************/

extern machine_word Const_1, Const_0;         /* Defined in main.c.     */
extern buffer set_clk_out, freeze_out;        /* Defined in manager.c.  */
extern bool oscillateswitch;                  /* Defined in main.c.     */
extern char str_buf[];                        /* Defined in output.c.   */
extern int steplimit;                         /* Defined in main.c.     */
#ifdef FAULT
extern rec_mgr nodelist_mgr, [illegible]_mgr, ext_mgr; /* Defined in manager.c. */
extern int Neval;                             /* Defined in [illegible] */
extern buffer testalem_out;                   /* Defined in manager.c. */
extern rec_mgr watch_rec_mgr;                 /* Defined in manager.c. */
extern VOID COS_schedule_fanir();             /* Defined in nodemanc.c */

#endif /* FAULT */
#ifdef SYMSIM
extern buffer usave_buf, xsave_buf;           /* Defined in manager.c.  */
extern keytable_rec [illegible]_table;        /* Defined in keytable.c. */
extern int [illegible]count;                  /* Defined in dbg.c.      */
extern int [illegible];                       /* Defined in main.c.     */
#endif /* SYMSIM */

/* Initialize kernel module. */
VOID
init_kernel()
{

      int        size, i, nodepos;
      /* clock suppression initialization */
      clk_sup_flag = 0;
      step_collection = 0;
#if 0
      /* for statistics collection */
      size = [illegible](sizeof(machine_word) * num_nodes);
      num_eval_per_phase = [illegible](size,1);
      for(i=0; i<num_nodes; i++) num_eval_per_phase[i]=0;
#endif
      for (nodepos=0 ; nodepos < num_nodes ; nodepos++)
```

```
        {
            register node_t *nodePtr = Nodes + nodepos;
            nodePtr->H.old_sup = 0;
            nodePtr->L.old_sup = 0;
            /* VERY DANGEROUS.. use Finfp field for storing backpointer */
            nodePtr->H.finfp = (firfptr)(&(nodePtr->L));
            nodePtr->L.finfp = (firfptr)(&(nodePtr->H));
        }
    }
    /* Initialize old and new event lists. */
    old_start = evl1; new_start = evl2;

    {   /* Initialize old and new flags. */
        register int minstpos;
        for (minstpos = 0; minstpos < num_mods; minstpos++)
            { *(evlb1 + minstpos) = *(evlb2 + minstpos) = FALSE; }
        old_flag = evlb1; new_flag = evlb2;
    }

    {   /* Initialize old and new index lists. */
        register int rank;
        for (rank = 0; rank < num_ranks; rank++)
            { *(evli1 + rank) = *(evli2 + rank) = *(rank_origins + rank); }
        old_index = evli1; new_index = evli2;
    }

    /* Initialize update list. */
    updateListPtr = upd1;

    /* Initialize flags for network stability. */
    checkFreeze = FALSE; isStable = TRUE; isOldEvent = FALSE;

    /* Initialize the counts for cycle, phase, and step. */
    step_count = phase_count = cycle_count = 0;

    /* Initialize total phase number. */
    total_phasenum = 1;

    /* Initialize number of variables changed and modules evaluated. */
    num_changed_var = num_eval_mods = 0;

#ifdef FAULT
    {   /* Initialize old and new circuit event lists. */
        register int minstpos;
        for (minstpos = 0; minstpos < num_mods; minstpos++)
            { *(cktevl1 + minstpos) = *(cktevl2 + minstpos) = NULL; }
        old_cktstart = cktevl1; new_cktstart = cktevl2;
    }
#endif /* FAULT */

#ifdef SYMSIM
    {
        register int maxisize = 0;
        register int maxzsize = 0;
        register int minstpos;

        for (minstpos = 0; minstpos < num_mods; minstpos++) {
            register minst *modPtr = mods + minstpos;
            register int isize = 0;
            register int zsize = 0;
            register conn_ptr vpp;
            register conn vp;

            for (vpp = modPtr->inputs; (vp = *vpp); vpp++, isize++);
            for (vpp = modPtr->zinputs; (vp = *vpp); vpp++) zsize++;
            *(cktevl1 + minstpos) = new_cktptr(isize, zsize);

            maxisize = (isize > maxisize) ? isize : maxisize;
            maxzsize = (zsize > maxzsize) ? zsize : maxzsize;
        }
        new_buf(&isave_buf, maxisize, sizeof(machine_word));
        resize_buf(&isave_buf, maxisize);
        new_buf(&zsave_buf, maxzsize, sizeof(machine_word));
        resize_buf(&zsave_buf, maxzsize);
    }
#endif /* SYMSIM */
#ifdef CM
    {   /* set new and old values of each simulation variable */
        register int n;
        register CM_renador_t nextold = old_base;
        register CM_renador_t nextnew = new_base;
        for (n = 0; n < num_nodes; n++) {
            Nodes[n].H.old = nextold++;
            Nodes[n].L.old = nextold++;
            Nodes[n].H.new = nextnew++;
            Nodes[n].L.new = nextnew++;
        }
    }
#endif /* CM */

    user_node_init();
}

/****************************************************************************/

/* Restore node status in freeze buf. */

VOID restore_freeze ()

{
    register int i;

    for (i = 0; i < phase_count; i++)
    {
        register freeze_rec_ptr ptr = (fra_freeze...);
        if (ptr)
        {
            for (ptr = ptr->nextrec; ptr != NULL; ptr = ptr->nextrec)
            {
                ptr->vhp->new = ptr->high;
                ptr->vlp->new = ptr->low;
            }
        }
    }
} /* restore_freeze */

/****************************************************************************/

/* Schedule events according to set clk buf and freeze buf. */
VOID set_phase(n)
register int n;
{
    {   /* fetch the record for phase n from set_clk_buf. */
        register set_clk_head_rec_ptr *pp =
            (set_clk_head_rec_ptr*) M_LOCATE_BUF(&set_clk_buf, (n - 1));
        register set_clk_rec_ptr ptr, con_ptr;
        register int         pos;

        if (*pp) {
            ptr = (*pp)->head;
            for (; ptr != NULL; ptr = ptr->nextrec) {
```

```
#ifdef SYMSIM
            if (ifaults != 0) {
                register finfptr finfp;
                finfp = ptr->vhp->finfo;
                set_add((machine_word) evaldag(((dag_ptr) ptr->high),
                                               ((dag_ptr) finfp->sum),
                                               ((dag_ptr) finfp->ocr))),
                        ptr->vhp, ptr->fanin);
                finfp = ptr->vlp->finfp;
                set_add((machine_word) evaldag(((dag_ptr) ptr->low),
                                               ((dag_ptr) finfp->sum),
                                               ((dag_ptr) finfp->ocr))),
                        ptr->vlp, ptr->fanin);
            }
            else {
                set_add(ptr->high, ptr->vhp, ptr->fanin);
                set_add(ptr->low,  ptr->vlp, ptr->fanin);
            }
#else /* SYMSIM */
#ifdef CM
            set_add(ptr->high, ptr->vhp, ptr->fanin, ptr->processor);
            set_add(ptr->low,  ptr->vlp, ptr->fanin, ptr->processor);
#else /* CM */
            /* clk suppression mode */
        {
          if (clk_sup flag) {
           if (ptr->keep==FALSE) {
                   set_add(ptr->high, ptr->vhp, ptr->fanin);
                   set_add(ptr->low,  ptr->vlp, ptr->fanin);
              }
          }
          else {
           set_add(ptr->high, ptr->vhp, ptr->fanin);
           set_add(ptr->low,  ptr->vlp, ptr->fanin);
          }
        }
#endif /* CM */
#endif /* SYMSIM */
          }
        }
    }

    {  /* Fetch the record for phase n from freeze_buf. */
       register node_t              *node2tr;
       register freeze_rec_ptr free_ptr, old_ptr, ptr = [illegible] freeze[n];
       register bool                check = FALSE;
       extern rec_mgr               freeze_rec_mgr;   /* Defined in manager.c. */

       if (ptr)
       {
          for (old_ptr = ptr; (ptr = ptr->nextrec) != NULL; old_ptr = ptr)
          {
#ifdef SYMSIM
            if (ifaults != 0) {
                register finfptr finfp;
                finfp = ptr->vhp->finfp;
                set_add((machine_word) evaldag(((dag_ptr) ptr->high),
                                               ((dag_ptr) finfp->sumf),
                                               ((dag_ptr) finfp->ocf))),
                        ptr->vhp, -1);
                finfp = ptr->vlp->finfp;
                set_add((machine_word) evaldag(((dag_ptr) ptr->low),
                                               ((dag_ptr) finfp->sumf),
                                               ((dag_ptr) finfp->ocf))),
                        ptr->vlp, -1);
            }
            else {
                set_add(ptr->high, ptr->vhp, -1);
                set_add(ptr->low,  ptr->vlp, -1);
            }
#else /* SYMSIM */
#ifdef CM
            set_add(ptr->high, ptr->vhp, -1, ptr->processor);
            set_add(ptr->low,  ptr->vlp, -1, ptr->processor);
#else /* CM */
            if (!ptr->cycle || (ptr->cycle > cycle_count))
            {
               if (!ptr->used)
               {
                  set_add(ptr->high, ptr->vhp, -1);
                  set_add(ptr->low,  ptr->vlp, -1);
                  ptr->used = TRUE;
               }
            }
            else   /* delete freeze */
            {
               check = FALSE;
               node2tr = ptr->nodePtr;
               old_ptr->nextrec = ptr->nextrec;
               free_rec(&freeze_rec_mgr, (char *) ptr);
               [illegible] (nodePtr);
               ptr = old_ptr;
            }
#endif /* CM */
#endif /* SYMSIM */
          }
       }
       if (check)    /* Check whether freeze_buf is empty. */
       {
          register freeze_rec_ptr tmp;

          checkFreeze = FALSE;
          FOR_BUF(freeze[n], freeze_rec_ptr, tmp,
             if (tmp && (tmp)->nextrec) checkFreeze = TRUE; )
       }
    }

    {  /* Clear flags for each variable in update list. */
       register varn *updateListPtrTemp = [illegible];
       for (; updateListPtrTemp != updateList[[illegible]]; updateListPtrTemp++) {
          register varn vp = *updateListPtrTemp;
          register fanout_ptr fanOutPtr;
#ifdef FAULT
          vp->finfo->flag = FALSE;
#endif /* FAULT */

          fanOutPtr = vp->[illegible]; /* for unit delay */
          if (fanOutPtr) fanOutPtr->traversed = FALSE;

          fanOutPtr = vp->[illegible]; /* for zero delay */
          if (fanOutPtr) fanOutPtr->traversed = FALSE;
       }
    }

    /* If there are new events and no old events,        */
    /*     swap old and new lists;                        */
    /*     for each state variable in update list         */
    /*         [illegible] state new state;               */
    /*     update [illegible] entry;                      */
    if ([illegible] && [illegible])
       register machine_word *temp_index   [illegible] index;
```

```
        register int            *temp start     old start;
        register bool           *temp flag      old flag;
#ifdef FAULT
        register cktptr         *temp cktstart = old cktstart;
#endif /* FAULT */

        step_count++;               /* update step count to be consistent */
        /* Swap old and new lists. */
        old_start     = new start;     new start      temp start;
        old_index     = new index;     new_index    = temp_index;
        old flag        new flag;      new_flag     = temp_flag;
#ifdef FAULT
        old cktstart    new_cktstart; new_cktstart = temp_cktstart;
#endif /* FAULT */

        {  /* Update old state of each state variable in update list. */
           register int  changedCount       = 0,*tmp_ptr;
           register conn *updateListPtrTemp = updl;
           for (; updateListPtrTemp != updateListPtr; updateListPtrTemp++) {
              register conn vp = *updateListPtrTemp;
#ifdef FAULT
              register eleptr firstptr = vp->firstptr[temp;
              PUT_OLDST(firstptr, GET NEWST(firstptr));
#else /* FAULT */
#ifdef CM
              CM_move(vp->old, vp->new, 1);
#else /* CM */
              vp->old = vp->new;
              if ((clk sup flag==1) &&(vp->clk sup!=0))
                {
                   tmp_ptr = (int *) *(vp->clk_sup + phase_count);
                   *tmp ptr = vp->old;
                }
#endif /* CM */
#endif /* FAULT */
              changedCount++;
           }

           /* update list <== empty */
           updateListPtr = updl;
           num_changed_var += changedCount;
        }
    }
    isOldEvent = FALSE;
}


/* Simulate one unit phase (phase n). */
bool phase(n)
register int n;
{
   register int steplim = steplimit,max eval,i,max mod,j;
   Minst  *mod ptr;
   VOID          clk step();
        /* Schedule events for clk suppression */

      if (((cycle count % 100) ==0) && (phase_count==1) && (cycle count.=0))
        {
               printf("Cycle %d\n",cycle_count);
#if  0
          for(j=0; j < 10 ; j++)
            {
             max eval = -1;
             for(i=0; i <num mods; i++) {
                if (num_eval) per phase[i] > max_eval)
                  {
                    max eval = num eval per phase[i];
                    max mod = i;
                  }
              }
            mod ptr = inm + max mod;
            num eval per phase[max mod] = 0;
            printf("%d. %s %d \n",j,mod ptr->name,max eval);
           }
           for(i=0; i <num_mods; i++) num_eval per_phase[i]=0;
#endif
       }
       step count = 0;
       if (clk sup stabilize == FALSE) [illegible] before phase();
       if (clk sup [illegible]
       {

           /* Call the function step() until network becomes stable. */

           schedule step[illegible];
           while ([illegible] && step [illegible])
           {
                [illegible]
                step count++;
                [illegible]
                schedule step[illegible],step count);
           }
           if (!isStable)

              if ([illegible])
              {
                sprintf(str out, "Exceed step limit: %d\n", steplimit);
                error(str out);
                return(FALSE);
              }
           }
           step count = 0;
           [illegible] phase();
           if [illegible] UPDATE [illegible] DISPLAY();
           return([illegible]);

       } /* clk sup [illegible] */

    /* Schedule events according to set clk out and freeze out. */
     set n phase(n);
    /* Call the function step() until network becomes stable. */
    while (!isStable && step [illegible])
    {
        step();
        step count++;
        steplim--;
    }
    step count = 0;
    /* If exceeds step limit, print out error message. */

    if (!isStable) {
       if ([illegible]) {
          sprintf(str out, "Exceed step limit: %d\n", steplimit);
          error(str out);
          return(FALSE);
       }
#ifdef FAULT
/*        sprintf(str out,
           "Exceed step limit %d for the following circuits\n", steplimit);
       output(str out);
       [illegible]event([illegible]); */
#else /* FAULT */
```

```
        sprintf(str_buf, "Exceed step limit: %d\n", steplimit);
        output(str_buf);
#endif /* FAULT */
        output("Oscillating nodes set to X.\n");

        while (!isStable)
        {
            Xstep();
        }
    }
    if (nis_sup_stabilize == FALSE) user_conn_after_phase();
    if (on_Hvue) DVUESUPDATE_FULL_DISPLAY();
    return(TRUE);
}

#ifdef FAULT
/* Set new state of variable for good circuit.            */
/* If old state != new state, then                         */
/*      (1) Put the pointer of variable on update list.    */
/*      (2) Schedule the events for zero delay fanout.     */
/*      (3) Schedule the events for unit delay fanout.     */
VOID set_add(value, vp, fanin)
register machine_word value;
register conn vp;
register int fanin;
{
    register elemptr firstptr = vp->finfp->elemp;

    /* Set new state of variable. */
    PUT_NEWST(firstptr, value);

    /* If old state != new state (value) */
    if (value != GET_OLDST(firstptr)) {

        /* Put the pointer of variable on update list. */
        {
            register listptr finfp = vp->finfp;
            if (!finfp->flag) { *updateListPtr++ = vp; finfp->flag = TRUE; }
            isStable = FALSE;
        }

        {  /* Schedule the events for zero delay fanout. */
            register fanout_ptr zFanOutPtr = vp->fno0;
            if (zFanOutPtr != NULL)
                { event_fanout(zFanOutPtr, TRUE); isOldEvent = TRUE; }
        }

        {  /* Schedule the events for unit delay fanout. */
            register fanout_ptr uFanOutPtr = vp->fno1;
            if (uFanOutPtr != NULL) event_fanout(uFanOutPtr, FALSE);
        }

        /* Schedule the events for fanin. */
        if (fanin != -1) {
            register cktptr ptr = *(new_cktstart + fanin);

            /* Insert good circuit into circuit event list. */
            if (ptr == NULL) *(new_cktstart + fanin) = new_cktptr(0);
            else if (ptr->circuit != 0) {
                register cktptr newptr = new_cktptr(0);
                newptr->next = ptr;
                *(new_cktstart + fanin) = newptr;
            }

            /* If that module not in the event list, put it on event list. */
            if (!(*(new_flag + fanin))) {
                *(new_start + (*(new_index + [illegible] + fanin)->rank)++)) = fanin;
                *(new_flag + fanin) = TRUE;
            }
        }
    }
}

/* Schedule the events for each fanout.      */
/* Note that fanOutPtr is not NULL pointer. */
VOID event_fanout(fanOutPtr, isOld)
fanout_ptr fanOutPtr;
bool isOld;
{
    cktptr          *Cktstart = (isOld ? o_n_cktstart : new_cktstart);
    int             *Start    = (isOld ? o_n_start    : new_start);
    machine_word    *Index    = (isOld ? old_index    : new_index);
    bool            *Flag     = (isOld ? old_flag     : new_flag);

    /* if fanout list not traversed */
    if (!fanOutPtr->traversed) {
        register [illegible] no *nodsAffected = fanOutPtr->nods_affected;
        register int minstpos;

        /* for each fanout module */
        while ((minstpos = *nodsAffected++) != END) {
            register cktptr ptr = *(Cktstart + minstpos);

            /* Insert good circuit into circuit event list. */
            if (ptr == NULL) *(Cktstart + minstpos) = new_cktptr(0);
            else if (ptr->circuit != 0) {
                register cktptr newptr = new_cktptr(0);
                newptr->next = ptr;
                *(Cktstart + minstpos) = newptr;
            }

            /* If that module not in the event list, put it on event list. */
            if (!(*(Flag + minstpos))) {
                *(Start + (*(Index + [illegible] + minstpos)->rank)++)) = minstpos;
                *(Flag + minstpos) = TRUE;
            }
        }
    }

    /* Since good state was changed, we have to scan all the state        */
    /* & event records for each input variable for each fanout.           */
    /*      if good value != faulty value                                 */
    /*          insert circuit into circuit event list of each fanout;    */
    /*      else delete state comment record if possible;                 */
    /*

    [illegible] no *nodsAffected = fanOutPtr->nods_affected;
    int minstpos;

    /* for each module in fanout list */
    for (; (minstpos = *nodsAffected) != END; nodsAffected++) {
        conn_ptr [illegible];
        conn modInput;

        /* for each zero-delay input variable */
        modInputPtr = (mcdm + minstpos)->inputs;
        for (; (modInput = *modInputPtr); modInputPtr++) {
            [illegible]
            [illegible]
            register [illegible]
            register machine_word [illegible] = GET_NEWST(firstptr);
            finfp->shadow = [illegible];
```

```
/*****************************************************************************
/*****************            CCCTR_SUP            *****************************/
/*****************************************************************************/
/*   This is the clock suppression data collection and data structure
     command. It is invoked at the command level with:
             clk_sup [file]

     This command is expects to be called after clocks and constants are
     defined. If any dynamic signals are defined then, clk suppression
     assumes they are static. This may (will) cause a inaccurate simulation.

     The flow of control during this routine is as follows:

          1.  Simulate network with only clocks and constants defined.
          2.  Check for Stability (that is: the network is at the same
                                   state in Phase 1 of cycle 10 as phase 1
                                   of cycle 11.)

          3.  After stability is established, collect phase and step count
              information during the presimulation phase.

          4   Analyze presimulated information to generate datastructures for

              1. The module info datastructure (the view of clock suppression
                 from the module point of view)

              2. The node datastructure ( to take care of update problems)

              3. The static phase scheduler
*/

int      max_clk_step=0;  /* global used to record the maximum number of
                             steps in any presimulated module */
int      clk_sup_loaded;

doclk_sup (cmdline)
string cmdline;    /* (I) command line character string */
{
   register int          i,dump;
   register conns ptr    result_ptr;
   register conns        result;
   string                name;
   FILE                  *fclock = NULL;
   extern int            phase_count;
   VOID                  print_clk();

   /* read name of file in which to write clock set state, if present */

   clk_sup_stabilize = TRUE;
   clk_sup_load = 0;
   dump = 0;
   if (*(name = gettoken (&cmdline, " "))) 
   {
      if ((name[0]=='-')&&(name[1] == 'l'))
      {
           clk_sup_load = 1;
           name = gettoken(&cmdline," ");
      }
      else {
         if ((name[0]=='-')&&(name[1] == 'd'))
         {
            dump = 1;

            name = gettoken(&cmdline," ");
         }
      else {
            if (!(fclock = fopen (name, "w")))
            {
               error("Error: could not open file");
               return (NULL);
            }
         }
      }
   } /* if */

   stabilize_network();
   if (clk_sup_load)     load_clk_data(name);
   else {
   /*    collect phase value information */
          phase_count = 0;
          for (i=1 ; i< total_phasenum ; i++) {
                 phase [illegible]
                 coll_phase(i);
          }

   /* capture the correct step information */
          step_collection = 1;
          phase_count = 0;
          for (i = 1 ; i< total_phasenum ; i++) {
                phase_count++;
                phase(i);
          }
          phase_count = 0;
          step_collection = 0;
          /* collection complete */
      }

   /* write names and cy clocks into a file for time out analysis */
   if (fclock)  print_clk (fclock);

   /* start analysis of presimulated clocks and generate datastructures */

   create_pach_strs();            /* get bits pointers for nodes */
   create_mod_info();             /* perform static analysis */
   if (create_mod_active()==0) return(0);        /* create static scheduler */
#ifdef DEBUG
   dump_data_structures();
#endif
   clk_sup_stabilize = FALSE;

   if (dump)    print_sc(fname);
   if (clk_sup_load)
        update_clk_states();
/*      remove_i_rofs(); */
      }
   if (binary_load)   sort_ctl();
   clk_sup_flag = 1;

   /* dynamic solvers set the output_changed flag when the clock suppression
      algorithm may alter a dynamic channel connected region output.
      note that combinational modules are passed to them */

   if (cyn->instance top)
   {
      for (i = 0; i < num_mods; i++)
      {
/*            [imods+i]->name[ [illegible] ] [illegible] removed because of modulo
```

```
        ... labeling algorithm */

    if ((mod_info[i] != 0) &&
        (top->dyn->instance top[i]) & (TOPOLOGY S | DYN_IGNORE))
    {
        for (result_ptr = (mod_info[i]->results;
             (top->output_changed == FALSE) && (result = *result_ptr);
             result_ptr++)
        {
            if (result->clk_sup != 0) top->output_changed = TRUE;
        }
    } /* if */
  } /* for */
} /* if */

for (i = 0; i < feedback_mod_cnt; i++)
   schedule_clk_eval(feedback_mon[i]);


}  /* doclk_sup */
```

```
/**************************************************************************/
/****************          SORT CVL POINTERS     ****************************/
/**************************************************************************/
sort_cvl()
{
int i;
for(i=0; i< num_mods ; i++)
 {
     register mfnst *modPtr = mods + i;
     conn_ptr f_ptr,s_ptr,t_sptr;
     conn  f_item,s_item;

     if (mod_info[i] ==0) continue;

     f_ptr = modPtr->outs;
     for(; (*f_ptr); f_ptr++)
        {
         s_ptr = f_ptr + 1;
         for(; (*s_ptr); s_ptr++)
          {
                f_item = *f_ptr;
                s_item = *s_ptr;
                if ((f_item->clk_sup==0)&&
                    (s_item->clk_sup!=0))
                   {
                      *s_ptr = f_item; /* swap */
                      *f_ptr = s_item;
                   }
          }

        }

      f_ptr = modPtr->inputs;
      for(; (*f_ptr); f_ptr++)
        {
         s_ptr = f_ptr + 1;
         for(; (*s_ptr); s_ptr++)
          {
                f_item = *f_ptr;
                s_item = *s_ptr;
                if ((f_item->clk_sup==0)&&
                    (s_item->clk_sup!=0))
                   {
                      *s_ptr = f_item; /* swap */
                      *f_ptr = s_item;
                   }
          }
        }

      f_ptr = modPtr->results;
      for(; (*f_ptr); f_ptr++)
        {
         s_ptr = f_ptr + 1;
         for(; (*s_ptr); s_ptr++)
          {
                f_item = *f_ptr;
                s_item = *s_ptr;
                if ((f_item->clk_sup==0)&&
                    (s_item->clk_sup!=0))
```

enhancement

```
        ** ptr = l_item; /* swap */
        ** ptr = h_item;
    }
```

```
/*****************************************************************************/
/*****************          CREATE BACK POINTERS     ****************************/
/*****************************************************************************/

/*  This routine fixes a problem with [illegible] where from the H or L level
    datastructures it is impossible to get to the node datastructures.
    Since the kernel uses the H and L as effective nodes. It is impossible
    to realise an X vs a 0 or 1 for analysis purposes.

    The fix is to reserve the first word of the clk sup datastructure for
    the back pointer to the node. This routine also checks the step count
    for every node, and makes sure the H and L have the same step count.
    This is to catch the 0->X, 1->X, X->0, and X->1 cases. It is ASSUMED
    that the 0->X, 1->X transition will happen at the same step.
*/

create_back_ptrs()
{
 int     i,k,step_h,step_l;
 unsigned int  step_p...;

 for(i=0; i < num_nodes; i++)
   {
     register node_t *nodePtr = Nodes + i;

     if (nodePtr->H.clk_sup==0) continue;
     *(nodePtr->H.clk_sup) = (machine word) nodePtr;
     *(nodePtr->L.clk_sup) = (machine word) nodePtr;

     for(k=1; k <= total_phasenum ; k++)
       {
                                           /* for PI's make step zero */
          if (nodePtr->primin==1) {
                 *(nodePtr->H.clk_sup+total_phasenum+k) = 0;
                 *(nodePtr->L.clk_sup+total_phasenum+k) = 0;
                 continue;
                 }
          step_h = *(nodePtr->H.clk_sup+total_phasenum+k);
          step_l = *(nodePtr->L.clk_sup+total_phasenum+k);
          if (step_h == -1)
                 *(nodePtr->H.clk_sup+total_phasenum+k) = step_l;
          if (step_l == -1)
                 *(nodePtr->L.clk_sup+total_phasenum+k) = step_h;

          step_h = *(nodePtr->H.clk_sup+total_phasenum+k);
          step_l = *(nodePtr->L.clk_sup+total_phasenum+k);
#ifdef DEBUG
          if (step_h != step_l)
                 printf("%s : H,%d L,%d \n",nodePtr->name,step_h,step_l);
#endif
       }
   }
}
```

```
/*  This routine, stabilize network,  checks the network for stability
    for clock suppression. The algorithm used is.

        1. Assign Clocks and Constants Only
        2. Simulate clocks for every phase until end of activity
        3. If the number of events per phase stabilizes then declare
           the network stabilized
        4. If the cycle limit is violated declare the network not stable

     All deterministic networks should be clock stable, but a network such
     as an incrementer with constants initializing the least significant bit
     would not be considered clock suppression stable. This sort of a result
     is highly unlikely.
*/

 stabilize_network()
 {
   register int j,i;
   int          clk_eve_array[MAX_PHASE],clk_stable[MAX_PHASE];
   int          clk_eve,flag_f=0;
   int          clk_stable_limit = 20;
   extern int   sum_changed_var,phase_count;

/* allocate temporary arrays to gauge when the clks will be stable */
   for(j=0; j < total_phasenum ; j++) {
         clk_eve_array[j]=0;
         clk_stable[j]=0;
         }
   while (1) {
          phase_count = 0;
          for(i=1;  i<=total_phasenum ; i++) {
                clk_eve = sum_changed_var;
                phase_count++;
                phase(i);    /* this simulate just stores values in
                                          phase field. */
                clk_eve = sum_changed_var - clk_eve;
                if (clk_eve==clk_eve_array[i-1]) clk_stable[i-1]=1;
                else clk_eve_array[i-1] clk_eve;
          }
          flag_f = 1;

          for(i=0 ; i< total_phasenum ; i++)  {
                if (clk_stable[i]==0) flag_f = 0;
          }
          clk_stable_limit--;
          if (clk_stable_limit==0) {
                printf("Clock stable limit violated\n");
                printf("Clk Suppression canceled \n");
                break;
                }
          if (flag_f) break;
     }
        for(j=1; j<= 5 ; j++) {
                for(i=1; i<  total_phasenum; i++)
                  {
                      phase(i);

                  }
        }
        phase_count = 0;
   }
```

```
/*****************************************************************************/
/***************          CREATE MODULE   INFORMATION ***********************/
/*****************************************************************************/
/* This module is the heart of static clock suppression. It does an analysis
   on each modules where it decides when and where this particular module
   should be scheduled during simulation. The flow of control in this module
   is as follows:

       allocate and clear the x event_array.
       allocate the mod info array (mod_info will be used during simulation)
       for every module:
          check if this node is affected by clocks
          if (not) go to next module
          get the "clock signature" for the module
          if the signature is a constant go to next module
          use the signature to generate the appropriate datastructures
               for the simulator
               record potential X->X events

       After all modules handled, patch the mod info datastructes for
       X->X events.
       update all clock suppressed nodes to reflect states only.

   The data structure generated is as follows:

    mod info ---> |------| (num_mods)
                  |  M1  |
                  |------|
                  |  M2  | ------- -------
                  |------|         #STATE|
                  |  M3  |         -------| ----
                  |------|         FLAG  |
                  |  ..  |         -------|
                  |------|         PHASE |       ------>  event 1
                                   -------|
                                   STEP  |
                                   -------| ----
                                   FLAG  |
                                   -------|
                                   PHASE |       ------>  event 2
                                   -------|
                                   FLAG  |
                                   -------| ----
                                    ...  |
                                    ...  |
                                   -------|
                                  ModSig1: (total phasenum)
                                   -------|
                                  ModSig2
                                  |-------
                                  | .....
                                  |-------

*/

create_mod_info()
{
   extern int *mod info;
   char *x_event_array;
   int  i,size,*mod_signature,num_state,x_ver;

   /* allocate memory for the module datastructures */
   size = sizeblk(num mods * sizeof(int));

   mod_info = (int *) getblk(size,1);
   size = sizeblk(num mods * sizeof(unsigned int));
   clk_schedule = (unsigned int *) getblk(size,1);

   size = sizeblk(num mods * sizeof(unsigned char));
   x_event_array = (char *)getblk(size,1);
   for (i=0; i< num_mods ; i++)
   {
      x_event_array[i] = 0;
      clk_schedule[i] = 0;
   }
   clean_module_step(3);
   /* allocate memory for the "state" signature of the module */
   /* this space is used for all modules */
   size = sizeblk((total phasenum + 1) * sizeof(int));
   mod_signature = (int *)getblk(size,1);

   for(i=0; i<num mods; i++)
   {
    register minst *modPtr = mods + i;
    register conns_ptr mod clkinp ptr;
    register conn mod clkinp;

    if (check no_clk_inputs(modPtr)) {
                mod info[i] = 0;
                eliminate constant(modPtr);
                continue;  /* set mod info is zero */
         }
    num_state = get signature(modPtr,mod signature);
    if (num_state==1) /* only constants feeding module */
        {
                mod info[i] = 0;
                eliminate constant(modPtr);
                continue;  /* set mod info is zero */
        }
    x_ver = 1;
    mod info[i] =
        set_mod_info(modPtr,mod signature,num_state,x event array,i,&x ver);
   }
 patch_x_events(x_event_array,sizeblk(num mods * sizeof(unsigned char)),
                                                mod signature);
 clean module step(1);
 set_node_states(mod signature);
}
```

```
/*******************************************************************************/
/*****************          PATCH  X EVENTS          ***************************/
/*******************************************************************************/

/* This routine is called after the initial pass through all modules.
   In the initial pass, all modules with the following property are
   identified in the x_event array: if a module has any outputs which
   X->X from one phase to the next, but have different module states for
   those phases, this module is flagged. This is done to catch the
   data dependent events where one X may be a 1 and the other a 0.

   Of course, the X->X events may propagate through more than one level
   of logic, thus this routine is setup as follows:

       while not finished(any modules left to Analyze) (or pass limit trips)

          go through all modules flagged in x event array
          get fanout for all outputs, and call resolve_xto to
               update mod_info datastructures.
               resolve xto will update x_event_array if more
                       evaluations are needed in the next pass.
          clear fanout traversed datastructures

       two arrays are not needed to distinguish between passes, because
       as long as the source is analyzed before the fanout, everything should
       be o.k.

       x event_array ---  INPUT  :  modules which need to be evaluated
       size xarray   ---  INPUT  :  size of x event array for freeblx
       mod_signature ---  -----  :  just scratch pad space.

*/


patch_x events(x_event array,size_xarray,mod_signature)
char    *x event_array;
int     size xarray;
int     *mod_signature;
{
int     i,finish_flag=1,size,num passes,numxmods;
char    *tmp_ptr,temp[100];


num passes = 20;
while (finish_flag)
    {
        num passes--;
        numxmods=0;
        if (num passes==0) break;
        finish flag=0;
        for(i=0; i<num mods ; i++)
            {
             register minst *modPtr = mods + i;

             if (x_event array[i] !=1) continue;
             x event_array[i] = 0; /* already analyzed */
             numxmods++;
             finish flag =1:  /* there are some modules left */

             /* resolve fanout modules */
             /* update new step/node/mod data structures */
             /* check for x_check */
             /* Modify tmp and iterate */
             {
              register const_ptr modResultPtr = modPtr->results;
              register conn modResult;
              for (; (modResult = *modResultPtr); modResultPtr++)
                    resolve xto(modResult,x event array,mod_signature,i);

              /* clear fanout traversed flag */
              modResultPtr = modPtr->results;
              for (; (modResult = *modResultPtr); modResultPtr++)
                 {
                   if (modResult->fro0)  modResult->fro0->traversed = FALSE;
                   if (modResult->fro1)  modResult->fro1->traversed = FALSE;
                 }
             }
#ifdef DEBUG
         printf("Num X Mods: %d \n",numxmods);
#endif
    }

   freeblx(x event array,size xarray,0);
}
```

```
/*************************************************************************/
/****************       RESOLVE X:0                 *********************/
/*************************************************************************/
/* This routine propogates the X->X event information into the module
   structures. This usually means one of the following:

        1. adding a new evaluation event
        2. updating the evaluation step of an old event

   The process is as follows:

        for the module:
                get the new signature
                use this signature to update module datastructures.
                if nothing changed set mod_info returns a zero in the X VER
                field, and the module need not be analyzed in the next pass.

        modResult       INPUT :  module output
        tmpx array      OUTPUT:  update for next pass of patch_x events
        mod signature ----- :  scratch pad space
        modNum          INPUT :  module number
*/

resolve_xfo(modResult,tmpx_array,mod_signature,modNum)
conn modResult;
char     **tmpx_array;
int      *mod signature,modNum;
{
 fanout_ptr zFanOutPtr= modResult->zno0;
 fanout_ptr uFanOutPtr   modResult->unel;


 if (zFanOutPtr) {
        register minst no *ma = zFanOutPtr->mods_affected;
        int minstpos;  /* for each unit delay fanout module */

         if (zFanOutPtr->traversed==TRUE) return;
         else zFanOutPtr->traversed=TRUE;
        while ((minstpos = *ma++) != END) {
                minst    *modPtr = mods + minstpos;
                int      num state,x_ver;

                num state = set_signature(modPtr,mod signature);
                /* check signature maybe needed */
                x_ver = 0;
                set mod info(modPtr,mod signature,num state,tmpx array,
                                                minstpos,&x_ver);

                /* nothing changed so no X->X evaluation needed */
                if (x_ver) tmpx array[minstpos]=0;
            }       /* while */


        }


  if (uFanOutPtr) {
        register minst_no *ma = uFanOutPtr->mods_affected;
        int minstpos; /* for each unit delay fanout module */

         if (uFanOutPtr->traversed==TRUE) return;
         else uFanOutPtr->traversed=TRUE;


        while ((minstpos = *ma++) != END) {
                minst    *modPtr = mods + minstpos;
                int      num_state,x_ver;

                num state = set signature(modPtr,mod signature);
                /* check signature maybe needed */
                x ver = 0;
                set mod_info(modPtr,mod_signature,num state,tmpx array,
                                                minstpos,&x ver);

                /* nothing changed so no X->X evaluation needed */
                if (x ver) tmpx_array[minstpos]=0;
            }       /* while */

        }       /* if traversed */
}
```

```
/**************************************************************************/
/****************          CHCK NO CLK INPUTS          *****************************/
/**************************************************************************/

/*  quick check to see if any inputs have the clock suppressed datastructures
    which were created during collection time.

    modPtr INPUT :    pointer module

 */
check_no_clk_inputs(modPtr)
mInst   *modPtr;
{
    conns_ptr mod_clksup_ptr;
    conn  *mod_clksup;

    mod_clksup_ptr = modPtr->inputs;
    for(; (mod_clksup= *mod_clksup_ptr); mod_clksup_ptr++)
        {
            if (mod_clksup->clk_sup ==0)    return(0);
        }
    mod_clksup_ptr = modPtr->zinputs;
    for(; (mod_clksup= *mod_clksup_ptr); mod_clksup_ptr++)
        {
            if (mod_clksup->clk_sup!=0)    return(0);
        }
    return(1);
}

/**************************************************************************/
/****************          ELIMINATE CONSTANTS          ****************************/
/**************************************************************************/

/* This routine eliminates the clock suppression datastructures for routines.
   These structures were created during collection because constants have
   a non X value after presimulation, but since this value does not
   change, there is no need to keep this information.

    modPtr INPUT :    pointer module
*/
eliminate_constant(modPtr)
mInst   *modPtr;
{
    conns_ptr mod_clksup_ptr;
    conn  *mod_clksup;
    node_t  *nodePtr;

    mod_clksup_ptr = modPtr->inputs;
    for(; (mod_clksup= *mod_clksup_ptr); mod_clksup_ptr++)
        {
            if (mod_clksup->clk_sup==0) continue;
            nodePtr = (node_t *)*(mod_clksup->clk_sup);
            nodePtr->H.clk_sup = 0;
            nodePtr->L.clk_sup = 0;
        }
    mod_clksup_ptr = modPtr->zinputs;
    for(; (mod_clksup= *mod_clksup_ptr); mod_clksup_ptr++)
        {
            if (mod_clksup->clk_sup==0) continue;
            nodePtr = (node_t *)*(mod_clksup->clk_sup);
            nodePtr->H.clk_sup = 0;
            nodePtr->L.clk_sup = 0;
        }
    mod_clksup_ptr = modPtr->results;

    for(; (mod_clksup= *mod_clksup_ptr); mod_clksup_ptr++)
      {
            if (mod_clksup->clk_sup==0) continue;
            nodePtr = (node_t *)*(mod_clksup->clk_sup);
            nodePtr->H.clk_sup = 0;
            nodePtr->L.clk_sup = 0;
        }

}
```

```
/*****************************************************************************/
/****************          SET SIGNATURE          *************************/
/*****************************************************************************/
/*

  This routine generates a signature for a module given the input AND output
  waveforms. It does so on the assumption that the module itself is
  completely combinational, and the input/outputs are the only state elements.
  Given this, a "Clock Suppression State" for a module is just a unique
  set of inputs/outputs.  For example, given a module with 2 clock inputs
  and 1 clock outputs with the following waveforms: (4 phase)

        IN1 IN2 | OUT          STATE
        -------------          ------
         0   0    X              1
         0   1    X              2
         1   1    1              3
         0   0    X              1

   modPtr               INPUT :   pointer module
   mod_signature        OUTPUT:   results of "state" analysis.

        The size of mod_signature is nphases + 1 such that the interaction
        with phase (total phasenum) with phase 1.

*/

set_signature(modPtr,mod_signature)
MINST    *modPtr;
int      *mod_signature;
{
    int          state,j,w;

    for(j=0 ; j <= total_phasenum; j++) mod_signature[j] = 0;
    state = 0;
    for (j=1 ; j <= total_phasenum; j++)
      {
          if (mod_signature[j-1]!=0) continue;
          state++;
          mod_signature[j-1] = state;
          for(w=j+1 ; w<=total_phasenum; w++)
            {
              if (state_equal(modPtr,j,w)) mod_signature[w-1] = state;
            }
      }
     mod_signature[total_phasenum] = mod_signature[0];
     return(state);
}
```

```
/*****************************************************************************/
/****************          STATE EQUAL          ***************************/
/*****************************************************************************/

/* state equal checks to see that for every input/output, two phases are
   the same as far as inputs and outputs.

   Presently both inputs and outputs of the module is used in the analysis.
   It may be that later outputs can be removed, thus reducing the number of
   events.

    modPtr                   INPUT :   pointer module
    [illegible]              INPUT :   phase numbers
 */

state_equal(modPtr,[illegible])
MINST *modPtr;
int      [illegible]
{
    [illegible] mod_clksup_ptr;
    [illegible] mod_clksup;
    machine_word    val_h,val_l;
    NODE_t          *nodePtr;

    mod_clksup_ptr = modPtr->inputs;
    for(; (mod_clksup= *mod_clksup_ptr); mod_clksup_ptr++)
      {
          if (mod_clksup->clk_sup== 0) continue;
          nodePtr = (NODE_t *)*(mod_clksup->clk_sup);
          val_l = *(nodePtr->L.clk_sup+[illegible]);
          val_h = *(nodePtr->H.clk_sup+[illegible]);
          if (val_l!= *(nodePtr->L.clk_sup+[illegible]))  return(0);
          if (val_h!= *(nodePtr->H.clk_sup+[illegible]))  return(0);
      }
    mod_clksup_ptr = modPtr->outputs;
    for(; (mod_clksup= *mod_clksup_ptr); mod_clksup_ptr++)
      {
          if (mod_clksup->clk_sup==0) continue;
          nodePtr = (NODE_t *)*(mod_clksup->clk_sup);
          val_l = *(nodePtr->L.clk_sup+[illegible]);
          val_h = *(nodePtr->H.clk_sup+[illegible]);
          if (val_l!= *(nodePtr->L.clk_sup+[illegible]))  return(0);
          if (val_h!= *(nodePtr->H.clk_sup+[illegible]))  return(0);
      }
    mod_clksup_ptr = modPtr->results;
    for(; (mod_clksup= *mod_clksup_ptr); mod_clksup_ptr++)
      {
          if (mod_clksup->clk_sup==0) continue;
          nodePtr = (NODE_t *)*(mod_clksup->clk_sup);
          val_l = *(nodePtr->L.clk_sup+[illegible]);
          val_h = *(nodePtr->H.clk_sup+[illegible]);
          if (val_l!= *(nodePtr->L.clk_sup+[illegible]))  return(0);
          if (val_h!= *(nodePtr->H.clk_sup+[illegible]))  return(0);
      }
    return(1);
}
```

```
/****************************************************************************/
/****************          SET MODE INFO              ************************/
/****************************************************************************/
/*

    This routine sets the module datastructures for a particular module.
    The flow of operations is as follows:

         use the mod signature to check translations which this module
         sees a change on it's inputs.

    modPtr  INPUT         :  module
    mod_signature INPUT   :  module signature
    num_state             :  number of states
    x_event_array         :  array for X->X transistions
    x_ver                 :  in normal mode or X pulse mode
*/
set_mod_info(modPtr,mod_signature,num_state,x_event_array,modNum,x_ver)
minst    *modPtr;
int      *mod_signature,num_state;
unsigned char  *x_event_array;
int       modNum,*x_ver;
{

int                  size,i,j,num_trans,flagx;
int                 *tmp_ptr,*return_ptr,*state_update,tmp_val,get_x_step();

  if (*x_ver) {
      size = 3 * (total_phasenum + 1) + 1;    /* all translations */
      size = size + total_phasenum + 2;
      size = sizeblk(size  * sizeof(int));
      return_ptr = (int *) getblk(size,1);
     }
  else return_ptr = (int *) mod_info[modNum];

    if (return_ptr==0) {
/*                printf("Zero Mod %x \n",modPtr->name);   */
                  return(0);
                  }
    tmp_ptr = return_ptr;
    num_trans = 0;
    flagx = 1;
    for(i=0; i < total_phasenum; i++)
      {
            if (mod_signature[i] != mod_signature[i+1]) {
                /* state change */
                if (output_known(modPtr,i+2,modNum)) continue;
                  /* if output known why schedule */
                num_trans++;

                /* generate a flag as to which phase state is associated
                   with which event */

                tmp_ptr++;
                tmp_val = *tmp_ptr;
                *tmp_ptr = get_flag(mod_signature,mod_signature[i+1],i);
                if (*tmp_ptr != tmp_val) flagx=0;

                tmp_ptr++;
                tmp_val = *tmp_ptr;
                if (i+2 == total_phasenum + 1) *tmp_ptr = 1;
                else *tmp_ptr = i+2;
                if (*tmp_ptr!=tmp_val) flagx=0;

                tmp_ptr++;
                /*  get the evaluation step */
                *tmp_ptr = get_x_step(modPtr,i+2);

                if (*tmp_ptr > max_clk_step) max_clk_step = *tmp_ptr;

                /*  detection of X->X step */
                if (output_known(modPtr,i+1,modNum)==0)
                        update_x_trans(modPtr,modNum,x_event_array,i+2,
                                                                *tmp_ptr);
                }
      }

    /* nothing changed with this evaluation */
    if (flagx) *x_ver=1;   else *x_ver = 0;

    *return_ptr = num_trans;
    tmp_ptr = return_ptr + 3 * (total_phasenum + 1) + 1;
    *tmp_ptr = num_state;
    tmp_ptr++;

    /* update mod signature to datastructures */
    for(i=0; i < total_phasenum + 1; i++)
      {
        tmp_ptr[i] = mod_signature[i];
        }

    return((int) return_ptr);
}
```

```
/*************************************************************************/
/****************          UPDATE X TRANS            ********************/
/*************************************************************************/

/* X->X translation has happened on one of the outputs of this
   module.

   modPtr       INPUT:          module
   modNum       INPUT:          module (same as modPtr)
   x_event array INPUT:         array to queue further x patch evaluation
   ph           INPUT  :        phase being evaluate
   mstep        INPUT  :        step  (maximum) to module
   */

update_x_trans(modPtr,modNum,x_event_array,ph,mstep)
mlist  *modPtr;
int     modNum;
unsigned char  *x_event_array;
int     ph,mstep;
{
    conns_ptr mod_clksup_ptr;
    conn  *mod_clksup;
    int   clk_node = 0;
    unsigned int           mask,val_h,val_l,val;
    node_t                 *nodePtr;

/* use mask to show difference between X1 vs X2, use phase run as
   indicator */
if (ph==total_phasenum-1) ph = -1;
mask = 0x80000000;
mask = mask >> ph ;
mask = mask ^ 0xFFFFFFFF;

/* go through all outputs, and set step to mstep  */

mod_clksup_ptr = modPtr->results;
for(; (mod_clksup= *mod_clksup_ptr); mod_clksup_ptr++)
  {
        if (mod_clksup->clk_sup==0) continue;
        clk_node = 1;
        nodePtr = (node_t *) *(mod_clksup->clk_sup);
        val_h = *(nodePtr->H.clk_sup + ph);
        val_l = *(nodePtr->L.clk_sup + ph);
        /* for null outputs with one known and all else unknown */
        if ((val_h==0) || (val_l==0))  continue;
        val = *(mod_clksup->clk_sup + ph);
        val = val & mask;
        *(mod_clksup->clk_sup + ph) = val;
        *(mod_clksup->clk_sup + total_phasenum + ph)   mstep;
        }
if (clk_node==0) return;   /* not any clk sup nodes */

 x_event_array[modNum] = 1; /* queue this module for further evaluation */

#ifdef DEBUG
 printf("X PROP Mod %s   Phase: %d,%d\n",modPtr->name,ph,mstep);
#endif
}

/* get the flag for this state */

get_flag(mod_signature,state)
int *mod_signature,state;
{
int       i,flag_f;

   flag_f = 0;
for(i 0; i<total_phasenum; i++)
  {
     if (mod_signature[i]==state) flag_f = flag_f | (1<<i);
   }
return(flag_f);
}
```

```
/***************************************************************************/
/****************            GET_M_STEP            ************************/
/***************************************************************************/

/*   This module gets the maximum step number for a module during a particular
     phase (phase_n).
*/

int get_m_step(modPtr,phase_n)
minst    *modPtr;
int      phase_n;
{

     int          maxu_step =0,maxs_step=0,*old_tmp_ptr;
     conns_ptr mod_clksup_ptr;
     conn   mod_clksup;
     int      step_n,max_out_step= -1;

     if (phase_n==total_phasenum+1) phase_n= 1;
     mod_clksup_ptr = modPtr->inputs;
     for(; (mod_clksup= *mod_clksup_ptr); mod_clksup_ptr++)
        {
          if (mod_clksup->clk_sup==0) continue;
          step_n = *(mod_clksup->clk_sup + total_phasenum + phase_n);
          if( step_n > maxu_step) maxu_step = step_n;
        }

     mod_clksup_ptr = modPtr->sinputs;
     for(; (mod_clksup= *mod_clksup_ptr); mod_clksup_ptr++)
        {
          if (mod_clksup->clk_sup==0) continue;
          step_n = *(mod_clksup->clk_sup + total_phasenum + phase_n);
          if( step_n > maxs_step) maxs_step = step_n;
        }

     maxu_step++;
     if (maxu_step > maxs_step) return(maxu_step);
     else return(maxs_step);

}
```

```
/***************************************************************************/
/****************            OUTPUT_KNOWN            **********************/
/***************************************************************************/

/* This routine checks to see if all outputs of this particular module are
   known during this phase */

output_known(modPtr,phase_n,modNum)
minst    *modPtr;
int      phase_n;
int      modNum;

{
     conns_ptr mod_clksup_ptr;
     conn   mod_clksup;
     node_t        *nodePtr;
     unsigned      int   *valh,*vall,output_sens,num_outs=0;

     output_sens = 0;
     num_outs 0;
     if (phase_n==total_phasenum+1) phase_n = 1;
     mod_clksup_ptr = modPtr->results;
     for(; (mod_clksup= *mod_clksup_ptr); mod_clksup_ptr++)

          num_outs++;
          if (mod_clksup->clk_sup==0)
               {
                    output_sens = 1;
                    continue;
               }
          nodePtr = (node_t *) *(mod_clksup->clk_sup);
          if ((*(nodePtr->h.clk_sup + phase_n)!=0 ) &&
               (*(nodePtr->l.clk_sup + phase_n)!=0 ))  return(0);
          }


     if (output_sens==0) return(1);

/*   If the outputs are not clock suppressed nodes, they could be
     insensitive to the inputs based on the clocks, such as
     a latch.  */

/*   deal only with single output modules for now, so if multiple output
     exit with zero */
     if (num_outs>2) return(0);
     return(1);
#if 0
/*   if output known then exit, it is a constant */

     mod_clksup_ptr = modPtr->results;
     for(; (mod_clksup= *mod_clksup_ptr); mod_clksup_ptr++)
          {
               if (mod_clksup->only==0)
                                        return(1);
          }
/*   set up the inputs to the values for this phase */
     clksup_update_inps(modPtr,phase_n);

/*   force outputs to be ONE */
     clksup_update_out(modPtr,1);

/*   evaluate module, if dynamic solution, tell that outputs have changed */

     if ((dyn->instance_top) &&
          ((top->dyn->instance_top[modNum] ) != (TOPOLOGY_S *)DYN_IGNORE))
```

```
            /* Scan all the state element records. */
            while (sptr != firstptr) {
                register modelemptr modsptr = sptr->modelemp;
                register machine word newvalue;
                register bool addckt = FALSE;

                /* Check all module element records. */
                for (; modsptr != NULL; modsptr = modsptr->next)
                    if (goodvalue != GET_NEWST(modsptr))
                        { addckt = TRUE; isOldEvent = TRUE; break; }

                /* If good value != faulty value,                  */
                /* insert circuit id into circuit event list.      */
                if (addckt || goodvalue != (newvalue = GET_NEWST(sptr))) {
                    insertckt(firstpos, sptr->circuit, TRUE);
                    if (!isOld) insertckt(firstpos, sptr->circuit, FALSE);
                }

                /* Otherwise, delete state element record if possible. */
                else if (goodvalue == newvalue && !GET_STUCK(sptr)) {
                    if (sptr->modelemp == NULL) {
                        register elemptr freeptr = sptr;
                        register elemptr nextptr = sptr->next;
                        register elemptr prevptr = sptr->prev;
                        prevptr->next = nextptr; nextptr->prev = prevptr;
                        sptr = sptr->next;
                        free_rec(elem mgr, (pointer) freeptr);
                        continue;
                    }
                    else { /* sptr->modelemp != NULL */
                        register modelemptr modsptr = sptr->modelemp;
                        sptr->module = modsptr->module;
                        sptr->field = modsptr->field;
                        sptr->modelemp = modsptr->next;
                        free_rec(modelem mgr, (pointer) modsptr);
                        sptr = sptr->next;
                        continue;
                    }
                }
                sptr = sptr->next;
            }
        }

        /* for each unit-delay input variable */
        modInputPtr = (mode ? minstport->inputs;
        for (; (modInput = *modInputPtr); modInputPtr++) {
                      fifoptr          fifop         = modInput->fifo;
                      elemptr          firstptr      = fifop->elemp;
            register elemptr           sptr          = firstptr->next;
            register machine word goodvalue = GET_NEWST(firstptr);
            fifop->shadow = firstptr;

            /* Scan all the state element records. */
            while (sptr != firstptr) {
                register modelemptr modsptr = sptr->modelemp;
                register machine word newvalue;
                register bool addckt = FALSE;

                /* Check all module element records. */
                for (; modsptr != NULL; modsptr = modsptr->next)
                    if (goodvalue != GET_NEWST(modsptr))
                        { addckt = TRUE; break; }

                /* If good value != faulty value,                  */
                /* insert circuit id into circuit event list.      */
                if (addckt || goodvalue != (newvalue = GET_NEWST(sptr)))
                    insertckt(firstpos, sptr->circuit, FALSE);

                /* Otherwise, delete state element record if possible. */
                else if (goodvalue == newvalue && !GET_STUCK(sptr)) {
                    if (sptr->modelemp == NULL) {
                        register elemptr freeptr = sptr;
                        register elemptr nextptr = sptr->next;
                        register elemptr prevptr = sptr->prev;
                        prevptr->next = nextptr; nextptr->prev = prevptr;
                        sptr = sptr->next;
                        free_rec(elem mgr, (pointer) freeptr);
                        continue;
                    }
                    else { /* sptr->modelemp != NULL */
                        register modelemptr modsptr = sptr->modelemp;
                        sptr->module = modsptr->module;
                        sptr->field = modsptr->field;
                        sptr->modelemp = modsptr->next;
                        free_rec(modelem mgr, (pointer) modsptr);
                        sptr = sptr->next;
                        continue;
                    }
                }
                sptr = sptr->next;
            }
        }
    }
}

/* Simulate one unit step.
/*     FIRST  PASS : Call update procedure, schedule the events.  */
/*     SECOND PASS : Clear old lists, check more events.          */
/*     THIRD  PASS : Swap old and new lists, update old states.   */
void step()
{
    machine word    *randOrigins = rand origins;
    machine word    *oldIndex    = old index;
    machine word    *newIndex    = new index;
            int     *oldStart    = old start;
            int     *newStart    = new start;
            int     numRanks     = num ranks;
            cktptr  *oldCktStart = old cktstart;
            cktptr  *newCktStart = new cktstart;
            bool    *oldFlag     = old flag;
            bool    *newFlag     = new flag;

    /*
    /*
    /*                          FIRST PASS                               */
    /*                                                                   */
    /* for each module M in old module event list ordered by rank        */
    /*     for each circuit C in old circuit event list of M             */
    /*         packing each input variable of M;                         */
    /*         unpacking each output variable of M;                      */
    /*     call update procedure to M;                                   */
    /*     for each circuit C in old circuit event list of M             */
    /*         unpacking each output variable of M;                      */
    /*         if old state != new state                                 */
    /*             put it on update list;                                */
    /*             put zero delay fanout in old event list;              */
    /*             put unit delay fanout in new event list;              */
    {
        int rank;
        int evalCount = 0;
        isStable = TRUE;
```

```
/* for each rank */
for (rank = 0; rank < numRanks; rank++) {
   int last = *(oldIndex + rank);
   int offset;

   /* for each element of specified rank in old event list */
   for (offset = *(rankOrigins + rank); offset < last; offset++) {
      int mIndex = *(oldStart + offset);
      cktptr packPtr = *(oldCktStart + mIndex);
      cktptr unpackPtr = packPtr;
      minst *mP = mode + mIndex;

      /* packing and unpacking */
      while (packPtr) {

         /* Clear old value field of unit delay input variable. */
         {
            register conns_ptr mInP = mP->inputs;
            register conn mIn;
            for (; (mIn = *mInP); mInP++) mIn->old = Const_0;
         }

         /* Clear new value field of zero delay input variable. */
         {
            register conns_ptr zmInP = mP->zinputs;
            register conn zmIn;
            for (; (zmIn = *zmInP); zmInP++) zmIn->new = Const_0;
         }

         /* Clear old value field of output variable. */
         {
            register conns_ptr mOutP = mP->results;
            register conn mOut;
            for (; (mOut = *mOutP); mOutP++) mOut->old = Const_0;
         }

         /* packing for each circuit */
         {
            cktptr cktp = packPtr;
            int count = 0;

            for (; cktp && count < NWORD; cktp = cktp->next, count++) {
               register int cir = cktp->circuit;

               /* Pack for each unit delay input variable. */
               {
                  conns_ptr mInP = mP->inputs;
                  conn mIn;

                  for (; (mIn = *mInP); mInP++) {
                              finfptr  finfp    = mIn->finfp;
                              elemptr  fp       = finfp->elemp;
                     register elemptr  sp       = finfp->shadow;
                     register machine_word value = GET_STAT(fp);

                     /* Find state element record for each circuit. */
                     if (cir != 0) {

                        /* Try to find out circuit id. */
                        if (sp->circuit < cir) {
                           sp = sp->next;
                           while (sp->circuit < cir && sp != fp)
                              sp = sp->next;
                        }
                        else while (sp->circuit > cir) sp = sp->prev;

                        /* Assign shadow pointer. */
                        finfp->shadow = sp;

                        /* If circuit found, try to find module. */
                        if (sp->circuit == cir) {
                           register int smod = sp->module;

                           if (smod == mIndex) value = GET_NEWST(sp);
                           else { /* sp->module != mIndex */
                              register modelemptr modsp = sp->modelemp;
                              if (smod == ALL) value = GET_NEWST(sp);
                              while (modsp) {
                                 register int modSpMod = modsp->module;
                                 if (modSpMod == mIndex)
                                    { value = GET_NEWST(modsp); break; }
                                 else if (modSpMod < mIndex) break;
                                 modsp = modsp->next;
                              }
                           }
                        }
                     }
                     PUT_VAL(mIn->old, value, count);
                  }
               }

               /* Pack for each zero delay input variable. */
               {
                  conns_ptr minP = mP->zinputs;
                  conn mIn;

                  for (; (mIn = *minP); mIn++) {
                              finfptr  finfp    = mIn->finfo;
                              elemptr  fp       = finfp->elemp;
                     register elemptr  sp       = finfp->shadow;
                     register machine_word value = GET_NEWST(fp);

                     /* Find state element record for each circuit. */
                     if (cir != 0) {

                        /* Try to find out circuit id. */
                        if (sp->circuit < cir) {
                           sp = sp->next;
                           while (sp->circuit < cir && sp != fp)
                              sp = sp->next;
                        }
                        else while (sp->circuit > cir) sp = sp->prev;

                        /* Assign shadow pointer. */
                        finfp->shadow = sp;

                        /* If circuit found, try to find module. */
                        if (sp->circuit == cir) {
                           register int smod = sp->module;

                           if (smod == mIndex) value = GET_NEWST(sp);
                           else { /* sp->module != mIndex */
                              register modelemptr modsp = sp->modelemp;
                              if (smod == ALL) value = GET_NEWST(sp);
                              while (modsp) {
                                 register int modSpMod = modsp->module;
                                 if (modSpMod == mIndex)
                                    { value = GET_NEWST(modsp); break; }
                                 else if (modSpMod < mIndex) break;
                                 modsp = modsp->next;
                              }
                           }
```

```
            }
            PUT_VAL(min->new, value, count);
        }
    }

    /* Pack for each output variable. */
    {
        conns_ptr rOutP = m?->results;
        conn rOut;

        for (; (rOut = *rOutP); rOutP++) {
                  finfptr   finfp      = rOut->finfo;
                  elemptr   fp         = finfp->elemp;
            register elemptr   sp      = finfp->shadow;
            register machine_word value = GET_OLDST(fp);

            /* Find state element record for each circuit. */
            if (cir != 0) {

                /* Try to find out circuit id. */
                if (sp->circuit < cir) {
                    sp = sp->next;
                    while (sp->circuit < cir && sp != fp)
                        sp = sp->next;
                }
                else while (sp->circuit > cir) sp = sp->prev;

                /* Assign shadow pointer. */
                finfp->shadow = sp;

                /* If circuit found, try to find module. */
                if (sp->circuit == cir) {
                    register int smod = sp->module;

                    if (smod == mIndex) value = GET_NEWST(sp);
                    else { /* sp->module != mIndex */
                        register nodelemptr modsp = sp->modelemp;
                        if (smod == ALL) value = GET_NEWST(sp);
                        while (modsp) {
                            register int modSpMod = modsp->module;
                            if (modSpMod == mIndex)
                                { value = GET_NEWST(modsp); break; }
                            else if (modSpMod < mIndex) break;
                            modsp = modsp->next;
                        }
                    }
                }
            }
            PUT_VAL(rOut->old, value, count);
        }
    }
    }
    packPtr = cstp;
    Neval = count;
}

/* Call update procedure. */
(* m?->mod)(m?->results, m?->inputs, m?->zinputs);
evalCount++;
if (checkFreeze) restore_freeze();

/* unpacking for each circuit */
{
    cstptr skip = unpackPtr;

    for (; skip != packPtr; skip = skip->next) {
        register int        cir      = skip->circuit;
                 conns_ptr  rOutP    = m?->results;
                 conn       rOut;

        /* Unpack for each output variable. */
        for (; (rOut = *rOutP); rOutP++) {
            register machine_word value = rOut->new & Const_1;
                     finfptr  finfp      = rOut->finfp;
                     elemptr  fp         = finfp->elemp;
            rOut->new >>= 1;

            if (cir == 0) { /* for good circuit */

                /* Update new state. */
                PUT_NEWST(fp, value);

                /* If new state != old state */
                if (value != GET_OLDST(fp)) {

                    /* Insert in update list. */
                    if (!finfp->flag) {
                        *updateListPtr++ = rOut;
                        finfp->flag = TRUE;
                    }

                    /* for zero delay fanout */
                    {
                        fanout_ptr fanP = rOut->fanO;

                        if (fanP) {
                            [illegible]
                            [illegible]
                            register int mPos;

                            /* Insert into circuit event list. */
                            [illegible]
                            for (; [illegible]; [illegible]) {
                                register cstptr ptr =
                                    *(n cCktStart + mPos);

                                if (ptr == NULL)
                                    *(n cCktStart+mPos) = new_cstptr(0);
                                else if (ptr->circuit != 0) {
                                    register cstptr newptr =
                                        new_cstptr(0);
                                    newptr->next = ptr;
                                    *(n cCktStart + mPos) = newptr;
                                }

                            /* since good state was changed */
                            {
                                cstptr cstm = *(n cCktStart+mPos);
                                conns_ptr mIn = (mod+mPos)->zinputs;
                                conn min;

                                /* for each zero delay input */
                                for(; (min = *minP); minP++) {
                                    elemptr mfp = min->finfo->elemp;
                                    elemptr msp = mfp->next;
                                    machine_word gVal = GET_NEWST(mfp);
                                    [illegible]

                                    /* Scan all state records. */
                                    for (; [illegible]; msp = msp->next) {
                                        register nodelemptr modsp =
```

```
            nsp->mode_enp;
        register bool addckt = FALSE;

        for (;modsp;modsp=modsp->next)
            if (qVal!=GET_NEWST(modsp))
                { addckt=TRUE; break; }

        if (addckt ||
            GET_NEWST(nsp)!=qVal) {
            register int sckt =
                nsp->circuit;

            while(nptr->circuit!=sckt){
                register cktptr nextP =
                    nptr->next;
                if (nextP == NULL) {
                    nptr->next =
                        new_cktptr(sckt);
                    break;
                }
                if(nextP->circuit>sckt){
                    register cktptr newP=
                        new_cktptr(sckt);
                    newP->next = nextP;
                    nptr->next = newP;
                    break;
                }
                nptr = nextP;
            }
          }
        }
      }
    }
  }

  /* insert into module event list.*/
  if (!fanP->traversed) {
    fanP->traversed = TRUE;
    na = save_na;
    for(; (nPos = *na) != END;na++) {
      if (!(*(oldFlag + nPos))) {
        *(oldStart + (*(oldIndex +
          (mods+nPos)->rank))++) = nPos;
        *(oldFlag + nPos) = TRUE;
      }
    }
  }
 }
}

/* for unit delay fanout */
{
  fanout_ptr fanP = nOut->fcol;

  if (fanP) {
    mfrst_nc *save_na = fanP->mods_affected;
    mfrst_nc *na;
    register int nPos;

    /* insert into circuit event list.*/
    na = save_na;
    for (; (nPos = *na) != END; na++) {
      register cktptr ptr =
        *(newCktstart + nPos);

      if (ptr == NULL)
        *(newCktstart + nPos) = new_cktptr(0);
      else if (ptr->circuit != 0) {
        register cktptr newptr =
          new_cktptr(0);
        newptr->next = ptr;
        *(newCktstart + nPos) = newptr;
      }

      /* since good state was changed */
      {
        cktptr ncktp = *(newCktstart+nPos);
        conns_ptr nInP=(mods+nPos)->inputs;
        conn nIn;

        /* for each unit delay input */
        for(; (nIn= *nInP); nInP++) {
          eleptr nip = nIn->finfo->elemp;
          elemptr nsp = nip->next;
          unsigned word qVal=GET_NEWST(nip);
          cktptr nptr = ncktp;

          /* Scan all state records. */
          for (; nsp; nsp = nsp->next) {
            register modelemptr modsp =
              nsp->mode_enp;
            register bool addckt = FALSE;

            for (;modsp;modsp=modsp->next)
              if (qVal!=GET_NEWST(modsp))
                { addckt=TRUE; break; }

            if (addckt ||
              GET_NEWST(nsp)!=qVal) {
              register int sckt =
                nsp->circuit;

              while(nptr->circuit!=sckt){
                register cktptr nextP =
                  nptr->next;
                if (nextP == NULL) {
                  nptr->next =
                    new_cktptr(sckt);
                  break;
                }
                if(nextP->circuit>sckt){
                  register cktptr newP=
                    new_cktptr(sckt);
                  newP->next = nextP;
                  nptr->next = newP;
                  break;
                }
                nptr = nextP;
              }
            }
          }
        }
      }
    }

    /* insert into module event list.*/
    if (!fanP->traversed) {
      fanP->traversed = TRUE;
      na = save_na;
      for(; (nPos = *na) != END;na++) {
        if (!(*(newFlag + nPos))) {
          *(newStart + (*(newIndex +
```

```
                        (fcds->nPos)->rank))++) = nPos;
                    *(newFlag + *Pos) = TRUE;
                }
            }
        }
    }

else { /* cir != 0 (faulty circuit) */
    machine word gVal = GET_NEWST(fp);
    register elemptr sp = finfp->shadow;
    bool schedule = FALSE;
    int sckt;

    /* Try to find out circuit id. */
    if (sp->circuit < cir) {
        sp = sp->next;
        while (sp->circuit < cir && sp != fp)
            sp = sp->next;
        if (sp == fp) sp = sp->prev;
    }
    else { /* sp->circuit >= cir */
        while (sp->circuit > cir) sp = sp->prev;
        if (sp == fp) sp = sp->next;
    }

    /* If not found and different from good value, */
    /* insert state element record with new value. */
    if ((sckt = sp->circuit) != cir) {
        if (gVal != value) {
            schedule = TRUE;

            /* Insert an element just before element */
            /* referenced by shadow pointer.          */
            if (sckt > cir) {
                register elemptr elemp =
                    new elemptr(cir,FALSE,value,gVal,ALL);
                register elemptr prevptr = sp->prev;
                elemp->next = sp; elemp->prev = prevptr;
                prevptr->next = elemp; sp->prev = elemp;
                finfp->shadow = elemp;
            }

            /* Insert an element just after element */
            /* referenced by shadow pointer.         */
            else { /* sckt < cir */
                register elemptr elemp =
                    new elemptr(cir,FALSE,value,gVal,ALL);
                register elemptr nextptr = sp->next;
                elemp->next = nextptr; elemp->prev = sp;
                sp->next = elemp; nextptr->prev = elemp;
                finfp->shadow = elemp;
            }
        }
    }

    /* If circuit found, try to find out module id. */
    else { /* sp->circuit == cir */
        finfp->shadow = sp;

        if (sp->module == ALL) {
            if (!GET_STUCK(sp)) {
                PUT_NEWST(sp, value);
                if (value!=GET_OLDST(sp)) schedule=TRUE;
            }
        }
        else { /* sp->module != ALL */
            register int module = sp->module;
            register *modelemptr newptr =
                new modelemptr(0, 0, 0, module);
            newptr->field = sp->field;
            newptr->next = sp->modelemp;
            sp->module = ALL; sp->modelemp = newptr;
            PUT_NEWST(sp, value); PUT_OLDST(sp, gVal);
            PUT_STUCK(sp, FALSE);
            if (value != gVal) schedule = TRUE;
        }
    }

    /* Need to schedule events. */
    if (schedule) {

        /* Insert it on update list. */
        if (!finfp->flag) {
            *updateListPtr++ = [illegible];
            finfp->flag = TRUE;
        }

        /* for zero delay fanout */
        {
            fanout ptr fanP = [illegible];

            if (fanP) {
                [illegible] fanP->node_affected;
                [illegible];
                register int nPos;

                /* Insert into circuit event list.*/
                [illegible] = save [illegible];
                for ([illegible] != END; [illegible]++) {
                    register cktptr ptr =
                        *(oldCktstatus + nPos);
                    register int [illegible];

                    if (ptr == NULL)
                        *(oldCktstatus+nPos)=new cktptr(cir);
                    else if ((ptrckt=ptr->circuit)!=cir) {
                        if (ptrckt > cir) {
                            register cktptr newptr =
                                new cktptr(cir);
                            newptr->next = ptr;
                            *(oldCktstatus + nPos) = newptr;
                        }
                        else {
                            while (ptr->circuit != cir) {
                                register cktptr nextptr =
                                    ptr->next;
                                if (nextptr == NULL) {
                                    ptr->next = new cktptr(cir);
                                    break;
                                }
                                if (nextptr->circuit > cir) {
                                    register cktptr newptr =
                                        new cktptr(cir);
                                    newptr->next = nextptr;
                                    ptr->next = newptr;
                                    break;
                                }
                                ptr = nextptr;
```

```
                }
            }
        }

        /* Insert into module event list.*/
        if (!fanP->traversed) {
            fanP->traversed = TRUE;
            ma = save ma;
            for(; (mPos = *ma) != END;ma++) {
                if (!(*(oldFlag + mPos))) {
                    *(oldStart + (*(oldIndex +
                        (rods+mPos)->rank))++) = mPos;
                    *(oldFlag + mPos) = TRUE;
                }
            }
        }
    }
}

/* for unit delay fanout */
{
    fanout_ptr fanP = mOut->fnol;

    if (fanP) {
        mlnst_ro *save ma = fanP->mode_affected;
        mlnst_ro *ma;
        register int mPos;

        /* Insert into circuit event list.*/
        ma = save ma;
        for (; (mPos = *ma) != END; ma++) {
            register cktptr ptr =
                *(newCktstart + mPos);
            register int ptrckt;

            if (ptr == NULL)
                *(newCktstart+mPos)=new cktptr(cir);
            else if ((ptrckt=ptr->circuit)!=cir) {
                if (ptrckt > cir) {
                    register cktptr newptr =
                        new_cktptr(cir);
                    newptr->next = ptr;
                    *(newCktstart + mPos) = newptr;
                }
                else {
                    while (ptr->circuit != cir) {
                        register cktptr nextptr =
                            ptr->next;
                        if (nextptr == NULL) {
                            ptr->next=new_cktptr(cir);
                            break;
                        }
                        if (nextptr->circuit > cir) {
                            register cktptr newptr =
                                new cktptr(cir);
                            newptr->next = nextptr;
                            ptr->next = newptr;
                            break;
                        }
                        ptr = nextptr;
                    }
                }
            }
        }

        /* Insert into module event list.*/
        if (!fanP->traversed) {
            fanP->traversed = TRUE;
            ma = save ma;
            for(; (mPos = *ma) != END;ma++) {
                if (!(*(newFlag + mPos))) {
                    *(newStart + (*(newIndex +
                        (rods+mPos)->rank))++) = mPos;
                    *(newFlag + mPos) = TRUE;
                }
            }
        }
    }
}
            }
            inpackets = cktp;
        }
    }
}
num eval_tocs += evalCount;
}

/*                                                  */
/*                     SECOND PASS                  */
/*                                                  */
/* Clear old flags and make old event lists empty;  */
/* Check if more events;                            */
/*                                                  */
{
    /* Clear old flags and make old event lists empty. */
    {
        int rank;

        for (rank = 0; rank < numranks; rank++) {
            register int start = *(rankOrigins + rank);
            register int last  = *(oldIndex + rank);
            register int offset;

            for (offset = start; offset < last; offset++) {
                register int mindex = *(oldStart + offset);
                register cktptr *oldCktpos = oldCktstart + mindex;
                register cktptr cktp = *oldCktpos;

                *(oldFlag + mindex) = FALSE; *oldCktpos = NULL;
                while (cktp) {
                    register cktptr freecktp = cktp;
                    cktp = cktp->next;
                    free rec(ckt rgr, (gpointer) freecktp);
                }
            }
            *(oldIndex + rank) = start;
        }
    }

    /* Check if more events. */
    {
        register int rank;

        for (rank = 0; rank < numranks; rank++) {
            if (*(newIndex + rank) != *(rankOrigins + rank))
                { (notdone = FALSE; break;}
        }
    }
```

```
}

/*                                                              */
/*                      THIRD PASS                              */
/*                                                              */
/* old lists <-- new lists;                                     */
/* for each state variable in update list                       */
/*     for each state element record of state variable          */
/*         if same as good state, delete that faulty record;    */
/*         else old state <-- new state;                        */
/*     clear flags for each state variable;                     */
/* update list <-- empty;                                       */
/*                                                              */
{
   machine_word    *temp_index    = oldIndex;
           int     *temp_start    = oldStart;
           bool    *temp_flag     = oldFlag;
           cktptr  *temp_cktstart = oldCktStart;

   /* old lists <-- new lists */
   old_start    = newStart;    new_start    = temp_start;
   old_index    = newIndex;    new_index    = temp_index;
   old_flag     = newFlag;     new_flag     = temp_flag;
   old_cktstart = newCktStart; new_cktstart = temp_cktstart;

   /* Take care of update list. */
   {
      int   changedCount        = 0;
      conn *updateListPtrTemp = upd;

      for (; updateListPtrTemp != updateListPtr; updateListPtrTemp++) {
         register conn vp = *updateListPtrTemp;

         /* Update old state for each state element record.      */
         /* If good state == faulty state, delete faulty record. */
         {
            register finptr       finfp   = vp->finp;
            register eleptr       fp      = finfp->elemp;
            register machine_word goodVal = GET_NEWST(fp);
            register eleptr sp;
            finfp->flag = FALSE;

            /* Update old state of good circuit. */
            PUT_OLDST(fp, goodVal); changedCount++;

            /* for each state element record */
            for (sp = fp->next; sp != fp; sp = sp->next) {

               /* Note that all module elements are fault origins. */
               if (sp->module == ALL && !GET_STUCK(sp)) {
                  register machine_word faultyVal = GET_NEWST(sp);

                  if (goodVal == faultyVal) {
                     if (sp->modelemp == NULL) {
                        register eleptr nextptr = sp->next;
                        register eleptr prevptr = sp->prev;
                        prevptr->next = nextptr;
                        nextptr->prev = prevptr;
                        free_rec(&elem_rgr, ((pointer) sp));
                        finfo->shadow = nextptr;
                     }
                     else { /* sp->modelemp != NULL */
                        register modelemptr modSp = sp->modelemp;
                        sp->module = modSp->module;
                        sp->field  = modSp->field;
                        sp->modelemp = modSp->next;
                        free_rec(&modelem_rgr, (pointer) modSp);
                     }
                  }
                  else PUT_OLDST(sp, faultyVal);
               }
            }
         }

         /* Clear fanout flag. */
         {
            register fanout ptr fanOutPtr;

            fanOutPtr = vp->fanol; /* for unit delay */
            if (fanOutPtr) fanOutPtr->traversed = FALSE;

            fanOutPtr = vp->fanoO; /* for zero delay */
            if (fanOutPtr) fanOutPtr->traversed = FALSE;
         }
      }

      /* update list <-- empty */
      updateListPtr = upd;
      num_changed_var += changedCount;
   }
}

#if 1
void Xstep()
{
   machine_word  *rankOrigins  = rank_origins;
   machine_word    *oldIndex    = old_index;
   machine_word    *newIndex    = new_index;
           int     *oldStart    = old_start;
           int     *newStart    = new_start;
           int     numRanks     = num_ranks;
           cktptr  *oldCktStart = old_cktstart;
           cktptr  *newCktStart = new_cktstart;
           bool    *oldFlag     = old_flag;
           bool    *newFlag     = new_flag;
           int     i;

/*                                                                    */
/*                          FIRST PASS                                */
/*                                                                    */
/* For each module M in old module event list ordered by rank        */
/*     for each circuit C in old circuit event list of M              */
/*         packing each input variable of M;                          */
/*         packing each output variable of M;                         */
/*     call update procedure for M;                                   */
/*     for each circuit C in old circuit event list of M              */
/*         unpacking each output variable of M;                       */
/*         if old state != new state                                  */
/*             set changed mode to M;                                 */
/*             put it on update list;                                 */
/*             put zero delay fanout in old event list;               */
/*             put unit delay fanout in new event list;               */
{
   int rank;
   int evalCount = 0;
   xStable = TRUE;

   /* for each rank */
   for (rank = 0; rank < numRanks; rank++) {
      int last = *(oldIndex + rank);
      int offset;
```

```
/* for each element of specified rank in old event list */
for (offset = *(rankOrigins + rank); offset < last; offset++) {
   int mindex = *(oldStart + offset);
   cktptr cktp = *(oldCktstart + mindex);
   elmst **P = mods + *mindex;
   if (cktp != NULL) {
      if (cktp->circuit == 0)
         { output(" 0(good circuit)"); cktp = cktp->next; }
      for (; cktp != NULL; cktp = cktp->next) {
         register int circuit = cktp->circuit;
         register fcktelemptr *fpp;
         fcktelemptr fcktelemp;
         fpp = (fcktelemptr*) FAST_LOC_BUF(&fcktelem_buf,
                                          (circuit - 1));

          fcktelemp = *fpp;
           /* Make faulty circuit element in table inactive. */
           /* Delete faulty circuit from the symbol table.    */
           /* Delete state & event records for all nodes.     */
           /* Delete circuit events.                          */
           /* Delete watch rec for that faulty circuit.       */
           fcktelemp->active = FALSE;
           delete_fault(fcktelemp->name);
           for (i = 0; i < num_nodes; i++) {
              register conn vp;
              vp = &(Nodes + i)->H; deletecioALLN(vp, circuit);
              vp = &(Nodes + i)->L; deletecioALLN(vp, circuit);
           }
           for (i = 0; i < num_mods; i++) {
              deleteckt(i, circuit, TRUE); deleteckt(i, circuit, FALSE);

           for (i = 1; i <= total_phasenon; i++) {
              register watch_rec_ptr watchPtr;
              if ((watchPtr = find_watch(i)) != NULL) {
                 if (watchPtr->nextrec != NULL) { /* skip head */
                    register watch_rec_ptr nextWatchPtr;
                    while ((nextWatchPtr = watchPtr->nextrec) != NULL) {
                       if (nextWatchPtr->circuit == circuit) {
                          watch_rec_ptr free_ptr = nextWatchPtr;
                          watchPtr->nextrec = nextWatchPtr->nextrec;
                          free_rec(&watch_rec_mgr, (pointer) free_ptr);
                       }
                       else watchPtr = nextWatchPtr;
                    }
                 }
              }

          printf("Osc Recovery: Removing %s \n",(*fpp)->name);
      }

   }
  }
 }
}
/*                                                   */
/*                    SECOND PASS                    */
/*                                                   */
/* Clear old flags and make old event lists empty;   */
/* Check if more events;                             */
/*                                                   */
{
   /* Clear old flags and make old event lists empty. */
   {
      int rank;

      for (rank = 0; rank < numRanks; rank++) {
         register int start = *(rankOrigins + rank);
         register int last  = *(oldTrack + rank);
         register int offset;

         for (offset = start; offset < last; offset++) {
            register int mindex = *(oldStart + offset);
            register cktptr *oldCktpos = oldCktstart + mindex;
            register cktptr cktp = *oldCktpos;

            *(oldFlag + mindex) = FALSE; *oldCktpos = NULL;
            while (cktp) {
               register cktptr freecktp = cktp;
               cktp = cktp->next;
               free_rec(&ckt_mgr, (pointer) freecktp);
            }
         }
         *(oldIndex + rank) = start;
      }
   }

   /* Check if more events. */
   {
      register int rank;

      for (rank = 0; rank < numRanks; rank++) {
         if (*(newIndex + rank) != *(rankOrigins + rank))
            { found = FALSE; break; }
      }
   }
}

/*                                                          */
/*                        THIRD PASS                        */
/*                                                          */
/* old lists <-- new lists;                                 */
/* for each state variable in update list                   */
/*    for each state & event record of state variable       */
/*       if same as good state, delete that faulty record;  */
/*       else old state <-- new state;                      */
/*    clear flags for each state variable;                  */
/* update list <-- empty;                                   */
/*                                                          */
{
   machine_word   *temp_index     = oldIndex;
            int   *temp_start     = oldStart;
           bool   *temp_flag      = oldFlag;
         cktptr   *temp_cktstart  = oldCktstart;

   /* old lists <-- new lists */
   old_start     = newStart;     new_start     = temp_start;
   old_index     = newIndex;     new_index     = temp_index;
   old_flag      = newFlag;      new_flag      = temp_flag;
   old_cktstart  = newCktstart;  new_cktstart  = temp_cktstart;

   /* Take care of update list. */
   {
      int  changedCount      = 0;
      conn *updateListPtrTemp = upd;

      for (; updateListPtrTemp != updateListPtr; updateListPtrTemp++) {
         register conn vp = *updateListPtrTemp;

         /* Update old state for each state element in vp.      */
         /* If good state = faulty state, delete faulty record. */
         {
```

```
            register finfoptr       finfp    = vp->finfo;
            register elemptr        fp       = finfp->elem;
            register machine_word goodVal  = GET NEWST(fp);
            register elemptr sp;
            finfo->flag = FALSE;

            /* Update old state of good circuit. */
            PUT OLDST(fp, goodVal); changedCount++;

            /* for each state element record */
            for (sp = fp->next; sp != fp; sp = sp->next) {

                /* Note that all module elements are fault origins. */
                if (sp->module == ALL && !GET_STUCK(sp)) {
                    register machine_word faultyVal = GET NEWST(sp);

                    if (goodVal == faultyVal) {
                        if (sp->modelemp == NULL) {
                            register elemptr nextptr = sp->next;
                            register elemptr prevptr = sp->prev;
                            prevptr->next = nextptr;
                            nextptr->prev = prevptr;
                            free_rec(&elem_rgr, ((pointer) sp));
                            finfp->shadow = nextptr;
                        }
                        else { /* sp->modelemp != NULL */
                            register modelemptr modSp = sp->modelemp;
                            sp->module = modSp->module;
                            sp->field = modSp->field;
                            sp->modelemp = modSp->next;
                            free_rec(&modelem_mgr, ((pointer) modSp));
                        }
                    }
                    else PUT_OLDST(sp, faultyVal);
                }
            }
        }

        /* Clear fanout flag. */
        {
            register fanout_ptr fanOutPtr;

            fanOutPtr = vp->fao1; /* for unit delay */
            if (fanOutPtr) fanOutPtr->traversed = FALSE;

            fanOutPtr = vp->fao0; /* for zero delay */
            if (fanOutPtr) fanOutPtr->traversed = FALSE;
        }
    }

    /* update list <-- empty */
    updateListPtr = upd1;
    num_changed var += changedCount;
  }
 }
}

#endif
#if 0
VOID Xstep()
{
    machine word  *rankOrigins = rank_origins;
    machine word     *oldIndex     = old index;
    machine word     *new_Index    = new index;
             int     *oldStart     = old start;
             int     *newStart     = new start;

             int      numRanks      = num_ranks;
           cktptr  *oldCktStart   = old cktstart;
           cktptr  *newCktStart   = new cktstart;
           bool     *oldFlag       = old flag;
           bool     *newFlag       = new flag;

    /*                                                                  */
    /*                          FIRST PASS                              */
    /*                                                                  */
    /* For each module M in old module event list ordered by rank       */
    /*    for each circuit C in old circuit event list of M             */
    /*       packing each input variable of M;                          */
    /*       picking each output variable of M;                         */
    /*    call update procedure for M;                                  */
    /*    for each circuit C in old circuit event list of M             */
    /*       unpacking each output variable of M;                       */
    /*        if old state != new state                                 */
    /*          set changing bit of X;                                  */
    /*          put it on update list;                                  */
    /*          put zero delay fanout in old event list;                */
    /*          put unit delay fanout in new event list;                */

    int rank;
    int evalCount = 0;
    isStable = TRUE;

    /* for each rank */
    for (rank = 0; rank < numRanks; rank++) {
        int last = *(oldIndex + rank);
        int offset;

        /* for each element of specified rank in old event list */
        for (offset = *(rankOrigins + rank); offset < last; offset++) {
            int mIndex = *(oldStart + offset);
            cktptr packPtr = *(oldCktStart + mIndex);
            cktptr unpackPtr = packPtr;
            minst *mP = mods + mIndex;

            /* packing and unpacking */
            while (packPtr) {

                /* Clear old value field of unit delay input variable. */
                {
                    register conn_ptr min1P = mP->inputs;
                    register conn min;
                    for (; (min = *minP); minP++) min->old = Const 0;
                }

                /* Clear new value field of zero delay input variable. */
                {
                    register conn_ptr minP = mP->z_inputs;
                    register conn min;
                    for (; (min = *minP); minP++) min->new = Const 0;
                }

                /* Clear old value field of output variable. */
                {
                    register conn_ptr mOutP = mP->results;
                    register conn mOut;
                    for (; (mOut = *mOutP); mOutP++) mOut->old = Const 0;
                }

                /* packing for each circuit */
                {
                    cktptr ctmp = packPtr;
                    int count = 0;
```

```
for (; cktp && count < NWORD; cktp = cktp->next, count++) {
   register int cir = cktp->circuit;

   /* Pack for each unit delay input variable. */
   {
      conns_ptr minP = mp->inputs;
      conn min;

      for (; (min = *minP); minP++) {
                  finfptr  finfp      = min->finfp;
                  elemptr  fp         = finfp->elemp;
         register elemptr  sp         = finfp->shadow;
         register machine_word value  = GET_OLDST(fp);

         /* Find state element record for each circuit. */
         if (cir != 0) {

            /* Try to find out circuit id. */
            if (sp->circuit < cir) {
               sp = sp->next;
               while (sp->circuit < cir && sp != fp)
                  sp = sp->next;
            }
            else while (sp->circuit > cir) sp = sp->prev;

            /* Assign shadow pointer. */
            finfp->shadow = sp;

            /* If circuit found, try to find module. */
            if (sp->circuit == cir) {
               register int smod = sp->module;

               if (smod == mindex) value = GET_NEWST(sp);
               else { /* sp->module != mindex */
                  register modelemptr modsp = sp->modelemp;
                  if (smod == ALL) value = GET_NEWST(sp);
                  while (modsp) {
                     register int modSpMod = modsp->module;
                     if (modSpMod == mindex)
                        { value = GET_NEWST(modsp); break; }
                     else if (modSpMod < mindex) break;
                     modsp = modsp->next;
                  }
               }
            }
         }
         PUT_VAL(min->old, value, count);
      }
   }

   /* Pack for each zero delay input variable. */
   {
      conns_ptr minP = mp->inputs;
      conn min;

      for (; (min = *minP); minP++) {
                  finfptr  finfp      = min->finfp;
                  elemptr  fp         = finfp->elemp;
         register elemptr  sp         = finfp->shadow;
         register machine_word value  = GET_NEWST(fp);

         /* Find state element record for each circuit. */
         if (cir != 0) {

            /* Try to find out circuit id. */
            if (sp->circuit < cir) {
               sp = sp->next;
               while (sp->circuit < cir && sp != fp)
                  sp = sp->next;
            }
            else while (sp->circuit > cir) sp = sp->prev;

            /* Assign shadow pointer. */
            finfp->shadow = sp;

            /* If circuit found, try to find module. */
            if (sp->circuit == cir) {
               register int smod = sp->module;

               if (smod == mindex) value = GET_NEWST(sp);
               else { /* sp->module != mindex */
                  register modelemptr modsp = sp->modelemp;
                  if (smod == ALL) value = GET_NEWST(sp);
                  while (modsp) {
                     register int modSpMod = modsp->module;
                     if (modSpMod == mindex)
                        { value = GET_NEWST(modsp); break; }
                     else if (modSpMod < mindex) break;
                     modsp = modsp->next;
                  }
               }
            }
         }
         PUT_VAL(min->new, value, count);
      }
   }

   /* Pack for each output variable. */
   {
      conns_ptr nOutP = mp->results;
      conn nOut;

      for (; (nOut = *nOutP); nOutP++) {
                  finfptr  finfp      = nOut->finfp;
                  elemptr  fp         = finfp->elemp;
         register elemptr  sp         = finfp->shadow;
         register machine_word value  = GET_OLDST(fp);

         /* Find state element record for each circuit. */
         if (cir != 0) {

            /* Try to find out circuit id. */
            if (sp->circuit < cir) {
               sp = sp->next;
               while (sp->circuit < cir && sp != fp)
                  sp = sp->next;
            }
            else while (sp->circuit > cir) sp = sp->prev;

            /* Assign shadow pointer. */
            finfp->shadow = sp;

            /* If circuit found, try to find module. */
            if (sp->circuit == cir) {
               register int smod = sp->module;

               if (smod == mindex) value = GET_NEWST(sp);
               else { /* sp->module != mindex */
                  register modelemptr modsp = sp->modelemp;
                  if (smod == ALL) value = GET_NEWST(sp);
                  while (modsp) {
```

```
                        register int modSpMod = modsp->module;
                        if (modSpMod == mindex)
                            { value = GET_NEWST(modsp); break; }
                        else if (modSpMod < mindex) break;
                        modsp = modsp->next;
                    }
                }
            }
            PUT_VAL(mOut->old, value, count);
        }
    }
    packPtr = cktp;
    Nova1 = count;
}

/* Call update procedure. */
(*mP->mod)(mP->results, mP->inputs, mP->inouts);
evalCount++;
if (checkFreeze) restore_freeze();

/* unpacking for each circuit */
{
    cktptr cktp = unpackPtr;

    for (; cktp != packPtr; cktp = cktp->next) {
        register int        cir   = cktp->circuit;
                 conns ptr  mOutP = mP->results;
                 conn       mOut;

        /* Unpack for each output variable. */
        for (; (mOut = *mOutP); mOutP++) {
            register machine word value = mOut->new & Const_1;
                     finfptr  finfp     = mOut->finfp;
                     elemptr  fp        = finfp->elemp;
            mOut->new >>= 1;

            if (cir == 0) { /* for good circuit */
                machine word oldValue = GET_OLDST(fp);

                /* if new state != old state */
                if (value != oldValue && oldValue != Const_1) {

                    /* Set changing node to X, i.e. */
                    /* set changing variable to 1. */
                    PUT_NEWST(fp, 1);

                    /* Insert it on update list. */
                    if (!finfp->flag) {
                        *update_list++ = mOut;
                        finfp->flag = TRUE;
                    }

                    /* for zero delay fanout */
                    {
                        fanout ptr fanP = mOut->fnoO;

                        if (fanP) {
                            minst_no *save ma = fanP->mods affected;
                            minst_no *ma;
                            register int rPos;

                            /* Insert into circuit event list.*/
                            ma = save ma;
                            for (; (rPos = *ma) != END; ma++) {

                                register cktptr ptr =
                                    *(oldCktstate + rPos);

                                if (ptr == NULL)
                                    *(oldCktstate+rPos) = new cktptr(0);
                                else if (ptr->circuit != 0) {
                                    register cktptr newptr =
                                        new cktptr(0);
                                    newptr->next = ptr;
                                    *(oldCktstate + rPos) = newptr;
                                }

                                /* since good state was changed */
                                {
                                    cktptr nextp = *(oldCktstate+rPos);
                                    conns ptr minP = (mods+rPos)->inputs;
                                    conn min;

                                    /* for each zero delay input */
                                    while (min = *minP++) {
                                        [illegible] fin = min->finfp->elemp;
                                        elemptr nsp = fip->nsnext;
                                        machine word gVal=GET NEWST(nfp);
                                        cktptr nptr = nextp;

                                        /* Scan all state records. */
                                        for (; nsp; nsp=nsp->next) {
                                            register modelemptr modsp =
                                                nsp->modelemp;
                                            register bool adckt = FALSE;

                                            for (;modsp;modsp=modsp->next)
                                                if (gVal!=GET NEWST(modsp))
                                                    { adckt=TRUE; break; }

                                            if (adckt) {
                                                [illegible] NEWST(nsp)!=gVal) {
                                                register int nckt =
                                                    nsp->circuit;

                                                while([illegible]) {
                                                    register cktptr nextP =
                                                        nptr->next;
                                                    if (nextP == NULL) {
                                                        nptr->next =
                                                            new cktptr(nckt);
                                                        break;
                                                    }
                                                    if (nextP->circuit>nckt){
                                                        register cktptr newP =
                                                            new cktptr(nckt);
                                                        newP->next = nextP;
                                                        nptr->next = newP;
                                                        break;
                                                    }
                                                    nptr = nextP;
                                                }
                                            }
                                        }
                                    }
                                }
                            }

                            /* insert into module event [illegible] */
                            if (!fanP->traversed) {
                                fanP->traversed = TRUE;
```

```
            ma = save_ma;
            for(; (mPos = *ma) != END;ma++) {
               if (!(*(oldFlag + mPos))) {
                  *(oldStart + (*oldIndex +
                     (mods+mPos)->rank())++)   = mPos;
                  *(oldFlag + mPos) = TRUE;
               }
            }
         }
      }
   }
   /* for unit delay fanout */
   {
      fanout_ptr fanP = mOut->fanol;

      if (fanP) {
         inst_rp *save_ma = fanP->mods_affected;
         inst_rp *ma;
         register int mPos;

         /* Insert into circuit event list.*/
         ma = save_ma;
         for (; (mPos = *ma) != END; ma++) {
            register cktptr ptr =
               *(newCktStart + mPos);

            if (ptr == NULL)
               *(newCktStart+mPos) = new cktptr(0);
            else if (ptr->circuit != 0) {
               register cktptr newptr =
                  new_cktptr(0);
               newptr->next = ptr;
               *(newCktStart + mPos) = newptr;
            }

            /* since good state was changed */
            {
               cktptr ncktp = *(newCktStart+mPos);
               conns_ptr alnP=(mods+mPos)->inputs;
               conn mIn;

               /* for each unit delay input */
               for(; (mIn = *alnP); alnP++) {
                  elemptr nfp = mIn->fil->fp->elemp;
                  elemptr nsp = nfp->next;
                  machine_word gVal=GET_NEWST(nfp);
                  cktptr nptr = ncktp;

                  /* Scan all state records. */
                  for (; nsp!=nfp; nsp=nsp->next) {
                     register nodelemptr nodsp =
                        nsp->nodelem;
                     register bool addckt = FALSE;

                     for (;nodsp;nodsp=nodsp->next)
                        if (gVal!=GET_NEWST(nodsp))
                           { addckt=TRUE; break; }

                     if (addckt) {
                        GET_NEWST(nsp) ^ gVal) {
                        register int sckt =
                           nsp->circuit;

                        while(nptr->circuit!=sckt){
                           register cktptr nextP
                              =nptr->next;
                           if (nextP == NULL) {
                              nptr->next =
                                 new_cktptr(sckt);
                              break;
                           }
                           if(nextP->circuit>sckt){
                              register cktptr newP=
                                 new_cktptr(sckt);
                              newP->next = nextP;
                              nptr->next = newP;
                              break;
                           }
                           nptr = nextP;
                        }
                     }
                  }
               }
            }

            /* Insert into fanout event list.*/
            if (!fanP->traversed) {
               fanP->traversed = TRUE;
               ma = save_ma;
               for(; (mPos = *ma) != END;ma++) {
                  if (!(*(newFlag + mPos))) {
                     *(newStart + (*(newIndex +
                        (mods+mPos)->rank())++)) = mPos;
                     *(newFlag + mPos) = TRUE;
                  }
               }
            }
         }
      }
   }
else { /* circuit != 0 (faulty circuit) */
   machine word qVal = GET_NEWST(fp);
   register elemptr sp = fnp->shadow;
   bool schedule = FALSE;
   int sckt;

   /* Try to find out circuit id. */
   if (sp->circuit < cir) {
      sp = sp->next;
      while (sp->circuit < cir && sp != fp)
         sp = sp->next;
      if (sp == fp) sp = sp->prev;
   }
   else { /* sp->circuit > cir */
      while (sp->circuit > cir) sp = sp->prev;
      if (sp == fp) sp = sp->next;
   }

   /* If not found and different from good value, */
   /* insert state element record with new value. */
   if ((sckt = sp->circuit) != cir) {
      if (gVal != value) {
         schedule = TRUE;

         /* Insert an element just before element */
         /* referenced by shadow pointer.         */
         if (sckt > cir) {
            register elemptr nfemp =
```

```
            new elemptr(cir,FALSE,value,gVal,ALL);
        register elemptr prevptr = sp->prev;
        elemp->next = sp; elemp->prev = prevptr;
        prevptr->next = elemp; sp->prev = elemp;
        sp = finfp->shadow = elemp;
    }

    /* Insert an element just after element */
    /* referenced by shadow pointer.        */
    else { /* next < cir */
        register elemptr elemp =
            new elemptr(cir,FALSE,value,gVal,ALL);
        register elemptr nextptr = sp->next;
        elemp->next = nextptr; elemp->prev = sp;
        sp->next = elemp; nextptr->prev = elemp;
        sp = finfp->shadow = elemp;
    }
  }
}

/* If circuit found, try to find out module id. */
else { /* sp->circuit == cir */
    finfo->shadow = sp;

    if (sp->module == ALL) {
        if (!GET_STUCK(sp)) {
            PUT_NEWST(sp, value);
            if (value!=GET_OLDST(sp)) schedule=TRUE;
        }
    }
    else { /* sp->module != ALL */
        register int module = sp->module;
        register modelemptr newptr =
            new modelemptr(D, 0, C, module);
        newptr->field = sp->field;
        newptr->next = sp->modelemp;
        sp->module = ALL; sp->modelemp = newptr;
        PUT_NEWST(sp, value); PUT_OLDST(sp, gVal);
        PUT_STUCK(sp, FALSE);
        if (value != gVal) schedule = TRUE;
    }
}

/* Need to schedule events. */
if (schedule && GET_OLDST(sp) != 1) {

    /* Set changing node to X, i.e. */
    /* set changing variable to 1.  */
    PUT_NEWST(sp, 1);

    /* Insert it on update list. */
    if (!finfp->flag) {
        *updatelistPtr++ = nOut;
        finfp->flag = TRUE;
    }

    /* for zero delay fanout */
    {
        fanout_ptr fanP = nOut->fan0;

        if (fanP) {
            first_no *save_ma = fanP->nnds_affected;
            first_no *ma;
            register int nPos;

            /* Insert into circuit event list.*/
            ma = save_ma;
            for (; (nPos = *ma) != END; ma++) {
                register cktptr ptr =
                    *(oldCktstart + nPos);
                register int ptrckt;

                if (ptr == NULL)
                    *(oldCktstart+nPos)=new cktptr(cir);
                else if ((ptrckt=ptr->circuit)!=cir) {
                    if (ptrckt > cir) {
                        register cktptr newptr =
                            new cktptr(cir);
                        newptr->next = ptr;
                        *(oldCktstart + nPos) = newptr;
                    }
                    else {
                        while (ptr->circuit != cir) {
                            register cktptr nextptr =
                                ptr->next;
                            if (nextptr == NULL) {
                                ptr->next=new cktptr(cir);
                                break;
                            }
                            if (nextptr->circuit > cir) {
                                register cktptr newptr =
                                    new_cktptr(cir);
                                newptr->next = nextptr;
                                ptr->next = newptr;
                                break;
                            }
                            ptr = nextptr;
                        }
                    }
                }
            }

            /* Insert into module event list.*/
            if (!fanP->traversed) {
                fanP->traversed = TRUE;
                ma = save_ma;
                for (; (nPos = *ma) != END; ma++) {
                    if (!(*oldFlag + nPos)) {
                        *(oldStart + (*oldIndex +
                            (moduleNo*numCkts))++) = nPos;
                        *(oldFlag + nPos) = TRUE;
                    }
                }
            }
        }
    }

    /* for unit delay fanout */
    {
        fanout_ptr fanP = nOut->fan1;

        if (fanP) {
            first_no *save_ma = fanP->nnds_affected;
            first_no *ma;
            register int nPos;

            /* Insert into circuit event list.*/
            ma = save_ma;
            for (; (nPos = *ma) != END; ma++) {
                register cktptr ptr =
                    *(newCktstart + nPos);
                register int ptrckt;
```

```
            if (ptr == NULL)
               *(newCktStart+mPos)=new_cktptr(cir);
            else if ((ptrckt=ptr->circuit)->cir) {
               if (ptrckt > cir) {
                  register cktptr newptr =
                     new_cktptr(cir);
                  newptr->next = ptr;
                  *(newCktStart + mPos) = newptr;
               }
               else {
                  while (ptr->circuit != cir) {
                     register cktptr nextptr =
                        ptr->next;
                     if (nextptr == NULL) {
                        ptr->next=new_cktptr(cir);
                        break;
                     }
                     if (nextptr->circuit > cir) {
                        register cktptr newptr =
                           new_cktptr(cir);
                        newptr->next = nextptr;
                        ptr->next = newptr;
                        break;
                     }
                     ptr = nextptr;
                  }
               }
            }
         }
         /* Insert into module event list.*/
         if (!fanr->traversed) {
            fanr->traversed = TRUE;
            ma = save_ma;
            for (; (mPos = *ma) != END;ma++) {
               if (!(*(newFlag + mPos))) {
                  *(newStart + (*(newIndex +
                     (mods(mPos)->rank))++)) = mPos;
                  *(newFlag + mPos) = TRUE;
               }
            }
         }
      }
     }
    }
   }
  }
  unpackPtr = temp;
 }
 }
}
num_eval_mods += evalCount;
}

/*                                                      */
/*                    SECOND PASS                       */
/*                                                      */
/* Clear old flags and make old event lists empty;      */
/* Check if more events;                                */
/*                                                      */
{
   /* Clear old flags and make old event lists empty. */
   {
      int rank;

      for (rank = 0; rank < numRanks; rank++) {
         register int start = *(rankOrigins + rank);
         register int last = *(oldIndex + rank);
         register int offset;

         for (offset = start; offset < last; offset++) {
            register int mIndex = *(oldStart + offset);
            register cktptr *oldCktpos = oldCktstart + mIndex;
            register cktptr cktp = *oldCktpos;

            *(oldFlag + mIndex) = FALSE; *oldCktpos = NULL;
            while (cktp) {
               register cktptr [illegible] = cktp;
               cktp = cktp->next;
               free [illegible] (pointer) [illegible]);
            }
         }
         *(oldIndex + rank) = start;
      }
   }

   /* Check if more events. */
   {
      register int rank;

      for (rank = 0; rank < numRanks; rank++) {
         if (*(newIndex + rank) != *(rankOrigins + rank))
            { inStable = FALSE; break; }
      }
   }
}

/*                                                      */
/*                    THIRD PASS                        */
/*                                                      */
/* old lists <-- new lists;                             */
/* for each state variable in update list               */
/*    for each state element record of state variable   */
/*       if same as good state, delete that faulty record; */
/*       else old state <-- new state;                  */
/*    clear flags for each state variable;              */
/* update list <-- empty;                               */
/*                                                      */
{
   machine word   *temp index      = oldIndex;
            int    *temp start      = oldStart;
            bool   *temp flag       = oldFlag;
            cktptr *temp cktstart   = oldCktstart;

   /* old lists <-- new lists */
   old_start      = newStart;      new start      = temp start;
   old_index      = newIndex;      new index      = temp index;
   old_flag       = newFlag;       new flag       = temp flag;
   old_cktstart   = newCktStart;   new cktstart   = temp cktstart;

   /* Take care of update list. */
   {
      int   [illegible]Count        = 0;
      conn [illegible]Temp = [illegible];

      for ([illegible]Temp [illegible] updateList [illegible]) {
         reg [illegible] = *[illegible]Temp;

         /* Update old state for each state element [illegible]. */
```

```
/* If good state == faulty state, delete faulty record. */
{
   register finfptr      finfp    = sp->finfp;
   register elemptr      fp       = finfp->elemp;
   register machine_word goodVal  = GET_NEWST(fp);
   register elemptr sp;
   finfp->flag = FALSE;

   /* Update old state of good circuit. */
   PUT_OLDST(fp, goodVal); changedCount++;

   /* For each state element record */
   for (sp = fp->next; sp != fp; sp = sp->next) {

      /* Note that all module elements are fault origins. */
      if (sp->module == ALL && !GET_STUCK(sp)) {
         register machine_word faultyVal = GET_NEWST(sp);

         if (goodVal == faultyVal) {
            if (sp->modelemp == NULL) {
               register elemptr nextptr = sp->next;
               register elemptr prevptr = sp->prev;
               prevptr->next = nextptr;
               nextptr->prev = prevptr;
               free_rec(&elem_mgr, ((pointer) sp));
               finfp->shadow = nextptr;
            }
            else { /* sp->modelemp != NULL */
               register modelemptr modSp = sp->modelemp;
               sp->module = modSp->module;
               sp->field = modSp->field;
               sp->modelemp = modSp->next;
               free_rec(&modelem_mgr, ((pointer) modSp));
            }
         }
         else PUT_OLDST(sp, faultyVal);
      }
   }

   /* Clear fanout flag. */
   {
      register fanout_ptr fanOutPtr;

      fanOutPtr = vp->fno1; /* for unit delay */
      if (fanOutPtr) fanOutPtr->traversed = FALSE;

      fanOutPtr = vp->fno0; /* for zero delay */
      if (fanOutPtr) fanOutPtr->traversed = FALSE;
   }
}

/* update list <-- empty */
updateListPtr = null;
num_changed_var += changedCount;
}
}
}

#endif

#else /* FAULT */
/* Set new state of variable.                                         */
/* Optionally specify virtual processor number (everyProcessor -> all) */
/* (noProcessor -> none)                                              */
/* If old state != new state, then                                    */

/*    (1) Put the pointer of variable on update list.  */
/*    (2) Put zero delay fanouts on old event list.    */
/*    (3) Put unit delay fanouts on new event list.    */

#ifdef CM
VOID set_add(value, vp, fanin, processor)
#else /* CM */
VOID set_add(value, vp, fanin)
#endif /* CM */
register machine_word value;
register cons vp;
register int fanin;
#ifdef CM
register CM_address_t processor;
#endif /* CM */
{
   /* Set new state of variable. */
#ifdef CM
   if (processor == everyProcessor) {
      CM_move_constant(vp->new, value, 1);
   } else if (processor != noProcessor) {
      CM_store_to_processor(processor, vp->new, value, 1);
   }
#else /* CM */
   vp->new = value;
#endif /* CM */
   /* If old state != new state (value) */
#ifdef CM
   CM_ne(vp->old, vp->new, 1);
   if (CM_global_logior(CM_test_flag, 1))
#else /* CM */
   if (vp->old != value)
#endif /* CM */
   {
      { /* Put the pointer of variable on update list. */
         *updateListPtr++ = vp; isStable = FALSE;
      }
      /* clk collection mode */
      if (vp->clk_sum != 0L && (stat collection == 1))
         vp->clk_sum += (noofevents + phase count) * step count;

      { /* for zero delay fanout list */
         register fanout_ptr fanOutPtr = vp->fno0;

         /* if fanout list has not been traversed */
         if (fanOutPtr && !fanOutPtr->traversed) {
            register *_int *firstpos = fanOutPtr->mods_affected;
            register int firstpos;
            fanOutPtr->traversed = TRUE;
            /* for each fanout module */
            while ((firstpos = *firstpos++) != NULL) {
               if (fo < skip_f_no) {
                  if (schedule all events (fanout)) continue;
               }
               /* If that module not in the event list, */
               /* put it on old event list.             */
               if (!(*(old_flag + firstpos))) {
                  *old_start + (*(old_index + (mods + firstpos)->rank))++)
                     = firstpos;
                  *(old_flag + firstpos) = TRUE; isOldEvent = TRUE;
               }
            }
         }
      }

      { /* for unit delay fanout list */
```

```
        register fanout ptr fanOutPtr = vp->fnol;

        /* if fanout list has not been traversed */
        if (fanOutPtr && !fanOutPtr->traversed) {
           register minst no *ma = fanOutPtr->mods_affected;
           register int minstpos;
           fanOutPtr->traversed = TRUE;

           /* for each fanout module */
           while ((minstpos = *ma++) != END) {
              if (clk sup flag) {
                 if (schedule clk eval(minstpos)) continue;
              }
              /* If that module not in the event list, */
              /* put it on new event list.             */
              if (!(*(new flag + minstpos))) {
                 *(new start + (*(new index + (mods + minstpos)->rank))++)
                     = minstpos;
                 *(new flag + minstpos) = TRUE;
              }
           }
        }
     }

     /* If fanin module not in the event list, */
     /* put it on new event list.              */
     if ((fanin != -1) && !(*(new_flag + fanin))) {
        *(new_start + (*(new_index + (mods + fanin)->rank))++) = fanin;
        *(new_flag + fanin) = TRUE;
     }
  }
}

/* Simulate one unit step.                                        */
/*    FIRST  PASS : Call update procedure, schedule the events.   */
/*    SECOND PASS : Clear old lists, check more events.           */
/*    THIRD  PASS : Swap old and new lists, update old states.    */
VOID step()
{
   machine_word  *rankOrigins = rank_origins;
   machine_word  *oldIndex    = old_index;
   machine_word  *newIndex    = new_index;
            int  *oldStart    = old_start;
            int  *newStart    = new_start;
            int  numRanks     = num_ranks;
            bool *oldFlag     = old_flag;
            bool *newFlag     = new_flag;

   /*                                                                  */
   /*                          FIRST PASS                              */
   /*                                                                  */
   /* for each module M in old event list ordered by rank              */
   /*    call update procedure for M;                                  */
   /*    for each output variable O of M with old state != new state   */
   /*       put O in update list;                                      */
   /*       put zero delay fanout in old event list;                   */
   /*       put unit delay fanout in new event list;                   */
   /*                                                                  */
   {
      int rank;
      int evalCount = 0;

      if (clk_sup_stabilize == FALSE) [illegible] before step();
      isStable = TRUE;

      /* for each rank */
      for (rank = 0; rank < numRanks; rank++) {
         int last = *(oldIndex + rank);
         register int offset;

         /* for each element of specified rank in old event list */
         for (offset = *(rankOrigins + rank); offset < last; offset++) {
#ifdef SYMSIM
            register int   mindex  = *(oldStart + offset);
            register m nst *modPtr = mods + mindex;

            /* Save inputs and inject faults into inputs. */
            if (ifault != 0) {
               [illegible]

               {  /* for each unit-delay input state variable */
                  register finptr *faultfp =
                     (finptr*) START [illegible] ctp->inputs);
                  register machine word *savep =
                     (machine word*) START [illegible] save n[illegible]);
                  register conn ptr vpp = modPtr->inputs;
                  register conn vp;

                  for (; vp = *vpp; vpp++, faultfp++, savep++) {
                     *savep = vp->old;
                     vp->old = (machine word)
                               eva.neq((dag ptr) vp->old,
                                       (dag ptr) (*faultfp)->[illegible]),
                                       (dag ptr) (*faultfp)->or[illegible]);
                  }
               }

               {  /* for each zero-delay input state variable */
                  register finptr *faultfp =
                     (finptr*) START [illegible](outptr) cetp->inputs);
                  register machine word *savep =
                     (machine word*) START [illegible]save on[illegible]);
                  register conn ptr vpp = modPtr->inputs;
                  register conn vp;

                  for (; vp = *vpp; vpp++, faultfp++, savep++) {
                     *savep = vp->new;
                     vp->new = (machine word)
                               eva.dand((dag ptr) vp->new),
                                       (dag ptr) (*faultfp)->and),
                                       (dag ptr) (*faultfp)->or[illegible]);
                  }
               }
            }
#else /* SYMSIM */

            register minst *modPtr = mods + *(oldStart + offset);
            int    mindex  = *(oldStart + offset);

            /* dynamic solver */

            if (dyn->instance top) top = dyn->instance top(*(oldStart+offset));

#endif /* SYMSIM */

            /* Call update procedure. */

            if (*(minStart+offset) [illegible] instance, delta time ));
            /* (binary read) (* modPtr->proc)(nd,cpn(cmpArea); */
            else
```

```
(* modPtr->mod)(modPtr->results, modPtr->inputs,modPtr->zinputs);
if (*foldStart(offset) == timed instance)
{
   total_time = total time + delta_time (0);
   number_evaluations += 1;
   average_time = (float) total time / (float) number evaluations;
}

evalCount++;
if (check(freeze, restore (freeze));

#ifdef DEBUG
        if ((top != SYS_IGNORE))    /* to debug dynamic solver */
        {
           (* saved mod)(modPtr->results, modPtr->inputs, modPtr->zinputs);
           dynamic compare (modPtr->results);
        }
#endif

#ifdef SYMSIM
        /* Collect garbage if needed. */
        /* If not enough, rehash.      */
        if (reduce table.e.events in table > 2 * (reduce_table.n)) {
           dogarbage();
           if (reduce table.elements in_table > 1.9 * (reduce_table.n))
              { rehashcount++; rehash_reduce(); }
        }

        /* Restore inputs. */
        if (ifaults != 0) {

           {  /* for each unit-delay input state variable */
              register machine word *savep =
                 (machine_word*) START_BUF(&save buf);
              register conns_ptr vpp = modPtr->inputs;
              register conn vp;
              for (; (vp = *vpp); vpp++, savep++) vp->old = *savep;
           }

           {  /* for each zero-delay input state variable */
              register machine word *savep =
                 (machine word*) START_BUF(&save buf);
              register conns ptr vpp = modPtr->zinputs;
              register conn vp;
              for (; (vp = *vpp); vpp++, savep++) vp->new = *savep;
           }
        }
#endif /* SYMSIM */

        /* Schedule the events. */
        {
           register conns ptr modResultPtr = modPtr->results;
           register conn modResult;

           /* for each output variable */
           for (; (modResult = *modResultPtr); modResultPtr++) {
            machine word     AN,AO,ACN,TMP;
            var t    *cousin ptr;
              /* code for capacitive update */
              AN = modResult->new;
              AO = modResult->old;
              cousin ptr = (var t *) modResult->linfp;
              ACN = cousin ptr->new;
              TMP = ~(AN | ACN);
              TMP = TMP & AO;
              modResult->new = AN | TMP;

#ifdef SYMSIM
                 /* insert faults into outputs. */
                 if (ifaults != 0) {
                    register *fptr f = modResult->linfp;
                    modResult->new = (machine word)
                                   eval_dag((dag_ptr) modResult->new),
                                          (dag_ptr) fp->sum[],
                                             (dag ptr) fp->orf[]);
                 }
#endif /* SYMSIM */

                 /* if old state != new state */
#ifdef CM
                 CM rd(modResult->new, modResult->new, 1);
                 if (CM global_logior(CM test flag, 1))
#else /* CM */
                 if (modResult->old != modResult->new)
#endif /* CM */
                 {
                    /* Put the pointer of output variable on update list. */
                    * updateList++ = modResult;

                    /* If zero delay fanout list has not been traversed, */
                    /* put zero delay fanouts on old event list.         */
                    {
                       register fanout ptr zFanOutPtr = modResult->fmoO;

                       if (zFanOutPtr && !zFanOutPtr->traversed) {
                          register int * fo fmo = zFanOutPtr->mods affected;
                          register int finstpos;
                          zFanOutPtr->traversed = TRUE;

                          /* for each zero delay fanout module */
                          while ((finstpos = *fmo++) != END) {

                             /* If that module not in the event list, */
                             /* put it in old event list              */
                             if (!(*(oldflag + finstpos))) {
                                *(oldStart + [*(oldStart +
                                   (rank + = instmod->rank)]+=1 = finstpos;
                                *(oldflag + finstpos) = TRUE;
                             }
                          }
                       }
                    }

                    /* If unit delay fanout list has not been traversed, */
                    /* put unit delay fanouts on new event list.         */
                    {
                       register fanout ptr uFanOutPtr = modResult->fmol;

                       if (uFanOutPtr && !uFanOutPtr->traversed) {
                          register int * fo fmo = uFanOutPtr->mods affected;
                          register int finstpos;
                          uFanOutPtr->traversed = TRUE;

                          /* for each unit delay fanout module */
                          while ((finstpos = *fmo++) != END) {
                             /* If that module not in the event list, */
                             /* put it in new event list              */
                             if (!(*(newflag + finstpos))) {
                                *(newStart + [*(newStart +
                                   *(rank + finstpos)->rank)]++] = finstpos;
                                *(newflag + finstpos) = TRUE;
```

```
                  }
               }
            }
         }
      }
      num_eval_node += evalCount;
   }

   /*                                                  */
   /*                 SECOND PASS                      */
   /*                                                  */
   /* Clear old flags and make old event list empty;  */
   /* Check if more events;                            */
   /*                                                  */
   {
      /* Clear old flags and make old event list empty. */
      {
         register int rank;

         for (rank = 0; rank < numRanks; rank++) {
            register int start = *(rankOrigins + rank);
            register int last  = *(oldIndex + rank);
            register int offset;

            for (offset = start; offset < last; offset++)
               *(oldFlag + *(oldStart + offset)) = FALSE;
            *(oldIndex + rank) = start;
         }
      }

      /* Check if more events. */
      {
         register int rank;

         for (rank = 0; rank < numRanks; rank++) {
            if (*(newIndex + rank) != *(rankOrigins + rank))
               { isStable = FALSE; break; }
         }
      }
   }

   /*                                             */
   /*                THIRD PASS                   */
   /*                                             */
   /* old lists <-- new lists;                    */
   /* for each state variable in update list      */
   /*    old state <-- new state;                 */
   /*    clear fanout flag for each variable;     */
   /* update list <-- empty;                      */
   /*                                             */
   {
      register machine word  *temp_index = oldIndex;
      register           int *temp_start = oldStart;
      register          bool *temp_flag  = oldFlag;

      /* old lists <-- new lists */
      old_start = newStart; new_start = temp_start;
      old_index = newIndex; new_index = temp_index;
      old_flag  = newFlag;  new_flag  = temp_flag;

      /* Update old state of each state variable in update list. */
      {
         register int changedCount = 0;

         register cone *updateListPtrTemp = upd;

         for (; updateListPtrTemp != updateListPtr; updateListPtrTemp++) {
            register cone vp = *updateListPtrTemp;
            register fanout ptr fanOutPtr;

#ifdef CM
            CM_move(vp->old, vp->new, 1);
#else /* CM */
            vp->old = vp->new;

/*  extra added for clk suppression */
            if ((vp->clk_mask!=0) && (step_collection==1))
               *(vp->clk + total_pattern * phase_count) = step_count;


#endif /* CM */
            changedCount++;

            fanOutPtr = vp->fanOut; /* for unit delay */
            if (fanOutPtr) fanOutPtr->traversed = FALSE;

            fanOutPtr = vp->fanOZ; /* for zero delay */
            if (fanOutPtr) fanOutPtr->traversed = FALSE;
         }

         /* update list <-- empty */
         updateListPtr = upd;
         num_changed_var += changedCount;
         if (clk_up stabilize != FALSE) open node after step++;
      }
   }
}


/* Simulate one unit step when step limit is exceeded. */
/* Set changing nodes to X.                             */
VOID Xstep()
{
   machine word  *rankOrigins = rank_origins;
   machine word  *oldIndex    = old_index;
   machine word  *newIndex    = new_index;
            int  *oldStart    = old_start;
            int  *newStart    = new_start;
            int  numRanks     = num_ranks;
            bool *oldFlag     = old_flag;
            bool *newFlag     = new_flag;

   /*                                                             */
   /*                       FIRST PASS                            */
   /*                                                             */
   /* for each node N in old event list ordered by rank           */
   /*    call update procedure for N;                             */
   /*    for each output variable O of N s.t. old state != new state */
   /*       set changing node to X;                               */
   /*       put O in update list;                                 */
   /*       put zero delay fanout in old event list;              */
   /*       put unit delay fanout in new event list;              */
   /*                                                             */
   {
      int rank;
      int evalCount = 0;
      isStable = TRUE;

      /* for each rank */
      for (rank = 0; rank < numRanks; rank++) {
```

```
        int last = *(oldIndex + rank);
        register int offset;

        /* for each element of specified rank in old event list */
        for (offset = *(rankOrigins + rank); offset < last; offset++) {

#ifdef SYMSIM
            register int    mIndex  = *(oldStart + offset);
            register minst *modPtr = mode + mIndex;

            /* Save inputs and input faults into inputs. */
            if (faults != 0) {
              cktptr cktp = *(cktevl) + mIndex);

              { /* for each unit-delay input state variable */
                register finfptr *faultfp =
                    (finfptr*) START_BUF((bufptr) cktp->inputs);
                register machine_word *savep =
                    (machine_word*) START_BUF(&save_buf);
                register conn_ptr vpp = modPtr->inputs;
                register conn vp;

                for (; (vp = *vpp); vpp++, faultfp++, savep++) {
                    *savep = vp->old;
                    vp->old = (machine_word)
                               evaldag(((dag_ptr) vp->old),
                                       ((dag_ptr) (*faultfp)->saf),
                                       ((dag_ptr) (*faultfp)->orf));
                }
              }

                /* for each zero-delay input state variable */
                register finfptr *faultfp
                    (finfptr*) START_BUF((bufptr) cktp->zinputs);
                register machine_word *savep =
                    (machine_word*) START_BUF(&save_out);
                register conn_ptr vpp = modPtr->zinputs;
                register conn vp;

                for (; (vp = *vpp); vpp++, faultfp++, savep++) {
                    *savep = vp->new;
                    vp->new = (machine_word)
                               evaldag(((dag_ptr) vp->new),
                                       ((dag_ptr) (*faultfp)->saf),
                                       ((dag_ptr) (*faultfp)->orf));
                }
              }
#else /* SYMSIM */
            register minst *modPtr = mode + *(oldStart + offset);
#endif /* SYMSIM */

            /* dynamic solver */

            if (dyn->instance_top) top = dyn->instance_top(*(oldStart+offset));

            /* Call update procedure. */
            if (blrazy_read) (* modPtr->mod)(nd,updTempArea);
            else (* modPtr->mod)(modPtr->results, modPtr->inputs, modPtr->zinputs);
            evalCount++;
            if (checkfreeze) restore_freeze();

#ifdef SYMSIM
            /* Collect garbage if needed. */
            /* If not enough, reduce.     */
            if (reduce_table.elements_in_table > 2 * (reduce_table.n)) {

              dagarbage();
              if (reduce_table.elements_in_table > 1.9 * (reduce_table.n))
                { reduceCount++; return reduce(); }

            /* Restore inputs. */
            if (faults != 0) {

              { /* for each unit-delay input state variable */
                register machine_word *savep =
                    (machine_word*) START_BUF(&save_buf);
                register conn_ptr vpp = modPtr->inputs;
                register conn vp;
                for (; (vp = *vpp); vpp++, savep++) vp->old = *savep;
              }

              { /* for each zero-delay input state variable */
                register machine_word *savep
                    (machine_word*) START_BUF(&save_out);
                register conn_ptr vpp = modPtr->zinputs;
                register conn vp;
                for (; (vp = *vpp); vpp++, savep++) vp->new = *savep;
              }
            }
#endif /* SYMSIM */

            /* Schedule the events. */
            {
              register conn_ptr modResultPtr = modPtr->results;
              register conn modResult;

              /* for each output variable */
              for (; (modResult = *modResultPtr); modResultPtr++) {
               machine_word      AN,AO,ACN,TMP;
               var_t   *result_ptr;
                 /* code for connection update */
                 AN = modResult->new;
                 AO = modResult->old;
                 [illegible] = (var_t *)modResult->l_ntp;
                 ACN = [illegible];
                 TMP = (AN ^ ACN);
                 TMP = TMP & AO;
                 modResult->new = AN | TMP;

#ifdef SYMSIM
                 /* Inject faults into outputs. */
                 if (faults != 0) {
                   register [illegible] fp = modResult->[illegible];
                   modResult->new = (machine_word)
                                   evaldag(((dag_ptr) modResult->new),
                                           ((dag_ptr) fp->saf),
                                           ((dag_ptr) fp->orf));
                 }
#endif /* SYMSIM */

#ifdef SYMSIM
                 modResult->new = (machine_word)
                                 evaldag(((dag_ptr) modResult->old),
                                         ((dag_ptr) ONE),
                                         ((dag_ptr) modResult->new));
#else /* SYMSIM */
#ifdef CM
                 CM_logior(modResult->new, modResult->old, 1);
#else /* CM */
                 modResult->new = modResult->old | modResult->new;
#endif /* CM */
```

```
#endif /* SYNSIM */
                    /* if needs event scheduling */
#ifdef CM
                    CM_ne(modResult->old, modResult->new, 1);
                    if (CM global logior(CM test flag, 1))
#else /* CM */
                    if (modResult->old != modResult->new)
#endif /* CM */
                    {
                       printf("Osc module: %s old n:%d\n",modPtr->name,
                                    modResult->old,modResult->new);
                       /* Put pointer of output variable on update list. */
                       *updateListPtr++ = modResult;

                       /* If zero delay fanout list not been traversed, */
                       /* put zero delay fanouts on old event list.     */
                       {
                          register fanout_ptr zFanOutPtr = modResult->fnoO;

                          if (zFanOutPtr && !zFanOutPtr->traversed) {
                             register minst_ro *ma =
                                zFanOutPtr->mods_affected;
                             register int minstpos;
                             zFanOutPtr->traversed = TRUE;

                             /* for each zero delay fanout module */
                             while ((minstpos = *ma++) != END) {

                                /* If that module not in the event list, */
                                /* put it on old event list.              */
                                if (!(*(oldFlag + minstpos))) {
                                   *(oldStart + (*(oldIndex +
                                      (mods + minstpos)->rank))++) =minstpos;
                                   *(oldFlag + minstpos) = TRUE;
                                }
                             }
                          }
                       }

                       /* If unit delay fanout list not been traversed, */
                       /* put unit delay fanouts on new event list.     */
                       {
                          register fanout_ptr uFanOutPtr = modResult->fno1;

                          if (uFanOutPtr && !uFanOutPtr->traversed) {
                             register minst_ro *ma =
                                uFanOutPtr->mods_affected;
                             register int minstpos;
                             uFanOutPtr->traversed = TRUE;

                             /* for each unit delay fanout module */
                             while ((minstpos = *ma++) != END) {
                                /* If that module not in the event list, */
                                /* put it on new event list.              */
                                if (!(*(newFlag + minstpos))) {
                                   *(newStart + (*(newIndex +
                                      (mods + minstpos)->rank))++) =minstpos;
                                   *(newFlag + minstpos) = TRUE;
                                }
                             }
                          }
                       }
                    }
                 }
              }

      }
   }
   nar eval tbos = evalCount;
}

/*                                                 */
/*                  SECOND PASS                    */
/*                                                 */
/* Clear old flags and make old event list empty;  */
/* Check if more events;                           */
/*                                                 */

   /* Clear old flags and make old event list empty. */
   {
      register int rank;

      for (rank = 0; rank < numRanks; rank++) {
         register int start = *(rankOrigins + rank);
         register int last = *(oldIndex + rank);
         register int offset;

         for (offset = start; offset < last; offset++)
            *(oldFlag + *(oldStart + offset)) = FALSE;
         *(oldIndex + rank) = start;
      }
   }

   /* Check if more events. */
   {
      register int rank;

      for (rank = 0; rank < numRanks; rank++) {
         if (*(newIndex + rank) != *(rankOrigins + rank))
            { isStable = FALSE; break; }
      }
   }
}

/*                                          */
/*             THIRD PASS                   */
/*                                          */
/* old lists <== new lists;                 */
/* For each state variable in update list   */
/*    old state <== new state;              */
/*    clear fanout flag for each variable;  */
/* update list <== empty;                   */
/*                                          */
{
   register machine word  *temp index = oldIndex;
   register            int *temp start = oldStart;
   register           bool *temp flag  = oldFlag;

   /* old lists <== new lists. */
   old start  = newStart; new start = temp start;
   old index  = newIndex; new index = temp index;
   old flag   = newFlag;  new flag  = temp flag;

   /* Update old state of each state variable in update list. */
   {
      register int  changedCount       = 0;
      register conn *updateListPtrTemp = mod;

      for (; updateListPtrTemp != updateListPtr; updateListPtrTemp++) {
         register conn mr = *updateListPtrTemp;
         register fanout_ptr fanOutP r;
```

```
#ifdef CM
            CM_move(vp->old, vp->new, 1);
#else /* CM */
            vp->old = vp->new;
#endif /* CM */
            changedCount++;

            fanOutPtr = vp->fanl; /* for unit delay */
            if (fanOutPtr) fanOutPtr->traversed = FALSE;

            fanOutPtr = vp->fan0; /* for zero delay */
            if (fanOutPtr) fanOutPtr->traversed = FALSE;
        }

        /* update list <== empty */
        updateListPtr = updL;
        num_changed_var += changedCount;
    }
  }
}
#endif /* FAULT */

/*************************************************************************/

/* this routine returns the three state value of a node given the
   H and L values */

int     sig_val(nh,nl)
machine word nh,nl;

{
int     h,l;

 if (nh &0x00000001) h = 1;
 else h = 0;
 if (nl &0x00000001 ==1) l = 1;

 if ((h==1) && (l==1)) return('X');
 if ((h==0) && (l==0)) return('*');
 if (h==1) return('1');
 if (l==1) return('0');
}
```

CLK_SUP

```
/*************************************************************************/
/****************          COLLECT PHASE          ************************/
/*************************************************************************/

/*  This routine simulates the network with only constants and clocks
    running. At the end of the phase, collect all the final state values.
    If one leg of a node (H or L) has a real value, then the other
    leg is also declared as clock suppressed, and the appropriate memory
    is stored.

 */
bool coll_phase(n)
register int n;

    register int steplim = steplimit;
    register int nodepos,i;


    /* Schedule events according to set clk_buf and freeze_buf. */
    set_n_phase(n);

    /* Call the function step() until network becomes stable. */
    step_count = 0;
    while (!isStable && steplim > 0) {
        step_count++;
        step();
        steplim--;
        }
    step_count = 0;
    /* If exceeds step limit, print out error message. */
    if (!isStable) {
       if (!oscillateSwitch) {
          sprintf(str_buf, "Exceed step limit: %d\n", steplimit);
          error(str_buf);
          return(FALSE);
       }
       sprintf(str_buf, "Exceed step limit: %d\n", steplimit);
       output(str_buf);
       output("Oscillating nodes set to X.\n");
       error(str_buf);
       return(FALSE);
    }
     for(nodepos=0; nodepos<num_nodes; nodepos++) {
          register node_t *nodePtr = Nodes + nodepos;
          int              size;
          if ((nodePtr->H.now != 0) || (nodePtr->L.now!=0))
            {
              if (nodePtr->H.clk_sup == 0) {
                   size = sizeblk(sizeof(machine_word)* (2*total_phase_num+1));
                   nodePtr->H.clk_sup = (machine_word *)getblk(size,1);
                   if (nodePtr->H.clk_sup==0) printf("Run out of memory\n");
                   nodePtr->L.clk_sup = (machine_word *)getblk(size,1);
                   if (nodePtr->H.clk_sup==0) printf ("Run out of memory\n");
                   /* initialize phases to X and steps to -1 */
                   for(i=0; i < (2*total_phase_num); i++) {
                        *(nodePtr->H.clk_sup+i) = Const_1;
                        *(nodePtr->L.clk_sup+i) = Const_1;
                        }
                }
              *(nodePtr->H.clk_sup + n) = nodePtr->H.now;
              *(nodePtr->L.clk_sup + n) = nodePtr->L.now;
            }
        }
    return(TRUE);
  }
```

Main Routine

```
/* Simulate one unit step.                                              */
/*     FIRST  PASS : Call update procedure, schedule the events.        */
/*     SECOND PASS : Clear old lists, check zero events.                */
/*     THIRD  PASS : Swap old and new lists, update old states.         */
void
clk_step()
{
    machine_word   *rankOrigins    rank origins;
    machine_word   *oldIndex       old index;
    machine_word   *newIndex       new index;
           int     [illegible]     old start;
           int     *newStart       new start;
           int     [illegible]     [illegible];
           [illegible]             [illegible];
           [illegible]             [illegible];

    /*                                                                        */
    /*                          FIRST PASS                                    */
    /*                                                                        */
    /* for each module M in old event list ordered by rank                   */
    /*     call update procedure for M                                        */
    /*     for each output variable O of M s.t. old state != new state       */
    /*         put O in update list                                           */
    /*         put zero delay fanout in old event list                        */
    /*         put unit delay fanout in new event list                        */
    /*                                                                        */
    {
        int rank;
        int overcount = 0;
        int debug = 0;
        user code before step();
        isStable = TRUE;

        /* for each rank */
        for (rank = 0; rank < numRanks; rank++) {
            int last = *(oldIndex + rank);
            register int offset;

            /* for each element of specified rank in old event list */
            for (offset = *(rankOrigins + rank); offset < last; offset++) {

                register int modNum = *(oldStart+offset);
                register [illegible] = mods + modNum;
                register int [illegible];

                /* if it is not suspended node, then update inputs to
                    [illegible] state */
                [illegible]
                if (clk [illegible]) clk [illegible] setup(modPtr,modNum);


                /* dynamic solver */
                if [illegible] = dyn->instance tbl[*(oldStart+offset)];

                if [illegible] {
                            if (clk sup flag) {
                                clk sup flag = 0;
                                dustanodule(modPtr->name);
                                clk sup flag = 1;
                                }
                            else dust[illegible](modPtr->name);
```

```
        /* Call update procedure. */
#if 0
        sim_eval_per_phase(modNum++);
#endif
        if (binary_read) (* modPtr->mod)(ru,updTempArea);
        else  (* modPtr->eval)(modPtr->results, modPtr->inputs,modPtr->zinputs);

        if (debug)  {
                    if (clk_sup_flag) {
                          clk_sup_flag = 0;
                          postanmodule(modPtr->name);
                          clk_sup_flag = 1;
                          }
                    else postanmodule(modPtr->name);

                 }

        evalCount++;
        if (checkFreeze) restore [illegible]();
        /* Schedule the events. */
        {
           register conns ptr modResultPtr = modPtr->results;
           register conn modResult;

           /* for each output variable */
           for (; (modResult = *modResultPtr); modResultPtr++) {
            register int    mask,sch=0,*tmp_ptr;
            register machine word     AN,AO,ACN,TMP;
            register var_t    *cousin_ptr;

              /* code for capacitive update */
              AN = modResult->new;
              AO = modResult->old;
              cousin_ptr = (var_t *)modResult->finfp;
              ACN = cousin_ptr->new;
              TMP = ~(AN | ACN);
              TMP = TMP & AO;
              modResult->new = AN | TMP;
              /* if clock suppressed, check if output different than
                 stored output                                         */
              if (modResult->clk_sup!=0)
               {
                    tmp_ptr = (int *) *(modResult->clk_sup + phase_count);
                    if (modResult->new != *tmp_ptr)
                      {
                           sch = 1;
                           *tmp_ptr = modResult->new;
                      }
               }
              /* if old state != new state */
              if ((modResult->old != modResult->new) || sch)
                {
                    /* changed then schedule clock events for
                       next phase for this module ?? */
                    if ((modResult->clk_sup==0)&&
                        (clk_mod!=0)) schedule_clk_eval(modNum);

                 /* put the pointer of output variable on update list. */
                 *updateListPtr++ = modResult;

                 /* if zero delay fanout list has not been traversed, */
                 /* put zero delay fanouts on old event list.         */
                 {
                    register fanout ptr zfanOutPtr = modResult->fanout;

                    if (zfanOutPtr && !(zfanOutPtr->traversed)) {

                       register [illegible] = zfanOutPtr->nodes alfoutac;
                       register int minstpos;
                       zfanOutPtr->traversed = TRUE;

                       /* for each zero delay fanout module */
                       while ((minstpos = *nodes) != END) {
                            /* changed then schedule clock events for
                               next phase for fanout module.
                               if output known, skip */
                          if (schedule_clk_evals[minstpos]) continue;
                          /* if that module not in the event list, */
                          /* put it on old event list.             */
                          if (!oldFlag[minstpos]) {

                             *oldStart = [illegible]
                                [illegible]
                             *(oldFlag + minstpos) = TRUE;
                          }
                       }
                    }

                 /* if unit delay fanout list has not been traversed, */
                 /* put unit delay fanouts on new event list.         */
                 {
                    register fanout_ptr ufanOutPtr = modResult->fanout;

                    if (ufanOutPtr && !(ufanOutPtr->traversed)) {
                       register [illegible] = ufanOutPtr->nodes alfnotdat;
                       register int minstpos;
                       ufanOutPtr->traversed = TRUE;

                       /* for each unit delay fanout module */
                       while ((minstpos = *nodes++) != END) {
                          /* changed then schedule clock events for
                             next phase for fanout module.
                             if output known, skip */
                        if (schedule_clk_evals[minstpos]) continue;
                        /* if that module not in the event list, */
                        /* put it on new event list.             */
                        if (!(*newFlag + minstpos)) {
                           *newStart = [illegible]
                              [illegible]
                           *(newFlag + minstpos) = TRUE;

                    }  /*     */
                       /* while */
                       /* if (traversed) */
                       /* unit delay scope */
                       /* if new = old */
                       /* for modResult */

          }
        }
        num_eval_mods += evalCount;
      }
                                                  */
/*                 SECOND PASS                    */
/*                                                */
/*                                                */
/* Clear old flags and make old event list empty! */
/* Check if more events.                          */
/*                                                */
```

```
   /* Clear old flags and make old event list empty. */
   {
      register int rank;

      for (rank = 0; rank < numRanks; rank++) {
         register int start = *(rankOrigins + rank);
         register int last = *(oldIndex + rank);
         register int offset;

         for (offset = start; offset < last; offset++)
            *(oldFlag + *(oldStart + offset)) = FALSE;
         *(oldIndex + rank) = start;
      }
   }

   /* Check if more events. */
   {
      register int rank;

      for (rank = 0; rank < numRanks; rank++) {
         if (*(newIndex + rank) != *(rankOrigins + rank))
            { isStable = FALSE; break; }
      }
   }
}

/*                                             */
/*              THIRD PASS                     */
/*                                             */
/* old lists <-- new lists;                    */
/* for each state variable in update list      */
/*    old state <-- new state;                 */
/*    clear fanout flag for each variable;     */
/* update list <-- empty;                      */
/*                                             */
{
   register machine_word  *temp_index = oldIndex;
   register             int  *temp_start = oldStart;
   register            bool *temp_flag  = oldFlag;

   /* old lists <-- new lists */
   old_start = newStart; new_start = temp_start;
   old_index = newIndex; new_index = temp_index;
   old_flag  = newFlag;  new_flag  = temp_flag;

   /* Update old state of each state variable in update list. */
   {
      register int  changedCount = 0,*tmp_ptr;
      register conn *updateListPtrTemp = upol;

      for (; updateListPtrTemp != updateListPtr; updateListPtrTemp++) {
         register conn vp = *updateListPtrTemp;
         register fanout_ptr fanOutPtr;
         vp->old = vp->new;
#if 0
         if (vp->clk sup!=0)
           {
            tmp_ptr = (int *) *(vp->clk_num + phase_count);
            *tmp_ptr = vp->old;
            }
#endif
         changedCount++;

         fanOutPtr = vp->fnol; /* for unit delay */
         if (fanOutPtr) fanOutPtr->traversed = FALSE;

         fanOutPtr = vp->fnoz; /* for zero delay */
         if (fanOutPtr) fanOutPtr->traversed = FALSE;
      }

      /* update list <-- empty */
      updateListPtr = upol;
      num_changed_var = changedCount;
      user_code_after_step();
   }
}
```

```
/***************************************************************************/
/****************          SCHEDULE STEP          ****************************/
/***************************************************************************/

/* This routine reads the module active_list datastructures and
   schedules all the evaluations for phase n, and step (step_count)
*/

int     schedule_step(n,step_c)
int     n,step_c;

{
   register  int                    *phase_ptr,*step_ptr,i;
   int                              minstpos,*mod_ptr;
   sinst_no                         *ra;

   if (step_c==0) set_n_phase(n);
   phase_ptr = (int *) mod_active_list[n-1];
   /* if past the number of collected phases skip out */
   if (step_c >= *phase_ptr) return;

   /* If the normal network is stable, look for events scheduled
      in the future */

   if (isStable) {
          for(; step_c < *phase_ptr; step_c++)
              {
                 step_ptr = (int *) *(phase_ptr + step_c +1);
                 if (*step_ptr != 0) {
                        isStable=FALSE;
                        break;
                 }
              }
          if (isStable) return;
       }
   step_count = step_c;                              /* update global phase count */
   step_ptr = (int *) *(phase_ptr+1+step_count); /* get past the step count */
   for(i=0; i< *step_ptr ; i++)
   {
      minstpos = step_ptr[i+1];
      clk_schedule(minstpos) &= (~(1 << (n-1))); /* reset clock schedule flag */
#ifdef DEBUG
      printf("%d.%d CQ %d\n",cycle_count,phase_count,minstpos);
#endif
      isStable = FALSE;
      if (!(*(old_flag + minstpos)))
      {
         *(old_start + (*(old_index + (num - minstpos->rank))++)) = minstpos;
         *(old_flag + minstpos) = TRUE;
      } /* if old */
   } /* for i */
   *step_ptr = 0;

}
```

```
/***************************************************************************/
/****************       CLOCK SUP INPUT SETUP       **************************/
/***************************************************************************/
/*

  This procedure updates all inputs/outputs to proper values before evaluation.

*/

clk_sup_inp_setup(modPtr,modNum)
sinst *modPtr;
int      modNum;
{
  register sconn_ptr mod_clksup_ptr;
  register sconn mod_clksup;
  int     last_update,step_c;

   mod_clksup_ptr = modPtr->inputs;
   for (; (mod_clksup = *mod_clksup_ptr); mod_clksup_ptr++)
        {
           if (mod_clksup->clk_sup!=0)
             {
              step_c = *(mod_clksup->clk_sup + total_phasenum + phase_count);
              if (step_c < step_count) {
                      mod_clksup->old = *((int *) *(mod_clksup->clk_sup + phase_count));
                      continue;
                 }
              if ((step_c == 0)&&(step_count==0))
                 {
                      mod_clksup->old = *((int *) *(mod_clksup->clk_sup + phase_count));
                      continue;
                 }
              if (phase_count==0) last_update=total_phasenum;
              else last_update = phase_count - 1;
              mod_clksup->old = *((int *) *(mod_clksup->clk_sup + last_update));
             } else {if (binary_read) break;}
        }

    mod_clksup_ptr = modPtr->outputs;
    for (; (mod_clksup = *mod_clksup_ptr); mod_clksup_ptr++)
        {
          if (mod_clksup->clk_sup!=0)
            {
              step_c = *(mod_clksup->clk_sup + total_phasenum + phase_count);
              if (step_c < step_count) {
                      mod_clksup->new = *((int *) *(mod_clksup->clk_sup + phase_count));
                      continue;
                 }
              if ((step_c==0)&&(step_count==0))
                 {
                      mod_clksup->new = *((int *) *(mod_clksup->clk_sup + phase_count));
                      continue;
                 }
              if (phase_count==0) last_update=total_phasenum;
              else last_update = phase_count - 1;
              mod_clksup->new = *((int *) *(mod_clksup->clk_sup + last_update));
            } else {if (binary_read) break;}

      }

/*     if (modPtr->name[0] == '@') return;  */
/*
   top    new_ICNODE;
```

```
	if ((dyn->instance_top && (top=dyn->instance_top(modNum)) != DYN_IGNORE))
	   top->output_changed = FALSE;
*/
	mod_clksup_ptr = modPtr->results;
	for (; mod_clksup = *mod_clksup_ptr; mod_clksup_ptr++)
	  {
	     if (mod_clksup->clk_sup!=0)
	     {
	        step_c = *(mod_clksup->clk_sup + total_phasenum - phase_count);
	        if (step_c < step_count)
	        {
	           mod_clksup->old = *((int *) *(mod_clksup->clk_sup+phase_count));
	           mod_clksup->new = mod_clksup->old;
	           continue;
	        }
	        else
	        {
	           if (phase_count==1) last_update=total_phasenum;
	           else last_update = phase_count - 1;
	           mod_clksup->old = *((int *) *(mod_clksup->clk_sup+last_update));
	           mod_clksup->new = mod_clksup->old;
	        }
/*
	        if (top != DYN_IGNORE) top->output_changed = TRUE;
*/
	     } else if (binary_read) break;
	  }
}
```

```
/************************************************************************/
/*****************      SCHEDULE CLK EVALUATION     *******************/
/************************************************************************/
/*
	This procedure schedules all the clock events for this module.

	During loop, if the output is known, then phase seen will be zero
	and this routine will tell the kernel not to schedule it for this
	phase.
*/

schedule_clk_eval(modNum)
int modNum;
{
   int  *state_ptr,num_states,i,j;
   int  phase_flag,phase_num,step_num,phase_now,num_mod_sch;
   int  *step_ptr,*phase_ptr,phase_seen,step_seen;
   unsigned int schedule;

   phase_seen = 0;
   state_ptr = (int *) mod_info[modNum];
   if (state_ptr ==0) return(0);
   phase_now = 1<< (phase_count-1);
   num_states = *state_ptr;
   for (i=0; i<num_states ; i++)
   {
      state_ptr++;   /* now points to the first entry */
      phase_flag = *state_ptr;
      state_ptr++;   /* now points to the second entry */
      phase_num = *state_ptr;
      state_ptr++;   /* now points to the third entry */
      step_num = *state_ptr;
      if ((phase_now & phase_flag) !=0)
              {
                 phase_seen = 1;
                 step_seen = step_num;
              }

      /* schedule on mod active list */

      schedule = 1 << (phase_num - 1);
      if ((clk_schedule[modNum]&schedule) == 0) /* mod not already scheduled */
      {
         clk_schedule[modNum] |= schedule;
         phase_ptr = (int *) mod_active_list[phase_num-1];
         step_ptr = (int *) phase_ptr[step_num-1];
         num_mod_sch = *step_ptr;
         if (num_mod_sch >= num_mods)
         {
            printf("Error in Clk Sch overflow %d\n");
            continue;
         }
         num_mod_sch++;
         *step_ptr = num_mod_sch;
         step_ptr[num_mod_sch] = modNum;
      } /* if */
   } /* for */

   if (phase_seen)
   {
      if (step_seen < (step_count+1)) return(0);
   }
   return(1);
}
```

What is claimed is:

1. A method of reducing computational requirements for executing simulation code for a transistor circuit design having at least some elements which are synchronously clocked by multiple phase clock signals, the transistor circuit design being subject to resistive conflicts and to charge sharing, the simulation code including data structures associated with circuit modules and nodes interconnecting the circuit modules, the method comprising, by computer generating a three-state version of simulation code for the transistor circuit design, said three-state version of simulation code having three states corresponding to states 0, 1, or X, where X represents an invalid or undefined state, said undefined state including representation of effects resulting from said resistive conflicts and said charge sharing, performing a preanalysis of the three-state version of simulation code and storing phase waveforms each representing values occurring at a node of the transistor circuit design, determining from said phase waveforms, each phase of a module for which no event-based evaluation need be performed, storing for said each phase of a module for which no event-based evaluation need be performed, an appropriate response to an event occurring with respect to the module of the three state version of simulation code, generating a two-state version of simulation code for the transistor circuit design, the two states corresponding to 0, and 1, executing said two-state version of simulation code for each phase of a module for which no event-based evaluation need be performed, using as said data structures for said two-state version of simulation code the stored response from said three-state version of simulation code.

2. The method of claim 1 wherein the step of generating a two-state version comprises converting to a logical 1 or 0, any X that appears in a fanout, and generating a fourth state with respect to a node for levels of resistive strength less than or equal to the resistive strength corresponding to capacitive strength.

3. The method of claim 2 further comprising during execution of the two-state version of simulation code, if a fourth state is encountered at the output of a module, reassigning the old state to the output.

* * * * *